(12) United States Patent
Hayashi et al.

(10) Patent No.: US 10,546,988 B2
(45) Date of Patent: Jan. 28, 2020

(54) LIGHT EMITTING DEVICE AND SOLDER BOND STRUCTURE

(71) Applicant: PANASONIC INTELLECTUAL PROPERTY MANAGEMENT CO., LTD., Osaka (JP)

(72) Inventors: Masahiro Hayashi, Osaka (JP);
Tetsuya Kamada, Kagoshima (JP);
Takashi Kuwaharada, Kagoshima (JP);
Kiyomi Hagihara, Osaka (JP);
Toshikazu Shimokatano, Tokyo (JP);
Shigeo Hayashi, Kagoshima (JP);
Hiroki Shirozono, Kagoshima (JP);
Hideaki Usukubo, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/886,543

(22) Filed: Feb. 1, 2018

(65) Prior Publication Data
US 2018/0159006 A1 Jun. 7, 2018

Related U.S. Application Data

(63) Continuation of application No. PCT/JP2016/003376, filed on Jul. 19, 2016.
(Continued)

(51) Int. Cl.
*H01L 33/62* (2010.01)
*H01L 33/64* (2010.01)
(Continued)

(52) U.S. Cl.
CPC .............. *H01L 33/62* (2013.01); *H01L 24/85* (2013.01); *H01L 33/387* (2013.01); *H01L 33/64* (2013.01);
(Continued)

(58) Field of Classification Search
None
See application file for complete search history.

(56) References Cited

U.S. PATENT DOCUMENTS

| 2002/0046462 A1 | 4/2002 | Inoue et al. | |
| 2013/0153945 A1* | 6/2013 | Kobayashi | H05K 1/0274 |
| | | | 257/98 |

FOREIGN PATENT DOCUMENTS

| JP | 61-85159 U | 6/1986 |
| JP | H03-038895 A | 2/1991 |

(Continued)

OTHER PUBLICATIONS

International Search Report (ISR) and Written Opinion dated Sep. 20, 2016 in International (PCT) Application No. PCT/JP2016/003376; with partial English translation.

*Primary Examiner* — Raj R Gupta
(74) *Attorney, Agent, or Firm* — McDermott Will & Emery LLP

(57) ABSTRACT

A light emitting device includes a light emitting element; a sub-mount including a sub-mount substrate with a front surface on which the light emitting element is disposed, and a back surface electrode disposed in a back surface that is on a back side of the front surface of the sub-mount substrate; a main-mount in which the sub-mount is disposed, the main-mount including a front surface metal pattern including a wiring electrode bonded to the back surface electrode via solder. The front surface metal pattern has a slit, in a plan view, at a position away from a disposition region in which the sub-mount is disposed.

17 Claims, 36 Drawing Sheets

Related U.S. Application Data

(60) Provisional application No. 62/202,953, filed on Aug. 10, 2015.

(51) Int. Cl.
   *H01L 23/00* (2006.01)
   *H01L 33/38* (2010.01)
   *H01L 33/48* (2010.01)

(52) U.S. Cl.
   CPC .......... *H01L 33/642* (2013.01); *H01L 33/644* (2013.01); *H01L 24/16* (2013.01); *H01L 24/48* (2013.01); *H01L 24/81* (2013.01); *H01L 33/486* (2013.01); *H01L 2224/04042* (2013.01); *H01L 2224/16227* (2013.01); *H01L 2224/48091* (2013.01); *H01L 2224/48227* (2013.01); *H01L 2224/48237* (2013.01); *H01L 2224/73265* (2013.01); *H01L 2224/81201* (2013.01); *H01L 2224/81203* (2013.01); *H01L 2924/1203* (2013.01); *H01L 2924/1205* (2013.01); *H01L 2924/1207* (2013.01); *H01L 2924/12035* (2013.01); *H01L 2924/12041* (2013.01)

(56) References Cited

FOREIGN PATENT DOCUMENTS

| | | | |
|---|---|---|---|
| JP | 07-142821 A | | 6/1995 |
| JP | 07142821 A | * | 6/1995 |
| JP | 2002-084097 A | | 3/2002 |
| JP | 2007-134394 A | | 5/2007 |
| JP | 2007-201041 A | | 8/2007 |
| JP | 2009-105343 A | | 5/2009 |
| JP | 2009105343 A | * | 5/2009 |
| JP | 2012-080012 A | | 4/2012 |
| JP | 2013-128081 A | | 6/2013 |
| JP | 2014-17402 A | | 1/2014 |

\* cited by examiner

LIGHT EMITTING DEVICE AND SOLDER BOND STRUCTURE

CROSS REFERENCE TO RELATED APPLICATIONS

This application is a U.S. continuation application of PCT International Patent Application Number PCT/JP2016/003376 filed on Jul. 19, 2016, claiming the benefit of priority of U.S. Provisional Application No. 62/202,953 filed on Aug. 10, 2015, the entire contents of which are hereby incorporated by reference.

BACKGROUND

1. Technical Field

The present disclosure relates to a light emitting device and a solder bond structure.

2. Description of the Related Art

In the past, a light emitting element that generates heat, such as a light emitting diode (LED) has been known (see, for instance, Japanese Unexamined Patent Application Publication No. 2007-134394). Such a light emitting device, particularly a light emitting device using a high-output light emitting element generally includes a light emitting element, a sub-mount on which the light emitting element is disposed, and a metal main-mount on which the sub-mount is disposed. It is to be noted that hereinafter, a combined unit of a light emitting element and a sub-mount is called a package, and a combined unit of the package and a main-mount is called a light emitting device or a module.

Since an LED is a light emitting element with two terminals, in the back surface on the back side of the front surface in which the light emitting element of the sub-mount is disposed, two back surface electrodes are formed in general. Also, in the front surface (that is, the upper surface) of the main-mount, two electrode pads having substantially the same shape as the shape of the back surface electrodes are formed. The two back surface electrodes formed in the sub-mount are respectively connected to the two electrode pads formed in the main-mount using solder, for instance.

When a light emitting element, particularly a high-output light emitting element is used, heat needs to be efficiently dissipated. Although part of the heat generated by the light emitting element can be dissipated to the main-mount via the back surface electrodes formed in the sub-mount and the electrode pads formed in the main-mount, electrical characteristics may deteriorate due to an increase in the temperature of the light emitting element. Thus, in known measures, a back surface heat dissipation pad having no electrical connection is provided near the exact opposite side of the sub-mount from the front surface in which the light emitting element is disposed. In this case, formation of a heat dissipation pattern at a position, opposed to the back surface heat dissipation pad, of a main-mount substrate allows the heat generated in the light emitting element to be effectively transmitted to the main-mount substrate.

SUMMARY

Although the thermal resistance of the path from the light emitting device to the main-mount can be reduced by the above-described measures, it is known that when a thermal expansion coefficient difference between the sub-mount and the main-mount is large, damage due to strain may occur in a thermal cycling test.

Also, when the back surface electrode of the sub-mount and the electrode pad of the main-mount are connected in a solder reflow process, the sub-mount may be fixed to the main-mount with inclined to the main-mount.

Thus, it is an object of the present disclosure to provide a light emitting device having improved strain resistance characteristics in a thermal cycle. In addition, it is an object of the present disclosure to provide a solder bond structure including a sub-mount, a main-mount, and a solder that connects the sub-mount and the main-mount, the solder bond structure being capable of avoiding inclination of the sub-mount with respect to the main-mount.

An aspect of the present disclosure provides a light emitting device including: a light emitting element; a sub-mount including a sub-mount substrate having a front surface on which the light emitting element is disposed, and a back surface electrode disposed in a back surface that is on a back side of the front surface of the sub-mount substrate; and a main-mount in which the sub-mount is disposed, the main-mount including a front surface metal pattern including a wiring electrode bonded to the back surface electrode via solder. The front surface metal pattern has a slit, in plan view, at a position away from a disposition region in which the sub-mount is disposed.

An aspect of the present disclosure provides a solder bond structure including: a sub-mount including a back surface electrode; and a main-mount in which the sub-mount is disposed, the main-mount including a wiring electrode bonded to the back surface electrode via solder. The back surface electrode includes two main-mount bond portions and a first connection portion that connects the two main-mount bond portions, and the first connection portion is smaller in width than each of the two main-mount bond portions.

According to the present disclosure, a light emitting device having improved strain resistance characteristics in a thermal cycle can be provided. In addition, according to the present disclosure, it is possible to provide a solder bond structure including a sub-mount, a main-mount, and a solder that connects the sub-mount and the main-mount, the solder bond structure being capable of avoiding inclination of the sub-mount with respect to the main-mount.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Underlying Knowledge Forming Basis of the Present Disclosure

First, the underlying knowledge forming basis of the present disclosure will be described. In a light emitting device including a sub-mount in which a light emitting element is disposed, and a metal main-mount in which the sub-mount is disposed, the sub-mount has an electrode connected to a wiring electrode of the main-mount. There is a case where the electrode along with the light emitting device is on the front surface (in other words, the upper surface) of the sub-mount, and there is a case where the electrode is on the back surface (in other words, the bottom surface) positioned on the back side of the front surface of the sub-mount. Hereinafter, the case where the electrode is on the back surface of the sub-mount will be described with reference to the drawings.

Figure 36A:
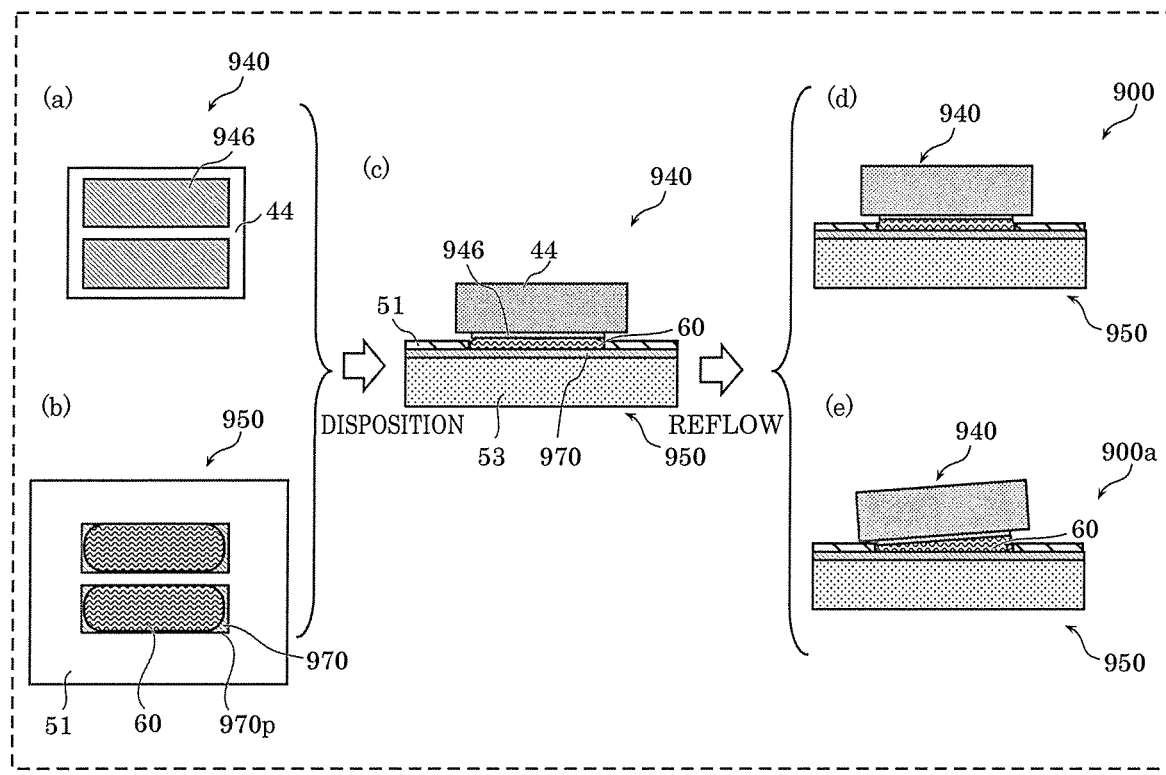
FIG. 36A is a schematic diagram illustrating the manufacturing process of a light emitting device in related art.

FIG. 36A is a schematic diagram illustrating the manufacturing process of light emitting device 900 in related art. Bottom view (a) of FIG. 36A illustrates the back surface (bottom surface) of sub-mount 940. Here, the light emitting device formed on sub-mount 940 is omitted. Top view (b) of FIG. 36A illustrates the upper surface of main-mount 950. Sectional view (c) of FIG. 36A illustrates a section of sub-mount 940 and main-mount 950 in a perpendicular direction to the upper surface of main-mount 950 with sub-mount 940 disposed in main-mount 950. Sectional view (d) of FIG. 36A illustrates a section of non-defective light emitting device 900 after a reflow process. Sectional view (e) of FIG. 36A illustrates a section of defective light emitting device 900a after a reflow process.

As illustrated in bottom view (a) of FIG. 36A, two back surface electrodes 946 are formed on the back surface of sub-mount substrate 44 included in sub-mount 940. In addition, as illustrated in top view (b) of FIG. 36A, electrode pads 970p having substantially the same shape as back surface electrodes 946 are formed on the front surface of main-mount substrate 53 included in main-mount 950. Here, electrode pad 970p is a region exposed through cover resin 51 out of surface metal patterns 970 covered by cover resin 51. The reason why each back surface electrode 946 of sub-mount 940 and each electrode pad 970p of main-mount 950 are set to have substantially the same shape is that when solder bond is made using a reflow furnace, sub-mount 940 is prevented from being displaced from a predetermined position of main-mount 950 utilizing a surface tension when solder 60 is melted. Such an electrode structure is called a self-alignment structure.

Also, as described above, heat needs to be efficiently dissipated in a high-output LED among LEDs which are light emitting elements with two terminals. Although part of the heat generated by the light emitting element can be dissipated to main-mount 950 via back surface electrodes 946 formed in sub-mount 940 and electrode pads 970p formed in main-mount 950, electrical characteristics may deteriorate due to an increase in the temperature of the light emitting element. Thus, in known measures, a back surface heat dissipation pad having no electrical connection is provided near the exact opposite side of sub-mount 940 from the front surface in which the light emitting element is disposed. A typical configuration is illustrated in FIG. 37A, FIG. 39A, and FIG. 41A.

Figure 37A:
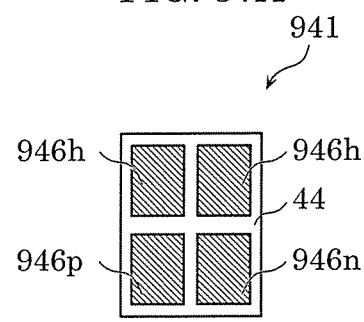
FIG. 37A is a bottom view illustrating an example of a shape of back surface heat dissipation pads in a sub-mount in related art.
Figure 37B:
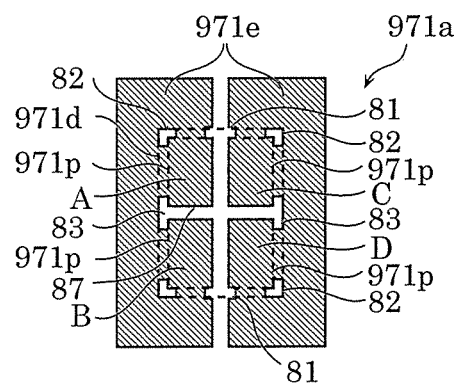
FIG. 37B is a top view illustrating an example of a shape of a front surface metal pattern formed in a main-mount in which the sub-mount illustrated in FIG. 37A is disposed.
Figure 37C:
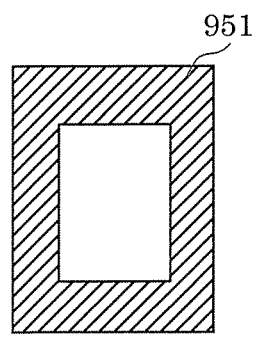
FIG. 37C is a top view illustrating an example of a shape of a cover resin in related art.
Figure 38A:
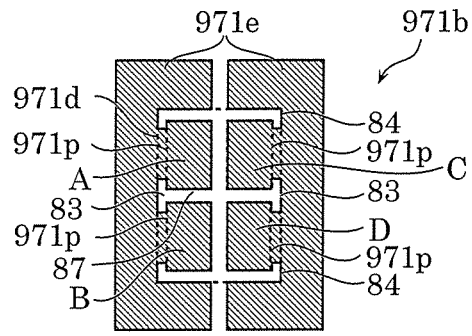
FIG. 38A is a top view illustrating an example of a shape of a front surface metal pattern formed in a main-mount in which the sub-mount illustrated in FIG. 37A is disposed.
Figure 38B:
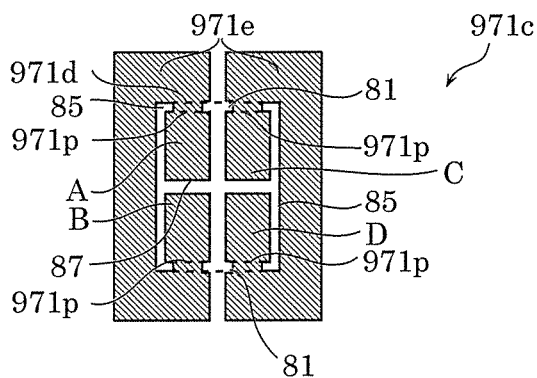
FIG. 38B is a top view illustrating another example of a shape of a front surface metal pattern formed in a main-mount in which the sub-mount illustrated in FIG. 37A is disposed.

FIG. 37A is a bottom view illustrating an example of a shape of back surface heat dissipation pads 946h in sub-mount 941 in related art. FIG. 37B is a top view illustrating an example of a shape of front surface metal pattern 971*a* formed in a main-mount in which sub-mount 941 illustrated in FIG. 37A is disposed. FIG. 37C is a top view illustrating an example of a shape of cover resin 951 in related art. FIG. 38A and FIG. 38B are each a top view illustrating an example of a shape of a front surface metal pattern formed in the main-mount in which sub-mount 941 illustrated in FIG. 37A is disposed.

Figure 39A:
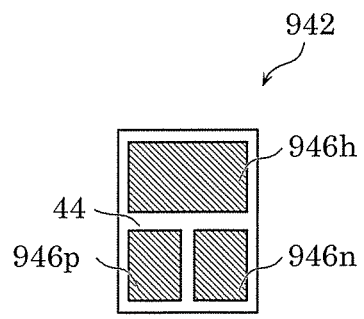
FIG. 39A is a bottom view illustrating an example of a shape of the back surface heat dissipation pad in the sub-mount in related art.
Figure 39B:
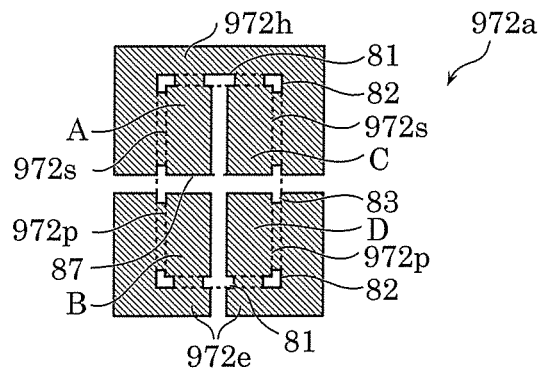
FIG. 39B is a top view illustrating an example of a shape of a front surface metal pattern formed in a main-mount in which the sub-mount illustrated in FIG. 39A is disposed.
Figure 40A:
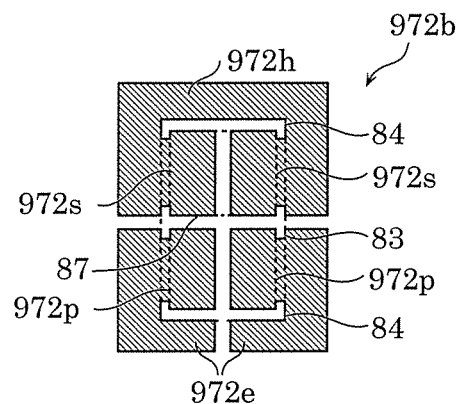
FIG. 40A is a top view illustrating an example of a shape of a front surface metal pattern formed in a main-mount in which the sub-mount illustrated in FIG. 39A is disposed.
Figure 40B:
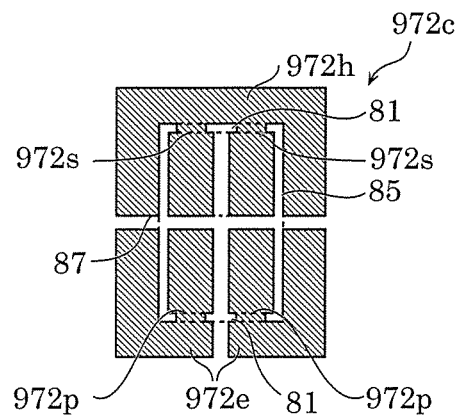
FIG. 40B is a top view illustrating an example of a shape of a front surface metal pattern formed in a main-mount in which the sub-mount illustrated in FIG. 39A is disposed.

FIG. 39A is a bottom view illustrating an example of a shape of back surface heat dissipation pads 946*h* in sub-mount 942 in related art. FIG. 39B, FIG. 40A, and FIG. 40B are each a top view illustrating an example of a shape of a front surface metal pattern formed in a main-mount in which the sub-mount illustrated in FIG. 39A is disposed.

Figure 41A:
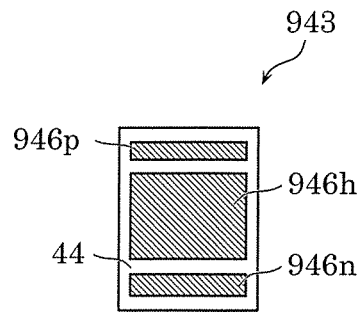
FIG. 41A is a bottom view illustrating an example of a shape of the back surface heat dissipation pad in the sub-mount in related art.
Figure 41B:
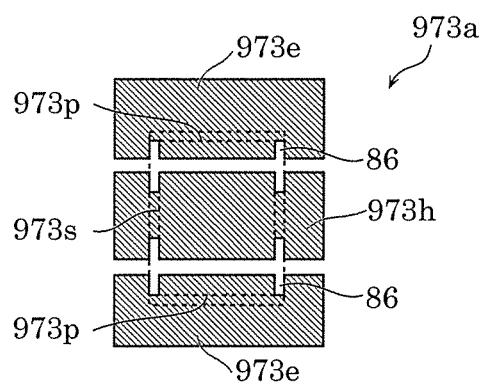
FIG. 41B is a top view illustrating an example of a shape of a front surface metal pattern formed in a main-mount in which the sub-mount illustrated in FIG. 41A is disposed.
Figure 42:
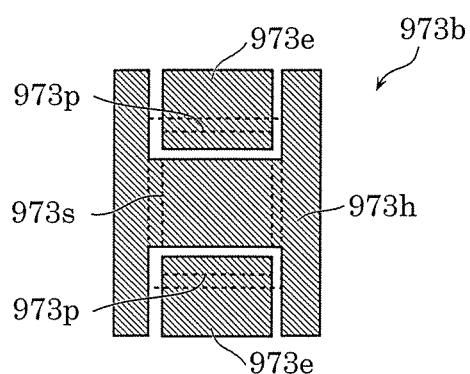
FIG. 42 is a top view illustrating an example of a shape of a front surface metal pattern formed in a main-mount in which the sub-mount illustrated in FIG. 41A is disposed.

FIG. 41A is a bottom view illustrating an example of a shape of back surface heat dissipation pads 946*h* in sub-mount 942 in related art. FIG. 41B and FIG. 42 are each a top view illustrating an example of a shape of a front surface metal pattern formed in a main-mount in which the sub-mount illustrated in FIG. 41A is disposed.

Sub-mount 941 illustrated in FIG. 37A has two back surface heat dissipation pads 946*h* and two back surface electrodes 946*p* and 946*n*, obtained by simply halving two rectangular back surface electrodes 946 as illustrated in bottom view (a) of FIG. 36A, on the back surface of sub-mount substrate 44.

Thus, when self-alignment structure is provided in the electrode pads of the main-mount, axis misalignment of sub-mount 941 can be reduced because the effect of the self-alignment has symmetry.

Sub-mount 942 illustrated in FIG. 39A has one back surface heat dissipation pad 946*h* having the shape obtained by integrating two back surface heat dissipation pads 946*h* illustrated in FIG. 37A, on the back surface of sub-mount substrate 44. Although the effect of self-alignment in the pad configuration of sub-mount 942 illustrated in FIG. 39A is lower than the effect of the pad configuration of sub-mount 941 illustrated in FIG. 37A, heat dissipation performance is improved because back surface heat dissipation pad 946*h* is integrated.

In sub-mount 943 illustrated in FIG. 41A, back surface heat dissipation pad 946*h* is disposed on the exact opposite side of sub-mount 943 from the light emitting element disposed in the center of the front surface of sub-mount 943, and back surface electrodes 946*p* and 946*n* are disposed at positions away from the light emitting element which is a heat source as much as possible.

Here, the process of mounting sub-mount 940 in main-mount 950 will be described with reference to FIG. 36A. As illustrated in bottom view (a) and top view (b) of FIG. 36A, when a self-alignment structure using rectangular back surface electrode 946 and electrode pad 970*p* is adopted, sub-mount 940 and main-mount 950 are connected by solder as follows.

After solder 60 is formed on electrode pad 970*p* of main-mount 950, as illustrated in sectional view (c) of FIG. 36A, back surface electrode 946 of sub-mount 940 is disposed on solder 60, and put in a reflow furnace to be melted, and thereby sub-mount 940 and main-mount 950 are connected. Sub-mount 940 and main-mount 950 are connected, thereby obtaining non-defective light emitting device 900 as illustrated in sectional view (d) of FIG. 36A, or defective light emitting device 900*a* as illustrated in sectional view (e), for instance.

Figure 36B:
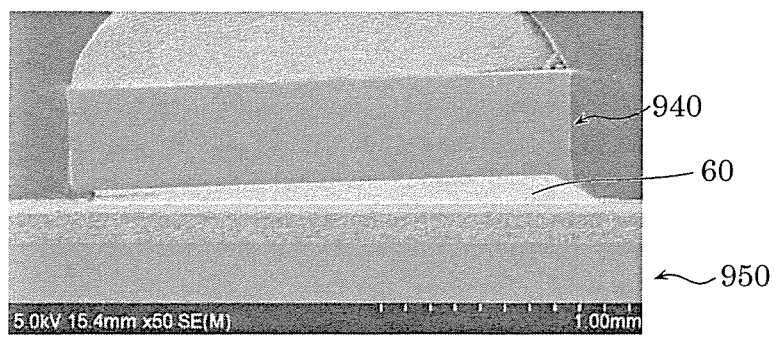
FIG. 36B is a photograph illustrating an example of a sectional SEM image of a defective light emitting device.

In non-defective light emitting device 900, as illustrated in sectional view (d), sub-mount 940 is maintained in a horizontal state with respect to main-mount 950. In contrast, in defective light emitting device 900*a*, as illustrated in sectional view (e), there is a problem in that sub-mount 940 is inclined to main-mount 950. Such problem is caused by the state of solder 60 before connection of sub-mount 940 and main-mount 950, or fluctuations of the environment of the reflow furnace. FIG. 36B illustrates an example of a sectional SEM image of defective light emitting device 900*a*. As illustrated in FIG. 36B, sub-mount 940 is connected main-mount 950 with inclined upward to the right.

The case where only two electrodes are provided in the back surface of the sub-mount has been described so far. For instance, when back surface heat dissipation pad 946*h* as illustrated in FIG. 37A, FIG. 39A, and FIG. 41A is provided, an electrode pad and a front surface heat dissipation pad having substantially the same shape as the back surface electrode and the heat dissipation pad are respectively formed in the front surface metal pattern of the main-mount. From the viewpoint of self-alignment of the sub-mount to the main-mount, it is most desirable that the back surface electrode and the heat dissipation pad, and the electrode pad and the surface heat dissipation pad have the same shape. Thus, the electrode pad in the front surface metal pattern is probably better when the front surface metal pattern has less continuity with the outside of the opening of the cover resin, that is, the region covered by the cover resin. On the other hand, from the viewpoint of heat dissipation from the light emitting element, the electrode pad in the front surface metal pattern is probably better when the front surface metal pattern has more continuity with the wiring electrode outside of the opening of the cover resin. In order to solve the trade-off, many patterns can be devised for the shape of a portion, exposed through the cover resin, of the wiring electrode including the electrode pad.

In related art, for back surface electrodes 946*p* and 946*n*, and back surface heat dissipation pads 946*h* of sub-mount 941 illustrated in FIG. 37A, cover resin 951 provided with an opening as illustrated in FIG. 37C may be formed on front surface metal patterns 971*a*, 971*b*, and 971*c* of the main-mount as illustrated in FIG. 37B, FIG. 38A, and FIG. 38B. Four electrode pads 971*p* exposed through cover resin 951 are formed in substantially the same shape as back surface electrodes 946*p* and 946*n*, and back surface heat dissipation pads 946*h* of sub-mount 941.

Similarly, in related art, for back surface electrodes 946*p* and 946*n*, and back surface heat dissipation pad 946*h* of sub-mount 942 of FIG. 39A, cover resin 951 (see FIG. 37C) provided with an opening may be formed on front surface metal patterns 972*a*, 972*b*, and 972*c* of the main-mount as illustrated in FIG. 39B, FIG. 40A, and FIG. 40B. Electrode pad 972*p* and front surface heat dissipation pad 972*s* exposed through cover resin 951 are formed in substantially the same shape as back surface electrodes 946*p* and 946*n*, and back surface heat dissipation pad 946*h* of sub-mount 942.

Similarly, in related art, for back surface electrodes 946*p* and 946*n*, and back surface heat dissipation pad 946*h* of sub-mount 943 of FIG. 41A, cover resin 951 (see FIG. 37C) provided with an opening may be formed on front surface metal patterns 973*a* and 973*b* of the main-mount as illustrated in FIG. 41B, FIG. 42. Electrode pad 973*p* and surface heat dissipation pad 973*s* exposed through cover resin 951 are formed in substantially the same shape as back surface electrode 946*p* (or back surface electrode 946*n*) and back surface heat dissipation pad 946*h* of sub-mount 943.

Although each of these electrode structures is for achieving both self-alignment and reduction in thermal resistance, when a thermal cycling test, which is an environmental test, was conducted, the inventors have found a problem that crack occurred in solder in each structure. It is to be noted that in the thermal cycling test, the temperature change from −40° C. to 125° C. is repeated for 1000 cycles in a non-current-carrying state.

Thus, it is an object of the present disclosure to provide a light emitting device having improved strain resistance characteristics in a thermal cycle. In addition, it is an object of the present disclosure to provide a solder bond structure including a sub-mount, a main-mount, and a solder that connects the sub-mount and the main-mount, the solder bond structure being capable of avoiding inclination of the sub-mount with respect to the main-mount.

In order to achieve the object, the light emitting device according to the present disclosure includes: a light emitting element; a sub-mount including a sub-mount substrate having a front surface on which the light emitting element is disposed, and a back surface electrode disposed in a back surface that is on a back side of the front surface of the sub-mount substrate; and a main-mount in which the sub-mount is disposed, the main-mount including a front surface metal pattern including a wiring electrode bonded to the back surface electrode via solder. The front surface metal pattern has a slit, in plan view, at a position away from a disposition region in which the sub-mount is disposed.

In this manner, the front surface metal pattern has a slit outwardly of the disposition region, thus the effect of thermal strain on the solder is relieved. In addition, the disposition region in the front surface metal pattern and the region outwardly of the disposition region are connected via a portion other than the slit, which is effective in reducing degradation of thermal resistance of the front surface metal pattern.

An aspect of the present disclosure provides the light emitting device in which the slit may have a region between a first side included in the disposition region and an extended line of the first side, and a second side included in an outer periphery of the front surface metal pattern, the second side being opposed to the first side, the region being disposed in parallel to the first side.

Thus, a stress applied to the solder in a direction perpendicular to first side and second side can be reduced.

An aspect of the present disclosure provides the light emitting device in which the slit may be disposed on a line connecting two opposed corners of the disposition region.

An aspect of the present disclosure provides the light emitting device in which the slit may have a bent portion.

Since the slit has a bent portion like this, the slit has portions that extend in different directions. Therefore, a stress applied to the solder in different directions can be reduced.

An aspect of the present disclosure provides the light emitting device in which the front surface metal pattern may have a plurality of slits each of which is the slit, and the plurality of slits may be disposed at positions symmetrical about an axis which is a center line of the disposition region, in the front surface metal pattern.

Thus, a stress applied to the solder is also reduced in a bilaterally symmetrical manner approximately the central axis as the axis, and thus a stress locally applied to the solder is reduced. Therefore, damage to the solder is reduced.

An aspect of the present disclosure provides the light emitting device in which the solder may have a thickness of at least 20 μm and at most 150 μm.

Thus, poor contact between the front surface metal pattern and the back surface electrodes, due to an insufficient thickness of the solder can be reduced, and it is possible to avoid inclination of the sub-mount with respect to the main-mount, due to an excessive thickness of the solder.

An aspect of the present disclosure provides the light emitting device in which the solder may have a crack having a length that is at most 20% of a width of the solder in a cross-section.

When crack is 20% or less of the width of the solder like this, an increase in the resistance of the solder due to the crack can be reduced.

An aspect of the present disclosure provides the light emitting device in which the front surface metal pattern may include a front surface heat dissipation pad, the sub-mount may have a back surface heat dissipation pad adjacent to the back surface electrode, and the front surface heat dissipation pad and the back surface heat dissipation pad may be bonded via solder.

Like this, the front surface heat dissipation pad and the back surface heat dissipation pad bonded via the solder are provided, and thus heat transfer to the main-mount from the sub-mount can be promoted.

An aspect of the present disclosure provides the light emitting device in which the front surface metal pattern may include two wiring electrodes each of which is the wiring electrode, and the front surface heat dissipation pad may be disposed between the two wiring electrodes.

An aspect of the present disclosure provides the light emitting device in which the back surface electrode may have two main-mount bond portions and a first connection portion that connects the two main-mount bond portions, and the first connection portion may be smaller in width than each of the two main-mount bond portions.

This can reduce flow-in of the solder from one main-mount bond portion to the other main-mount bond portion, and thus occurrence of imbalance in the amounts of solder between two main-mount bond portions can be reduced. Therefore, it is possible to avoid inclination of the sub-mount bonded to the main-mount bond portions via the solder with respect to the main-mount.

An aspect of the present disclosure provides the light emitting device in which the two main-mount bond portions and the first connection portion may be disposed such that one side of each of the two main-mount bond portions and the first connection portion is on a line.

Thus, a necked portion (constriction) is formed at a central portion of a longer side of the back surface electrode. Therefore, it is possible to reduce the flow-in of the solder disposed in the back surface electrode from one main-mount bond portion to the other main-mount bond portion. Thus, occurrence of imbalance in the amounts of solder between two main-mount bond portions can be reduced. Therefore, it is possible to avoid inclination of the sub-mount bonded to the main-mount bond via the solder with respect to the main-mount.

An aspect of the present disclosure provides the light emitting device in which the wiring electrode may be covered by a resin, and the wiring electrode may have an electrode pad that is exposed through an opening provided in the resin, and the electrode pad may be formed by two sub-mount bond portions and a second connection portion that connects the two sub-mount bond portions, and the second connection portion may be smaller in width than each of the two sub-mount bond portions.

This can reduce flow-in of the solder from one sub-mount bond portion to the other sub-mount bond portion, and thus occurrence of imbalance in the amounts of solder between two sub-mount bond portions can be reduced. Therefore, it is possible to avoid inclination of the sub-mount bonded to the sub-mount bond portions via the solder with respect to the main-mount.

An aspect of the present disclosure provides the light emitting device in which the two sub-mount bond portions and the second connection portion may be disposed such that one side of each of the two sub-mount bond portions and the second connection portion is on a line.

Thus, a necked portion (constriction) is formed at a central portion of a longer side of the electrode pad. Therefore, it is possible to reduce the flow-in of the solder disposed in the electrode pad from one sub-mount bond portion to the other sub-mount bond portion. Thus, occurrence of imbalance in the amounts of solder between two main-mount bond portions can be reduced. Therefore, it is possible to avoid inclination of the sub-mount bonded to the main-mount bond via the solder with respect to the main-mount.

An aspect of the present disclosure provides a solder bond structure including: a sub-mount including a back surface electrode; and a main-mount in which the sub-mount is disposed, the main-mount including a wiring electrode bonded to the back surface electrode via solder. The back surface electrode includes two main-mount bond portions and a first connection portion that connects the two main-mount bond portions, and the first connection portion is smaller in width than each of the two main-mount bond portions.

This can reduce flow-in of the solder from one main-mount bond portion to the other main-mount bond portion, and thus occurrence of imbalance in the amounts of solder between two main-mount bond portions can be reduced. Therefore, it is possible to avoid inclination of the sub-mount bonded to the main-mount via the solder with respect to the main-mount.

Hereinafter, embodiments of the present disclosure will be described below with reference to the drawings. It is to be noted that each of the embodiments described below is a specific example of the present disclosure. Therefore, the numerical values, the components, the arrangement position and topology of the components, the processes (steps), and the order of the processes that are depicted in the following embodiments are examples, and it is not intended to limit the present disclosure. Thus, in the following embodiments, the components, which are not described in the independent claim that defines the most generic concept of the present disclosure, are regarded as any components.

Also, in the present description, the terms "upper" and "lower" do not refer to an upper direction (vertically upper) and a lower direction (vertically lower) in absolute spatial recognition, and are each used as a term that is defined by a relative positional relationship based on a stacking layer sequence in a stacked layer structure. The terms "upper" and "lower" are applied not only to the case where two components are disposed with an interval and another component is present between the two components, but also the case where two components closely attached to each other are disposed and are in contact with each other.

EMBODIMENTS

First, the basic configuration of a light emitting device and a solder bond structure according to an embodiment, and the process of manufacturing the light emitting device and the solder bond structure will be described with reference to the drawings.

Figure 28:
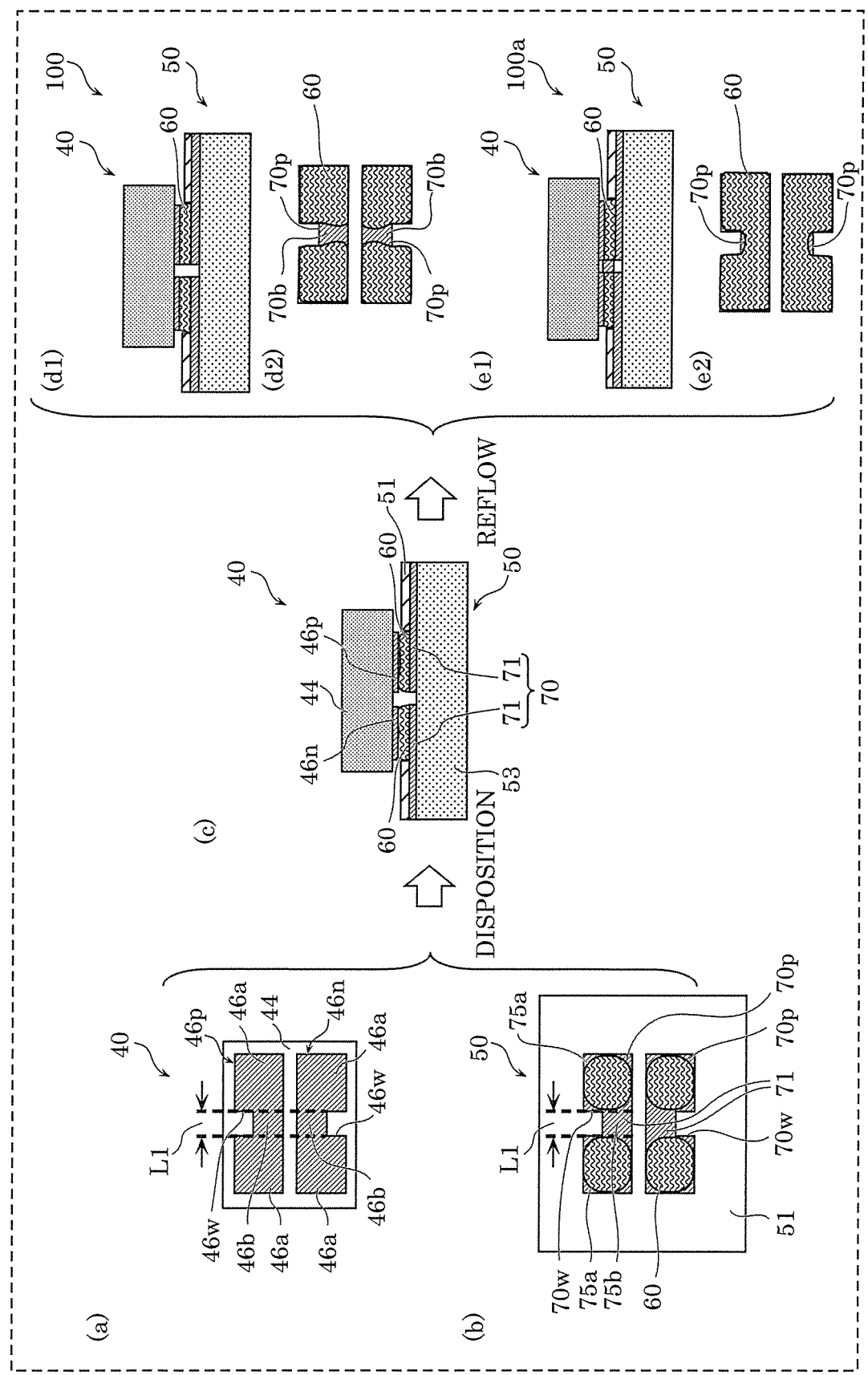
FIG. 28 is a schematic diagram illustrating the manufacturing process of a light emitting device according to an embodiment.

FIG. 28 is a schematic diagram illustrating the manufacturing process of light emitting device 100 according to this embodiment. Bottom view (a) of FIG. 28 illustrates the back surface (bottom surface) of sub-mount 40, and shows the shape of back surface electrodes 46p and 46n. Here, the light emitting element disposed on the sub-mount is omitted. Top view (b) of FIG. 28 illustrates the upper surface of main-mount 50. Sectional view (c) of FIG. 28 illustrates a section of sub-mount 40 and main mount 50 in a direction perpendicular to the upper surface of the main-mount with sub-mount 40 disposed in main mount 50. Sectional view (d1) of FIG. 28 illustrates a section of light emitting device 100 after a reflow process. Plan view (d2) of FIG. 28 illustrates the shape of solder 60 on electrode pads 70p of light emitting device 100 after a reflow process. Sectional view (e1) of FIG. 28 illustrates a section of light emitting device 100a after a reflow process. Plan view (e2) of FIG. 28 illustrates the shape of solder 60 on electrode pads 70p of light emitting device 100a after a reflow process.

As illustrated in bottom view (a) and top view (b) of FIG. 28, back surface electrodes 46p and 46n of sub-mount 40 and electrode pads 70p of main-mount 50 according to this embodiment respectively have necked portions 46w and 70w (constrictions) in a longer side of a rectangle. Here, back surface electrodes 46p and 46n of sub-mount 40 are each formed two main-mount bond portions 46a connected to the electrode pads of main-mount 50 via solder, and first connection portion 46b that connects these two main-mount bond portions 46a. The width of first connection portion 46b is smaller than the width of each of two main-mount bond portions 46a, and one side of each of two main-mount bond portions 46a and first connection portion 46b is disposed on a line. Thus, necked portion 46w (constriction) is formed at a central portion of the longer side of each of back surface electrodes 46p and 46n. It is to be noted that here, the width refers to the dimension in a direction intersecting an arrangement direction of two main-mount bond portions 46a. In this embodiment, necked portion 46w with a length of L1 is formed in the longitudinal direction (the arrangement direction of two main-mount bond portions 46a) of two back surface electrodes 46p and 46n. Two back surface electrodes 46p and 46n are disposed so that respective linear portions are opposed to each other. In other words, necked portions 46w of back surface electrodes 46p and 46n are opposed to the outer periphery of sub-mount 40 in a bottom view of sub-mount 40.

It is to be noted that the dimensions of back surface electrodes 46p and 46n are, for instance, approximately 1.9 mm in a longitudinal direction, and approximately 0.6 mm in a direction perpendicular to the longitudinal direction. Also, the length of necked portion 46w (L1) is approximately 0.3 mm, and the width (the dimension of back surface electrodes 46p and 46n in a direction perpendicular to the longitudinal direction) of necked portion 46w is approximately 0.3 mm. In other words, the dimensions of first connection portion 46b are approximately 0.3 mm each. Also, the dimensions of each main-mount bond portion 46a are approximately 6.5 mm in a horizontal direction, and approximately 6.0 mm in a vertical direction. The width (the dimension of back surface electrodes 46p and 46n in a direction perpendicular to the longitudinal direction) of first connection portion 46b may be at least 20% and as most 80% of the width of main-mount bond portion 46a, and preferably at least 40% and at most 60% of the width of main-mount bond portion 46a.

Here, electrode pads 70p of main-mount 50 are formed by covering two wiring electrodes 71 included in front surface metal pattern 70 formed on main-mount substrate 53, by cover resin 51. A region, of wiring electrode 71, exposed through the opening of cover resin 51 is called electrode pad 70p. Here, electrode pad 70p of main-mount 50 is formed by two sub-mount bond portions 75a connected to sub-mount 40 via solder, and second connection portion 75b that connects these two sub-mount bond portions 75a. Second connection portion 75b is smaller in width than each of two sub-mount bond portions 75a, and one side of each of two sub-mount bond portions 75a and second connection portion 75b is disposed on a line. Thus, necked portion 70w is formed at a central portion of each of the longer sides. It is to be noted that here, the width refers to the dimension in a direction intersecting an arrangement direction of two sub-mount bond portions 75a. In this embodiment, necked portion 70w with a length of L1 is formed on longitudinal (the arrangement direction of two main-mount bond portions 46a) sides of two electrode pads 70p. Two electrode pads 70p are disposed so that respective linear portions are opposed to each other. In other words, necked portions 70w of electrode pads 70p are opposed to the outer periphery of main-mount 50 in a top view of main-mount 50. Main-mount bond portions 46a and sub-mount bond portions 75a to be connected via solder have substantially the same shape, and back surface electrodes 46p and 46n, and electrode pads 70p including these bond portions have substantially the same shape.

Solder 60 is formed on sub-mount bond portions 75a of electrode pads 70p of main-mount 50, and as illustrated in sectional view (c) of FIG. 28, main-mount bond portions 46a of back surface electrodes 46p and 46n of sub-mount 40 are disposed on solder 60, and put in a reflow furnace to melt solder 60, thereby connecting sub-mount 40 and main-mount 50. It is to be noted that solder 60 is a metal bonding member, and no particular limitation is imposed as long as the bonding member is melted and solidified when used.

As an example of a light emitting device after the connection, a schematic sectional view of light emitting device 100 is illustrated by sectional view (d1) of FIG. 28, and a plan view of electrode pads 70p is illustrated by plan view (d2) of FIG. 28. Although solder 60 after melted mainly spreads over the region of sub-mount bond portion 75a of electrode pads 70p within the opening of cover resin 51, in the example illustrated by plan view (d2), two solders 60 are not connected. In this case, the amounts of two solders 60 are equated, and uniform two-point support is achieved. Thus, inclination of sub-mount 40 with respect to the long side direction of electrode pads 70p is unlikely to occur.

Also, as another example of a light emitting device after the connection, a schematic sectional view of light emitting device 100a is illustrated by sectional view (e1) of FIG. 28, and a plan view of electrode pads 70p is illustrated by plan view (e2) of FIG. 28. Light emitting device 100a is an example in which two solders 60 disposed on electrode pads 70p after melted each spread from sub-mount bond portions 75a of electrode pads 70p to second connection portion 75b, and are connected together in each electrode pad 70p. In this case, although solders 60 are connected and integrated within electrode pad 70p, the width of second connection portion 75b is narrow, and thus flow-in of solder 60 between two sub-mount bond portions 75a is retarded. As a result, inclination of sub-mount 40 with respect to the long side direction of electrode pads 70p is unlikely to occur.

Here, necked portions 46w of back surface electrodes 46p and 46n are formed outwardly so as to be opposed to the outer periphery of sub-mount 40 in bottom view of sub-mount 40. However, when necked portions 46w are formed inwardly so as to be opposed to each other, necked portions 46w are located directly below the light emitting element disposed in the front surface of sub-mount 40, and thus the region of back surface electrodes 46p and 46n directly under the light emitting element is reduced, which is not favorable from the viewpoint of heat dissipation performance. Also, the optimal shape of necked portions 46w (constriction) is varied with the size of back surface electrodes 46p and 46n, the type of solder 60, the amount of solder 60, and reflow conditions. The positions (in other words, the positions of back surface electrodes 46p and 46n in the longitudinal direction) of necked portions 46w in the crosswise direction in FIG. 28 may be at a central portion so that symmetry in the crosswise direction is not lost.

Next, the front surface metal pattern of main-mount 50 according to this embodiment will be described with reference to the drawings.

Figure 29:
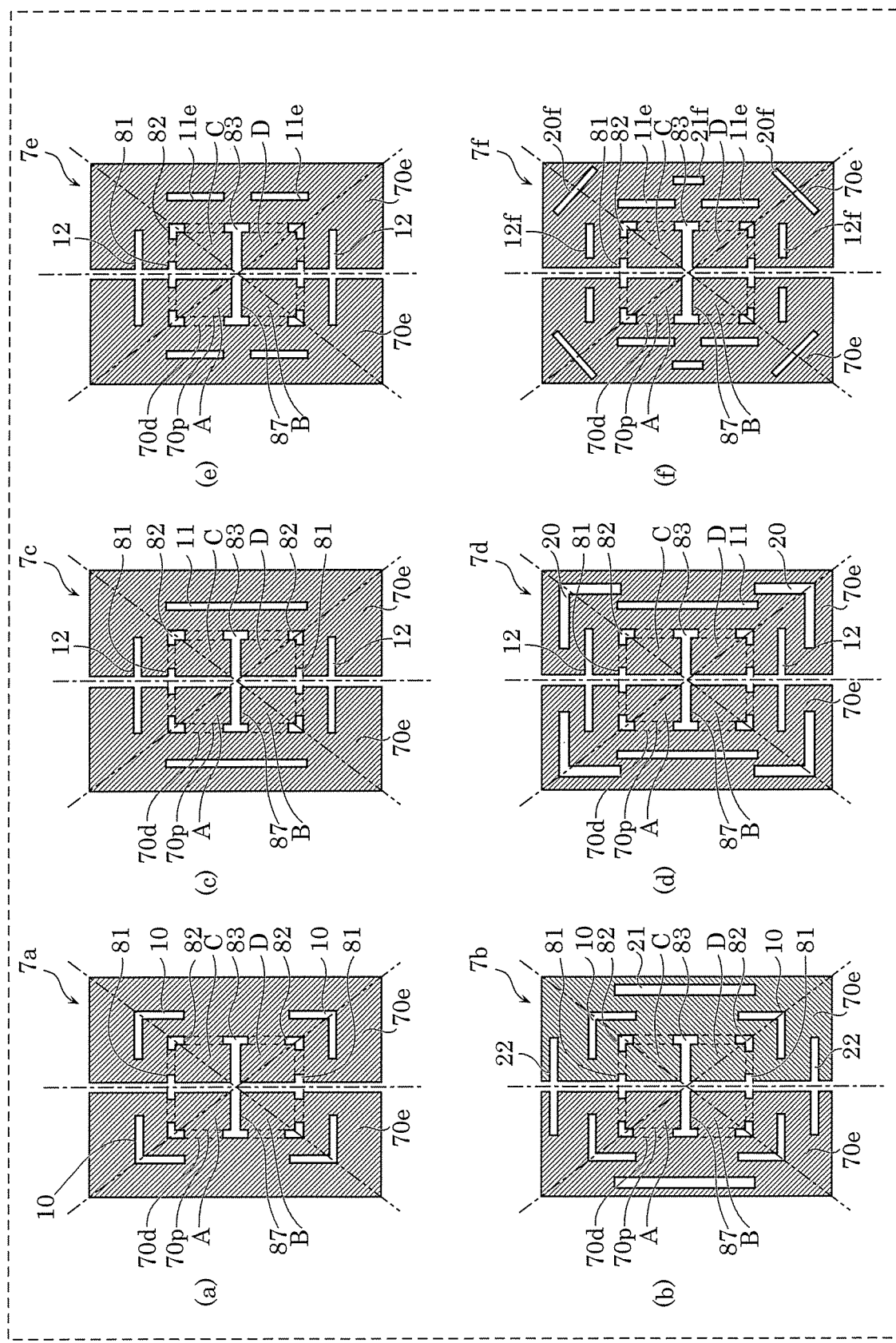
FIG. 29 is a plan view illustrating an example of a front surface metal pattern according to an embodiment.
Figure 30:
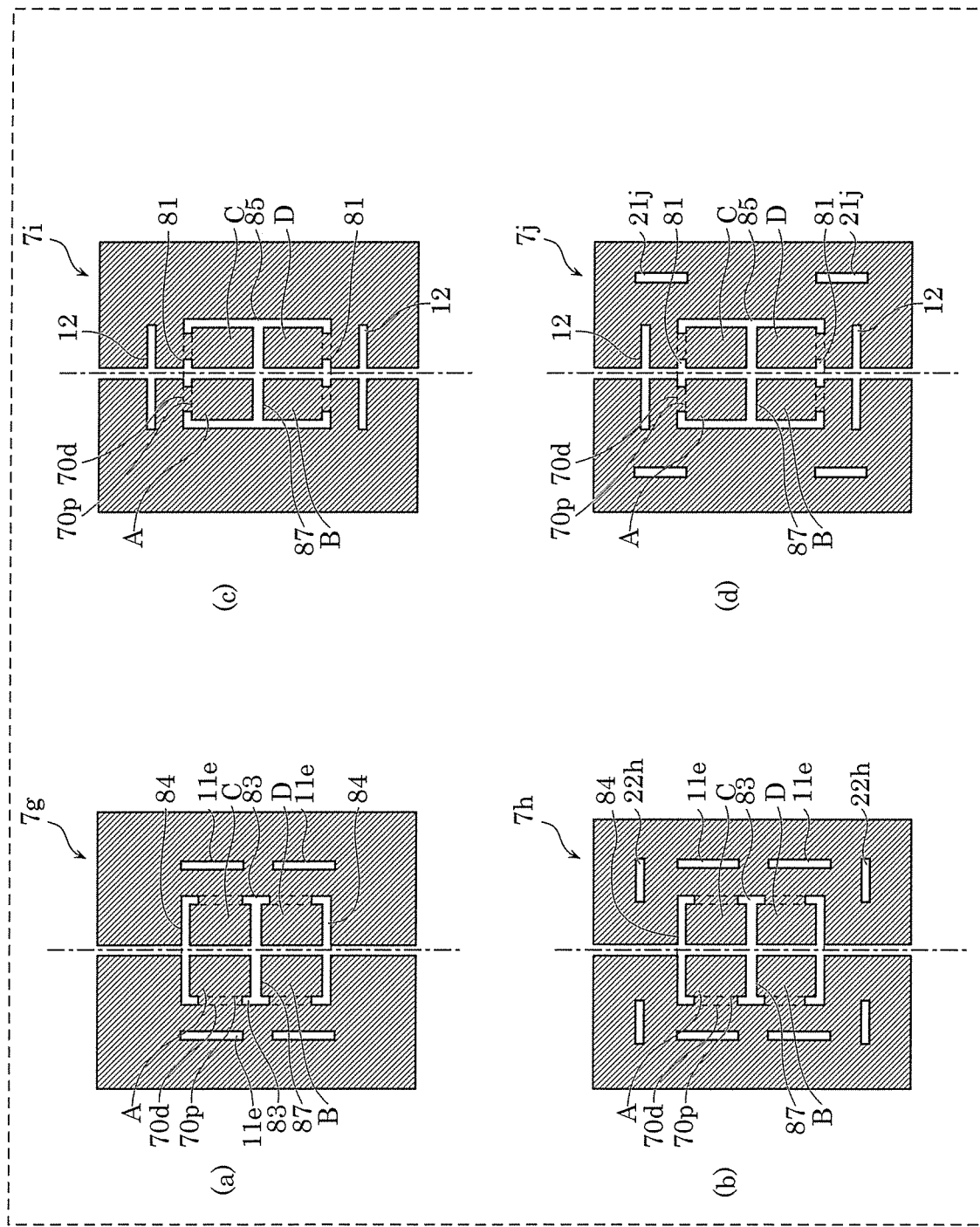
FIG. 30 is a plan view illustrating another example of the front surface metal pattern according to an embodiment.

FIG. 29 is a plan view illustrating an example of a front surface metal pattern according to this embodiment. In FIG. 29, plan view (a) to plan view (f) are illustrated, which indicate six front surface metal patterns including the configuration of electrode pad 971p illustrated in FIG. 37B. FIG. 30 is a plan view illustrating another example of the front surface metal pattern according to this embodiment. In FIG. 30, plan view (a) to plan view (d) are illustrated, which indicate four front surface metal patterns including the configuration of electrode pad 971p illustrated in FIG. 38A.

Plan view (a) of FIG. 29 illustrates front surface metal pattern 7a of main-mount 50 according to this embodiment, including the configuration of electrode pad 971p illustrated in FIG. 37B described above. In FIG. 37B, front surface metal pattern 971a is formed by only two wiring electrodes 971e arranged with an interval, the region surrounded by an outer dashed line corresponds to disposition region 971d of sub-mount 40, and the region surrounded by an inner dashed line corresponds to the region of four electrode pads 971p corresponding to the solder portion. For instance, region A of upper left electrode pad 971p is connected to the region of wiring electrode 971e outside the opening, covered by cover resin 951 in the left direction and the upper direction, and short slits 81, 82, and 83 are formed at the upper right corner, the upper left corner, and the lower left corner, respectively. Furthermore in front surface metal pattern 971a, slit 87 is formed between region A and region C of electrode pad 971p, and between region B and regions D of electrode pad 971p. Similarly, regions B to D other than region A are each connected to the region of wiring electrode 971e outside the opening, covered by cover resin 951. Here, the region of main-mount 50 overlapping with sub-mount 40 is assumed to be disposition region 971d (dashed line frame of FIG. 37B) in plan view with sub-mount 40 disposed in main-mount 50, the slits disposed in disposition region 971d are slits 81 to 83, and 87 for self-alignment. In this embodiment, in front surface metal pattern 971a including two wiring electrodes 971e, slits are formed outwardly of the region (disposition region) in which sub-mount 40 is disposed.

Here, regarding the slits for self-alignment, the effect of self-alignment and sufficient heat dissipation performance were obtained when the length of a continuous portion that connects region A of upper left electrode pad 971p and front surface metal pattern 971a outside disposition region 971d in FIG. 37B near disposition region 971d, in other words, the vertical distance (the distance in the vertical direction of FIG. 37B) between slit 82 and slit 83 in the outer peripheral region of disposition region 971d is 60 to 90% of one side of the electrode pad, in short, the vertical length of region A.

In front surface metal pattern 7a illustrated in plan view (a) of FIG. 29, in region A of electrode pad 70p, a portion (continuous portion not cut off by a slit) connected to wiring electrode 70e outwardly of disposition region 70d is in the left direction and the upper direction, and first slit 10 is formed outwardly of disposition region 70d in the upper left direction which is the direction combining the above-mentioned directions. In other words, front surface metal pattern 7a has first slit 10, in plan view, at a position away from disposition region 70d in which sub-mount 40 is disposed. First slit 10 has two linear portions respectively parallel to two sides included in the outer frame of sub-mount 40, and has L character shape in which the ends of the two linear portions are connected. Also, first slit 10 has a longer side which is a first side included in disposition region 70d, and a region disposed in parallel to the first side between an extension line of the first side and a second side included in the outer periphery of the front surface metal pattern, the second side being opposed to the first side. Also, first slit 10 has a shorter side which is a third side included in disposition region 70d, and a region disposed in parallel to the third side between an extension line of the third side and a fourth side included in the outer periphery of the front surface metal pattern, the fourth side being opposed to the third side. Also, first slit 10 has a bent portion that is a connection portion between the two linear portions. First slit 10 is disposed on the line that connects two opposed corners of disposition region 70d (see the dashed-two dotted line of FIG. 29). Also, first slit 10 may be disposed on the line (the dashed-two dotted line of plan view (a) of FIG. 29) that connects a corner of disposition region 70d and a corner included in the outer periphery of front surface metal pattern 7a. Furthermore, the bent portion of first slit 10 may be disposed on a line (the dashed-two dotted line of plan view (a) of FIG. 29) that connects the opposed two corners of disposition region 70d.

Also, at the upper right, lower right, and lower left portions of disposition region 70d, similar L-shaped first slits 10 are formed. First slit 10 relieves the effect of thermal strain on the solder bonded to electrode pad 70p, and electrode pad 70p is connected to front surface metal pattern 7a outwardly of disposition region 70d, which is effective in reducing degradation (increase) of thermal resistance of the front surface metal pattern.

Also, these first slits 10 are disposed at positions symmetrical about the axis that is the central axis (the dashed dotted line of plan view (a) of FIG. 29) of disposition region 70d in front surface metal pattern 7a. Thus, a stress applied to the solder is also reduced in a bilaterally symmetrical manner approximately the central axis as the axis, and thus a stress locally applied to the solder is reduced. Therefore, damage to the solder is reduced.

The shape of each first slit 10 is not limited to L character shape, and for instance, may be formed by a line in a diagonal direction or a curve such as quarter of a circle.

Also, first slit has the first side included in disposition region 70d, and a region disposed in parallel to the first side between an extension line of the first side and a second side included in the outer periphery of front surface metal pattern 7a, the second side being opposed to the first side. Therefore, a stress applied to the solder in a direction perpendicular to the first side and the second side can be reduced.

Also, since first slit 10 has a bent portion, first slit 10 has portions that extend in different directions. Therefore, a stress applied to the solder in different directions can be reduced.

Furthermore, second slits may be provided between two adjacent first slits 10 of plan view (a) of FIG. 29 in one more stage outwardly of a portion (continuous portion) at which the front surface metal pattern is connected. Such second slit will be described with reference to plan view (b) of FIG. 29. In front surface metal pattern 7b illustrated in plan view (b) of FIG. 29, the continuous portion of wiring electrode 70e between two adjacent first slits 10 is in the vertical direction and the crosswise direction with respect to disposition region 70d. In the example illustrated in plan view (b) of FIG. 29, second slits 21 and 22 are further formed outwardly of (the side far from disposition region 70d) those continuous portions in wiring electrode 70e.

Second slits 21 and 22 further relieve the effect of thermal strain on the solder, and connection between disposition region 70d and wiring electrode 70e outwardly of disposition region 70d is effective in reducing degradation of thermal resistance.

Also, the optimal positions, shapes, and sizes of first slit 10 and second slits 21 and 22 are varied with the size of electrode pads 70p, the type of solder, the amount of solder, and reflow conditions.

Second slits 21 illustrated in plan view (b) of FIG. 29 are for reducing thermal strain caused by the continuous portion between regions A and B and the continuous portion between regions C and D of electrode pads 70p in which two second slits 21 are adjacent to each other. The thermal strain reduction effect was observed when second slits 21 are disposed at the positions outwardly from disposition region 70d by a distance of approximately 80 to 200% of the length (twice the vertical distance between slit 82 and slit 83) of the continuous portion in the horizontal direction (the crosswise direction of FIG. 29), and the vertical length of second slits 21 is approximately 80 to 200% of the length of the continuous portion (twice the vertical distance).

Plan view (c) of FIG. 29 illustrates front surface metal pattern 7c of another main-mount 50 including the configuration of electrode pad 971p illustrated in FIG. 37B. In front surface metal pattern 7c illustrated in plan view (c) of FIG. 29, a portion (continuous portion) at which electrode pad 70p and wiring electrode 70e outwardly of disposition region 70d are connected is in the vertical direction and the crosswise direction, and linear first slits 11 and 12 are formed outwardly of the continuous portion. First slits 11 and 12 are disposed in parallel to the outer frame of sub-mount 40, that is, each side of disposition region 70d in top view of main-mount 50. First slits 11 and 12 relieve the effect of thermal strain on the solder of disposition region 70d, and connection between electrode pad 70p and the front surface metal pattern outwardly of disposition region 70d is effective in reducing degradation of thermal resistance.

Furthermore, second slits 20 may be further provided between first slit 11 and first slit 12 illustrated in plan view (c) of FIG. 29 in one more stage outwardly of a portion (continuous portion) at which front surface metal pattern 7c is connected. As illustrated in plan view (d) of FIG. 29, for the upper left, upper right, lower right, and lower left corners of disposition region 70d, the continuous portion between first slit 11 and first slit 12 in front surface metal pattern 7c illustrated in plan view (c) of FIG. 29 corresponds to the upper left, upper right, lower right, and lower left directions. Thus, in front surface metal pattern 7d illustrated in plan view (d) of FIG. 29, second slit 20 is further formed outwardly of the continuous portion. Second slits 20 in front surface metal pattern 7d each have two linear portions parallel to two respective adjacent sides included in the outer edge of disposition region 70d, and have L character shape in which the ends of the two linear portions are connected. Second slits 20 are disposed on the line that connects two opposed corners of disposition region 70. Also, second slit 20 may be disposed on the line that connects a corner of disposition region 70*d* and a corner included in the outer periphery of front surface metal pattern 7*d*. Second slits 20 further relieve the effect of thermal strain on the solder, and connection between the electrode pad of disposition region 70*d* and front surface metal pattern 7*d* outwardly of disposition region 70*d* is effective in reducing degradation of thermal resistance.

The shape of each second slit 20 is not limited to L character shape, and for instance, may be formed by a line in a diagonal direction or a curve such as quarter of a circle.

Plan view (e) of FIG. 29 illustrates front surface metal pattern 7*e* of still another main-mount 50, including electrode pad 971*p* configuration illustrated in FIG. 37B. In front surface metal pattern 7*e* illustrated in plan view (e) of FIG. 29, a portion (continuous portion) at which electrode pad 70*p* and wiring electrode 70*e* outwardly of disposition region 70*d* are connected is in the vertical direction and the crosswise direction, and linear first slits 11*e* and 12 are disposed outwardly of the continuous portion in parallel to two adjacent sides included in the outer edge of disposition region 70*d*. In order to improve thermal diffusion in the crosswise direction of FIG. 29 by reducing the thermal resistance due to the first slit disposed on each longer side of disposition region 70*d* among these slits, two first slits 11*e*, which are separated in the longitudinal direction, are formed on the longer side of disposition region 70*d*. In other words, with each first slit separated, a continuous portion between electrode pad 70*p* and front surface metal pattern 7*e* outwardly of disposition region 70*d* is provided. First slit 11*e* relieves the effect of thermal strain on the solder bonded to electrode pad 70*p*, and connection between electrode pad 70*p* and front surface metal pattern 7*e* outwardly of disposition region 70*d* is effective in reducing degradation of thermal resistance.

First four slits 11*e* illustrated in plan view (e) of FIG. 29 are for reducing thermal strain which is caused by continuous portions of regions A, B, C, D of adjacent electrode pads 70*p*. For instance, near disposition region 70*d*, when the length (in other words, the vertical distance between slit 82 and slit 83) of a continuous portion at which region A of electrode pad 70*p* and front surface metal pattern 7*e* outwardly of disposition region 70*d* are connected is used as a reference, the thermal strain reduction effect was observed when first slits 11*e* are disposed at the positions outwardly from disposition region 70*d* by a distance of approximately 80 to 200% of the length of the continuous portion in the horizontal direction (the crosswise direction of FIG. 29), and the vertical length of first slits 11*e* is approximately 80 to 200% of the length of the continuous portion.

Furthermore, based on the same idea, plan view (f) of FIG. 29 illustrates front surface metal pattern 7*f* in which second slits 20*f* are provided between first slit 11*e* and first slit 12 front surface metal pattern 7*e* of plan view (e) of FIG. 29 outwardly of a portion (continuous portion) at which front surface metal pattern 7*e* is connected, and second slits 21*f* are provided between two first slits 11*e* in one more stage outwardly of a portion (continuous portion) at which front surface metal pattern 7*e* is connected. Second slits 20*f* illustrated in plan view (f) has a linear shape inclined to two sides included in the outer edge of disposition region 70*d*. The effect as in second slits 20 illustrated in plan view (d) of FIG. 29 can also be achieved by such second slits 20*f*.

Also, on each shorter side of disposition region 70*d* of front surface metal pattern 7*f*, first slits 12 disposed for reducing thermal strain cause increase in the thermal resistance. Two first slits 12*f* are separated in the longitudinal direction, and heat is thereby dissipated via a portion where no slit is provided, thus the thermal resistance is improved.

Plan view (a) of FIG. 30 illustrates front surface metal pattern 7*g* of the main-mount, including electrode pad 971*p* configuration illustrated in FIG. 38A, according to this embodiment. Front surface metal pattern 971*b* illustrated in FIG. 38A is formed by only two wiring electrodes 971*e*, and in the regions of four electrode pads 971*p* corresponding to the solder indicated by regions surrounded by a dashed line, for instance, region A of upper left electrode pad 971*p* is connected to the region of wiring electrode 971*e* outwardly of the opening, covered by cover resin 951 only in the left direction, and slit 84 is formed at the upper side and the upper left corner, and short slit 88 is formed at the lower left corner. These slits are for self-alignment disposed in disposition region 971*d* (the dashed line frame of FIG. 38A).

In front surface metal pattern 7*g* illustrated in plan view (a) of FIG. 30, in region A of electrode pad 70*p*, a portion (continuous portion) is connected to wiring electrode 70*e* outwardly of disposition region 70*d* only in the left direction, and linear first slit 11*e* is formed outwardly the portion. First slit 11*e* is disposed in parallel to the longer sides included in the outer periphery of disposition region 70*d*. Furthermore, also for each of region B, region C, and region D of electrode pad 70*p*, first slit 11*e* is formed at a similar position. First slit 11*e* relieves the effect of thermal strain on the solder bonded to electrode pad 70*p*, and connection between electrode pad 70*p* and front surface metal pattern outwardly of disposition region 70*d* is effective in reducing degradation of thermal resistance.

Furthermore, in front surface metal pattern 7*g* illustrated in plan view (a) of FIG. 30, second slit 22*h* is provided between first slit 11*e* and slit 84 for self-alignment in one more stage outwardly of a portion (continuous portion) at which front surface metal pattern 7*g* is connected, and thus front surface metal pattern 7*h* illustrated in plan view (b) of FIG. 30 is obtained. The continuous portion between first slit 11*e* and slit 84 for self-alignment in front surface metal pattern 7*g* extends in the vertical direction in FIG. 30, and in front surface metal pattern 7*h*, second slit 22*h* is further formed outwardly of the continuous portion.

Second slit 22*f* further relieves the effect of thermal strain on the solder bonded to electrode pad 70*p*, and connection between electrode pad 70*p* and front surface metal pattern outwardly of disposition region 70*d* is effective in reducing degradation of thermal resistance.

Plan view (c) of FIG. 30 illustrates front surface metal pattern 7*i* of main-mount 50, including the configuration of electrode pad 971*p* illustrated in FIG. 38B, according to this embodiment. Front surface metal pattern 971*c* illustrated in FIG. 38B is formed by only two wiring electrodes 971*e*, and in the regions of four electrode pads 971*p* corresponding to the solder indicated by regions surrounded by a dashed line, for instance, region A of upper left electrode pad 971*p* is connected to the region of wiring electrode 971*e* outwardly of the opening, covered by cover resin 951 only in the upper direction, and slit 85 is formed at the left side and the upper left corner, and short slit 81 is formed at the upper right corner. These slits are for self-alignment disposed in disposition region 971*d*.

In front surface metal pattern 7*i* illustrated in plan view (c) of FIG. 30, in region A of electrode pad 70*p*, a portion (continuous portion) is connected to wiring electrode 70*e* outwardly of disposition region 70d only in the upper direction, and linear first slit 12 is formed outwardly the portion. First slit 12 is disposed in parallel to the shorter sides included in the outer periphery of disposition region 70d. Furthermore, also for each of region B, region C, and region D of electrode pad 70p, first slit 12 is formed at a similar position. First slit 12 relieves the effect of thermal strain on the solder bonded to electrode pad 70p, and connection between electrode pad 70p and front surface metal pattern 7i outwardly of disposition region 70d is effective in reducing degradation of thermal resistance.

Furthermore, in front surface metal pattern 7i illustrated in plan view (c) of FIG. 30, second slit 21j is provided between first slit 12 and slit 85 for self-alignment in one more stage outwardly of a portion (continuous portion) at which front surface metal pattern 7i is connected, and thus front surface metal pattern 7j illustrated in plan view (d) of FIG. 30 is obtained. The continuous portion between first slit 12 and slit 85 for self-alignment in front surface metal pattern 7i extends in the crosswise direction in FIG. 30, and in front surface metal pattern 7j, second slit 21j is further formed outwardly of the continuous portion.

These slits further relieve the effect of thermal strain on the solder bonded to electrode pad 70p, and connection between electrode pad 70p and front surface metal pattern outwardly of disposition region 70d is effective in reducing degradation of thermal resistance.

Next, the front surface metal pattern including the configuration of an electrode pad and a front surface heat dissipation pad will be described with reference to the drawings.

Figure 31:
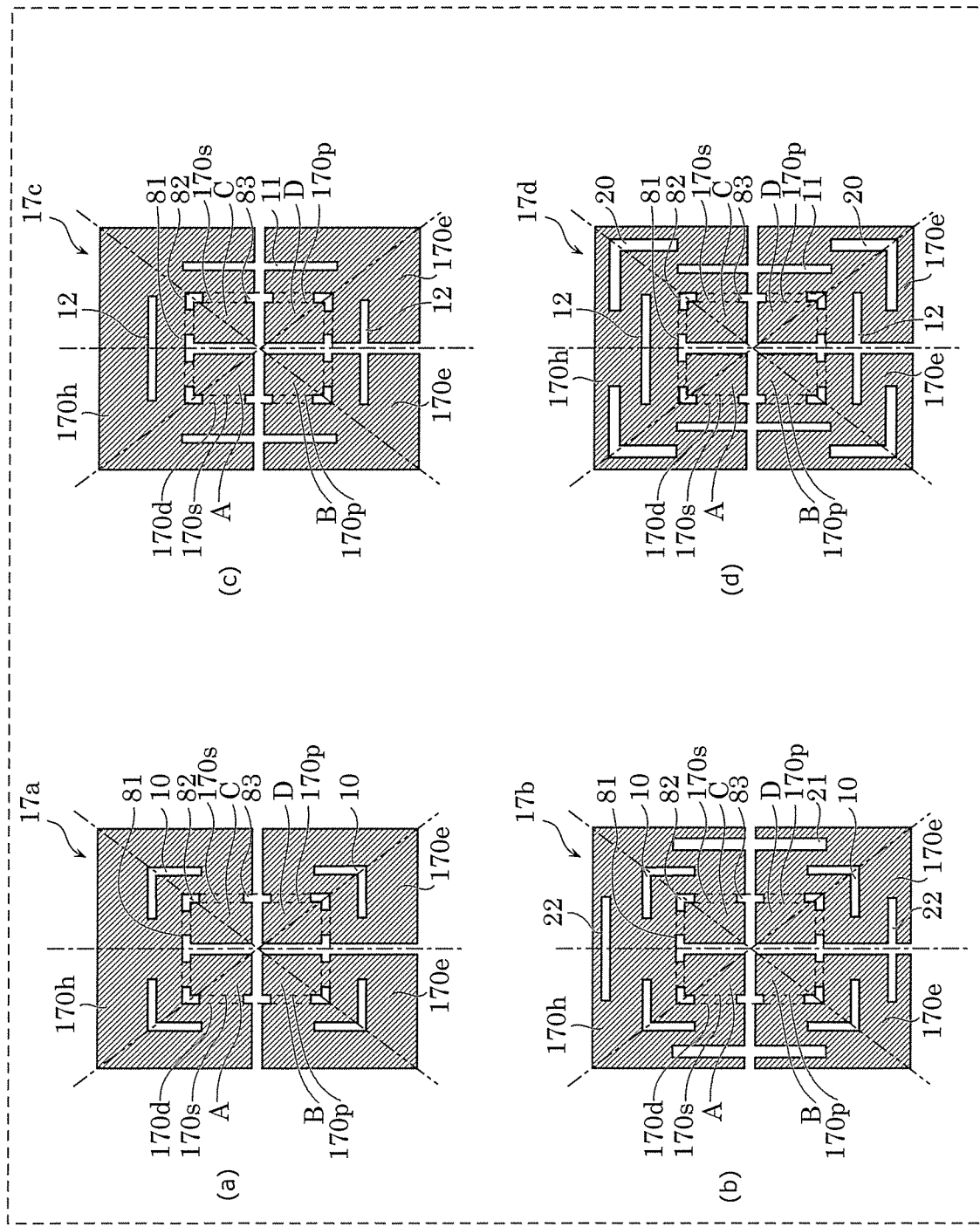
FIG. 31 is a plan view illustrating an example of a surface metal pattern having front surface heat dissipation pads according to an embodiment.
Figure 32:
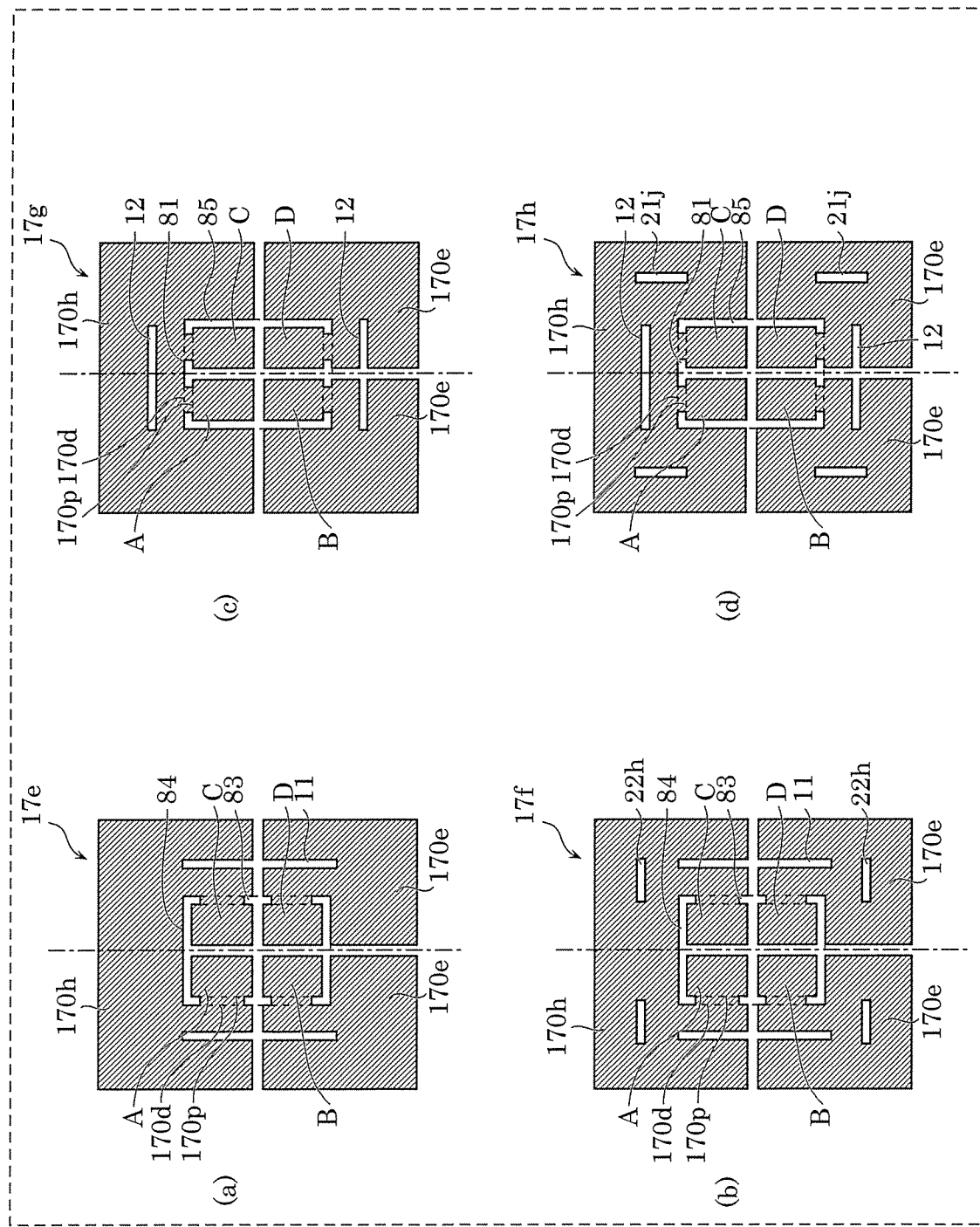
FIG. 32 is a plan view illustrating another example of a surface metal pattern having front surface heat dissipation pads according to an embodiment.
Figure 33:
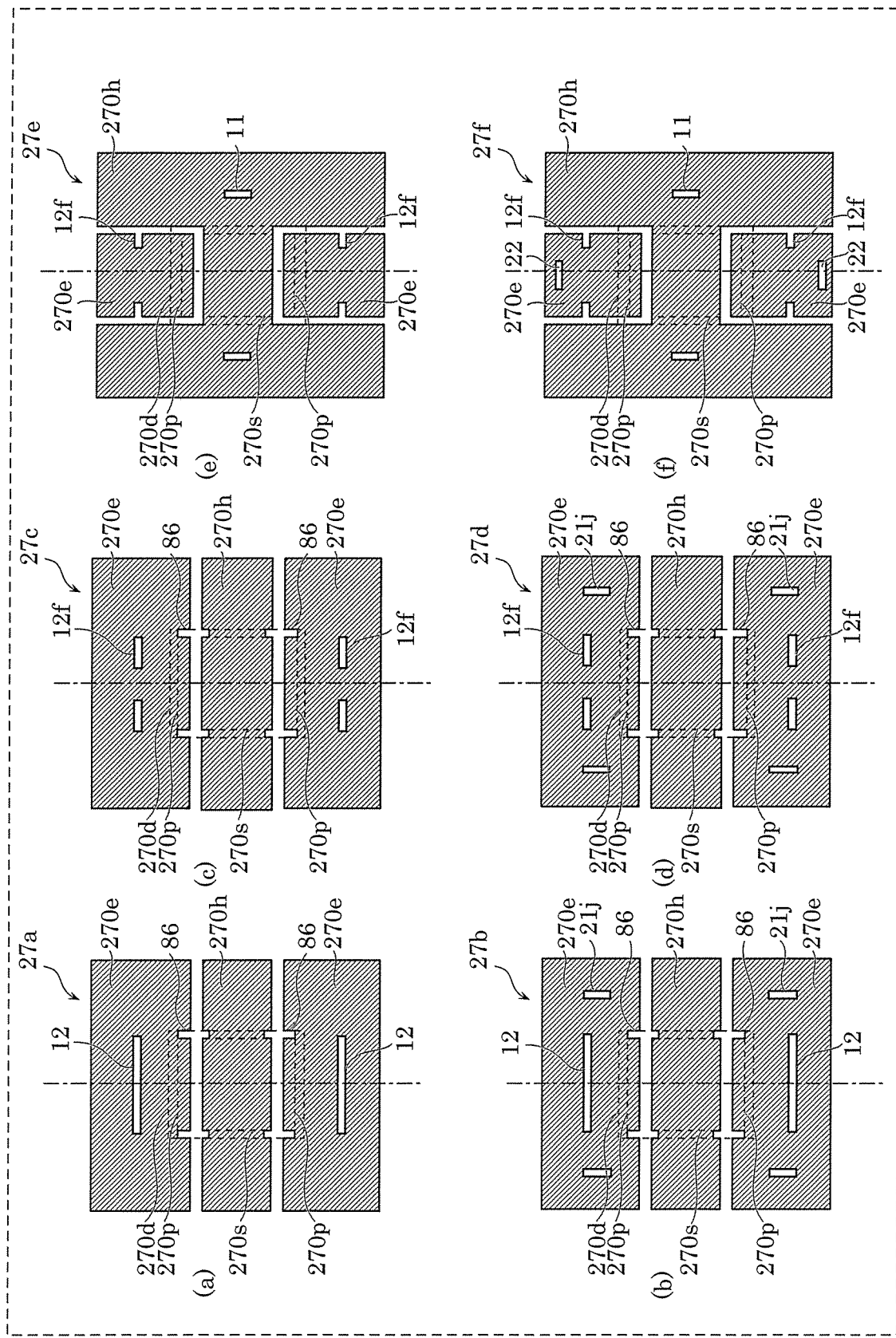
FIG. 33 is a plan view illustrating a still another example of a surface metal pattern having front surface heat dissipation pads according to an embodiment.

FIG. 31 is a plan view illustrating an example of a surface metal pattern having front surface heat dissipation pads according to this embodiment. FIG. 31 illustrates plan view (a) to plan view (d) that indicate four front surface metal patterns including the configuration of electrode pad 972p and front surface heat dissipation pad 972s illustrated in FIG. 39B. FIG. 32 is a plan view illustrating another example of a surface metal pattern having front surface heat dissipation pads according to this embodiment. FIG. 32 illustrates plan view (a) to plan view (d) that indicate four front surface metal patterns including the configuration of electrode pad 972p and front surface heat dissipation pad 972s illustrated in FIG. 40A and FIG. 40B. FIG. 33 is a plan view illustrating a still another example of a surface metal pattern having front surface heat dissipation pads according to this embodiment. FIG. 33 illustrates plan view (a) to plan view (d) that indicate four front surface metal patterns including the configuration of electrode pad 973p and front surface heat dissipation pad 973s illustrated in FIG. 41B, and plan view (e) and plan view (0 that indicate two surface metal patterns including the configuration of electrode pad 973p and front surface heat dissipation pad 973s illustrated in FIG. 42.

The surface metal pattern illustrated in FIG. 39B, FIG. 40A, and FIG. 40B illustrates the surface metal pattern including electrode pad 972p of a main-mount corresponding to a sub-mount including the back surface electrode and the back surface heat dissipation pad illustrated in FIG. 39A. In FIG. 39B, FIG. 40A, and FIG. 40B, the front surface metal pattern includes two wiring electrodes 972e and one surface heat dissipation pattern 972h, and one surface heat dissipation pattern 972h is disposed at a position opposed to two wiring electrodes 972e disposed side by side. Two electrode pads 972p and one surface heat dissipation pad 972s corresponding to three solder portions indicated by regions surrounded by a dashed line are respectively connected via solder to two back surface electrodes 946p, 946n and one back surface heat dissipation pad 946h of the sub-mount. Let front surface heat dissipation pad 972s be the region exposed through the opening of the cover resin within front surface heat dissipation pattern 972h.

Also, for front surface metal patterns 17a to 17h formed by two wiring electrodes 170e and one surface heat dissipation pattern 170h illustrated in FIG. 31 and FIG. 32, based on the same idea for the above-described arrangement of the first slits and the second slits of FIG. 29 and FIG. 30, the first slits and the second slits corresponding to arrangement of the slits for self-alignment are formed. That is, first slits are formed outwardly of electrode pad 170p between the slits for self-alignment and front surface heat dissipation pad 170s, and the continuous portion of the surface metal pattern outwardly of disposition region 170d, and the second slits are formed outwardly of the continuous portion of front surface metal pattern between the first slits, or outwardly of the continuous portion of front surface metal pattern between the first slit and the slit for self-alignment.

FIG. 41B and FIG. 42 illustrate the front surface metal pattern including electrode pad 973p of the main-mount corresponding to sub-mount 943 including back surface electrodes 946p and 946n, and back surface heat dissipation pad 946h illustrated in FIG. 41A. Front surface metal pattern 973a illustrated in FIG. 41B includes one surface heat dissipation pattern 973h inserted between two wiring electrodes 973e. Front surface metal pattern 973b illustrated in FIG. 42 is formed by one H-shaped front surface heat dissipation pattern 973h, and two wiring electrodes 973e respectively disposed in two H-shaped necked portions. For each of front surface metal patterns 973a and 973b, two electrode pads 973p and one surface heat dissipation pad 973s corresponding to three solder portions indicated by regions surrounded by a dashed line are respectively connected via solder to two back surface electrodes 946p, 946n and one back surface heat dissipation pad 946h of sub-mount 943.

Also, for front surface metal patterns 27a to 27h formed by wiring electrode 270e and surface heat dissipation pattern 270h illustrated in plan view (a) to plan view (f) of FIG. 33, based on the same idea for the above-described arrangement of the first slits and the second slits of each surface metal pattern illustrated in FIG. 29 and FIG. 30, the first slits and the second slits corresponding to arrangement of slits 86 for self-alignment are disposed. That is, first slits are formed outwardly of the continuous portion of the surface metal pattern outwardly of electrode pad 270p and surface heat dissipation pad 270s between the slits for self-alignment, and disposition region 270d, and the second slits are formed outwardly of the continuous portion of front surface metal pattern between the first slits, or outwardly of the continuous portion of front surface metal pattern between the first slit and the slit for self-alignment. These slits further relieve the effect of thermal strain on the solder bonded to electrode pad 270p and front surface heat dissipation pad 270s, and connection between electrode pad 270p and front surface metal pattern outwardly of disposition region 270d is effective in reducing degradation of thermal resistance.

Next, sub-mount 40 (see FIG. 28) including back surface electrodes 46p and 46n having necked portion 46w described above, and the front surface metal pattern of a main-mount corresponding to sub-mount 40 will be described with reference to the drawings.

Figure 43A:
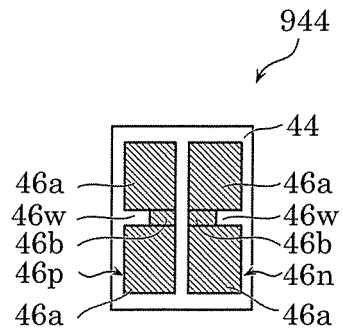
FIG. 43A is a bottom view illustrating an example of a shape of the back surface electrode in a sub-mount according to this embodiment.
Figure 43B:
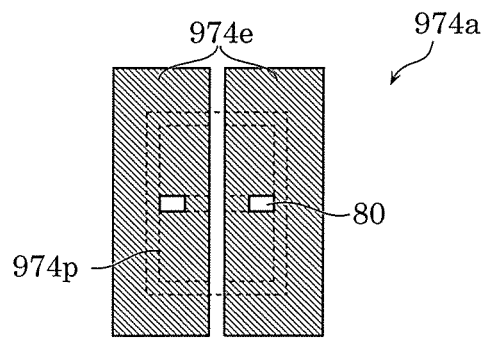
FIG. 43B is a top view illustrating an example of a shape of a front surface metal pattern corresponding to a back surface electrode having a necked portion according to this embodiment.
Figure 44:
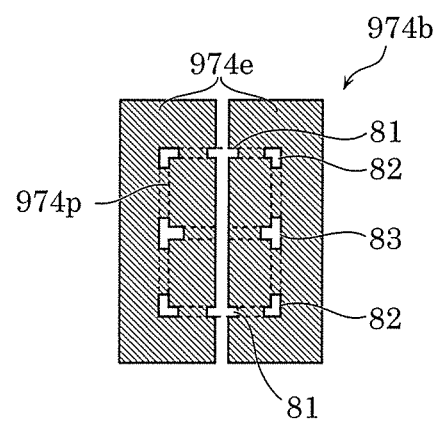
FIG. 44 is a top view illustrating another example of a shape of a front surface metal pattern corresponding to a back surface electrode having a necked portion according to this embodiment.

FIG. 43A is a bottom view illustrating an example of a shape of back surface electrodes 46p and 46n in sub-mount 94 according to this embodiment. FIG. 43B is a top view illustrating an example of a shape of front surface metal pattern 974a corresponding to back surface electrodes 46p and 46n having necked portion 46w according to this embodiment. FIG. 44 is a top view illustrating another example of a shape of front surface metal pattern 974b corresponding to back surface electrodes 46p and 46n having necked portion 46w according to this embodiment.

Back surface electrodes 46p and 46n illustrated in FIG. 43A have the same shape as back surface electrodes 46p and 46n illustrated in bottom view (a) of FIG. 28. Back surface electrodes 46p and 46n respectively have necked portion 46w in a longer side of a rectangle, and back surface electrodes 46p and 46n are disposed so that the longer sides, in which no necked portion 46w is formed, are opposed to each other (in other words, necked portion 46w is positioned outwardly).

Front surface metal pattern 974a of the main-mount illustrated in FIG. 43B includes two wiring electrodes 974e having slits 80 for self-alignment at the positions corresponding to necked portions 46w of back surface electrodes 46p and 46n of the sub-mount. In front surface metal pattern 974a, the region of electrode pad 974p is determined by slit 80 and cover resin 951 as illustrated in FIG. 37C. As described with reference to FIG. 28, inclination of sub-mount 844 to the main-mount can be avoided by using back surface electrodes 46p and 46n and surface metal pattern 974a.

Front surface metal pattern 974b of the main-mount illustrated in FIG. 44 includes two wiring electrodes 974e having slits 81, 82, and 83 for self-alignment. Slits 81 are linear slits that are formed at positions which correspond to the longitudinal ends of back surface electrodes 46p and 46n and which are near the central axis of the surface metal pattern. Slits 82 are L-shaped slits that are formed at positions corresponding to the outside corners of back surface electrodes 46p and 46n. Slits 83 are T-shaped slits that are formed at positions corresponding to necked portions 46w of back surface electrodes 46p and 46n. In front surface metal pattern 974b, the region of electrode pad 974p is determined by these slits and cover resin 951. As described with reference with FIG. 28, inclination of sub-mount 844 to the main-mount can be avoided by using back surface electrodes 46p and 46n and surface metal pattern 974b.

Next, the front surface metal pattern which includes the configuration of electrode pad 974p illustrated in FIG. 43B and FIG. 44 and is capable of relieving the effect of thermal strain will be described with reference to the drawings.

Figure 34:
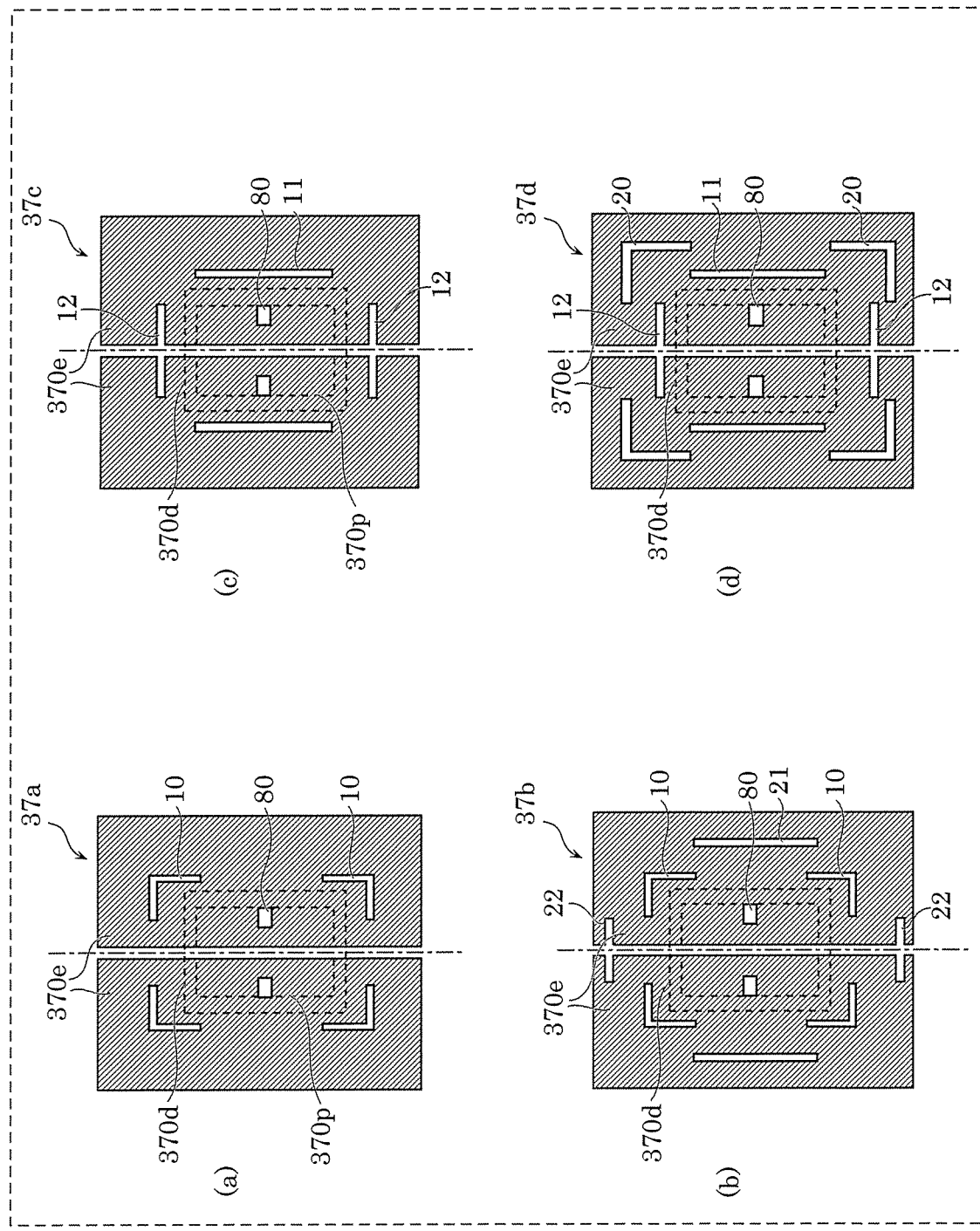
FIG. 34 is a top view illustrating an example of a shape of a surface metal pattern having a slit which is for relieving the effect of thermal strain and corresponds to a back surface electrode having a necked portion according to an embodiment.
Figure 35:
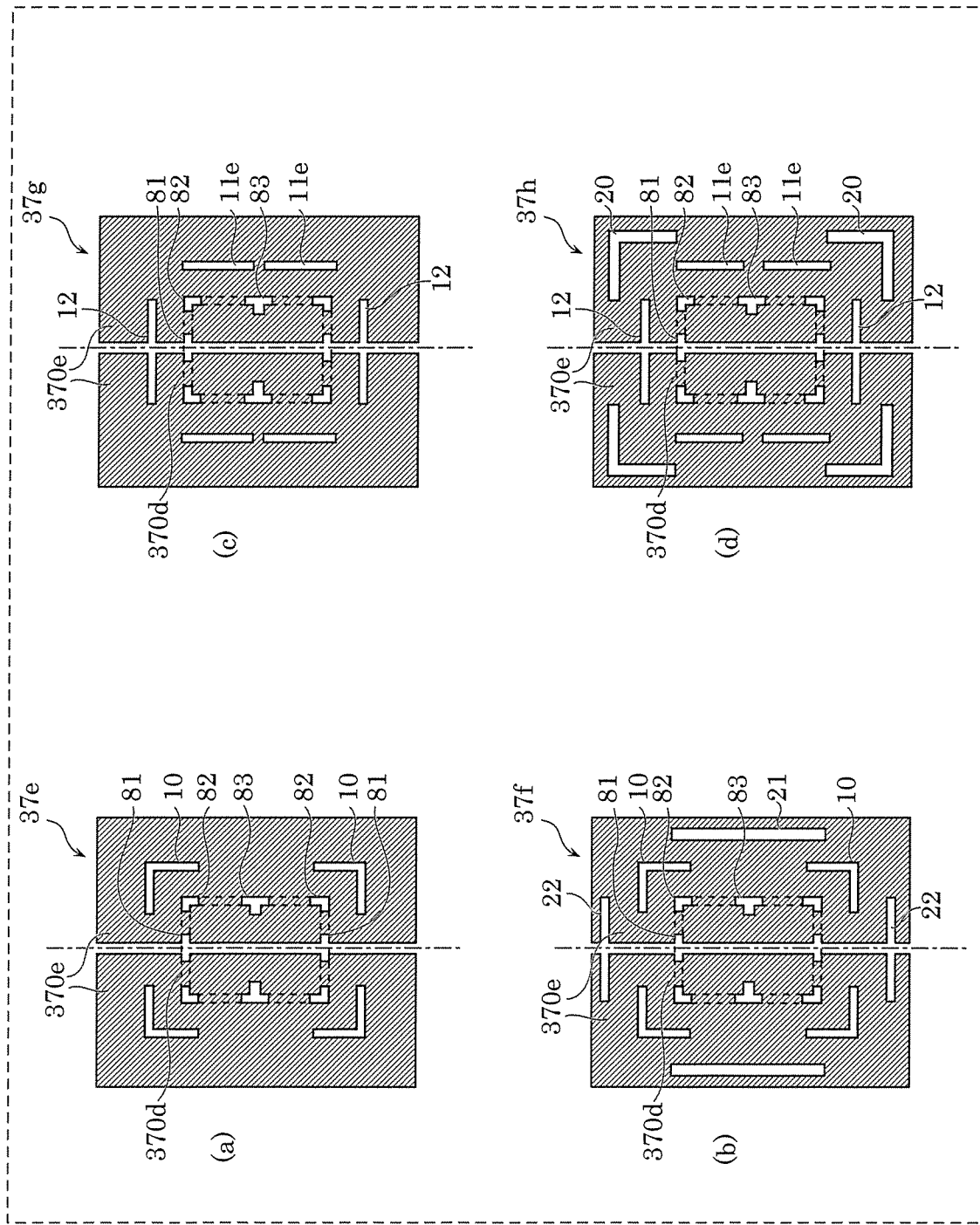
FIG. 35 is a top view illustrating another example of a shape of a surface metal pattern having a slit which is for relieving the effect of thermal strain and corresponds to a back surface electrode having a necked portion according to an embodiment.

FIG. 34 is a top view illustrating an example of a shape of a surface metal pattern having a slit which is for relieving the effect of thermal strain and corresponds to back surface electrodes 46p and 46n having necked portion 46w according to this embodiment. FIG. 34 illustrates plan view (a) to plan view (d) that indicate four front surface metal patterns including the configuration of electrode pad 974p illustrated in FIG. 43B. FIG. 35 is a top view illustrating another example of a shape of a surface metal pattern having a slit which is for relieving the effect of thermal strain and corresponds to back surface electrodes 46p and 46n having necked portion 46w according to this embodiment. FIG. 35 illustrates plan view (a) to plan view (d) that indicate four front surface metal patterns including the configuration of electrode pad 974p illustrated in FIG. 44.

Also, for front surface metal patterns 37a to 37h formed by two wiring electrodes 370e illustrated in FIG. 34 and FIG. 35, based on the same idea for the above-described arrangement of the first slits and the second slits of each surface metal pattern illustrated in FIG. 29 and FIG. 30, the first slits and the second slits corresponding to arrangement of the slits for self-alignment are disposed. That is, first slits are formed outwardly of the continuous portion of the surface metal pattern outwardly of electrode pad 370p between the slits for self-alignment, and disposition region 370d, and the second slits are formed outwardly of the continuous portion of front surface metal pattern between the first slits, or outwardly of the continuous portion of front surface metal pattern between the first slit and the slit for self-alignment. These slits further relieve the effect of thermal strain on the solder bonded to electrode pad 370p, and connection between electrode pad 370p and front surface metal pattern outwardly of disposition region 370d is effective in reducing degradation of thermal resistance.

Embodiment 1

A light emitting device according to Embodiment 1 will be described with reference to the drawings.

Figure 1A:
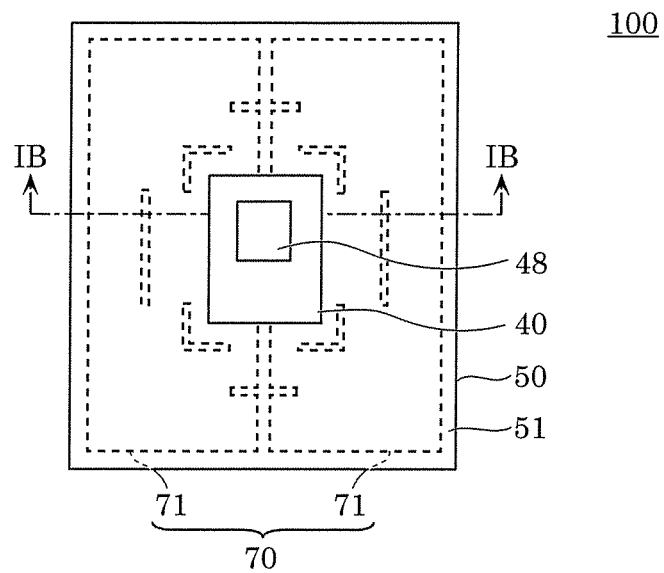
FIG. 1A is a top view illustrating the configuration of a light emitting device according to Embodiment 1.
Figure 1B:
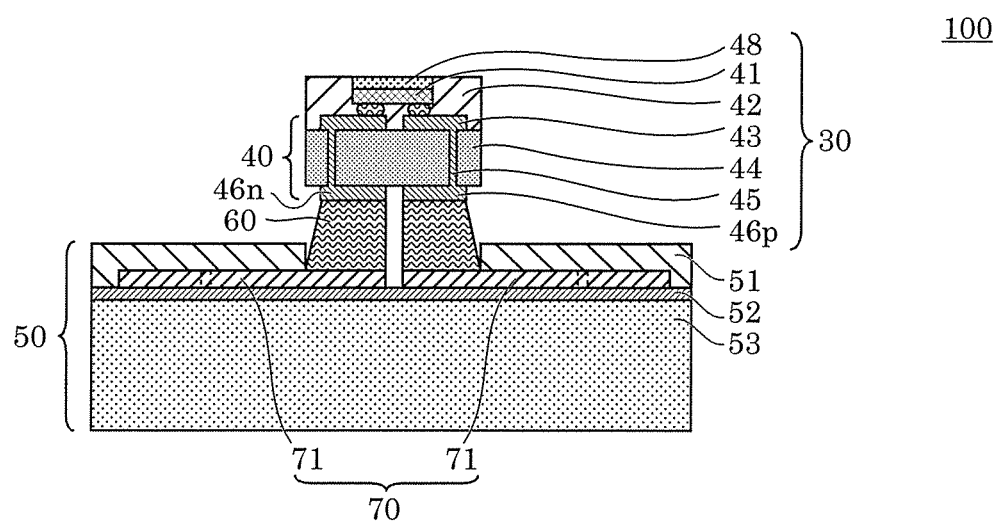
FIG. 1B is a sectional view illustrating the configuration of the light emitting device according to Embodiment 1.
Figure 2A:
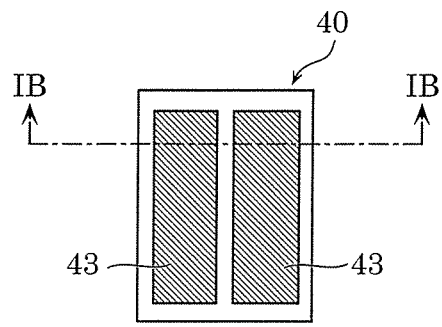
FIG. 2A is a top view illustrating the configuration of the front surface of a sub-mount of the light emitting device according to Embodiment 1.
Figure 2B:
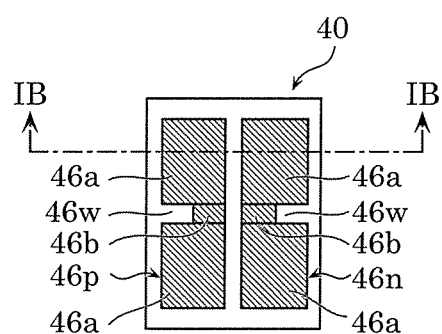
FIG. 2B is a bottom view illustrating the configuration of the back surface of the sub-mount of the light emitting device according to Embodiment 1.
Figure 3:
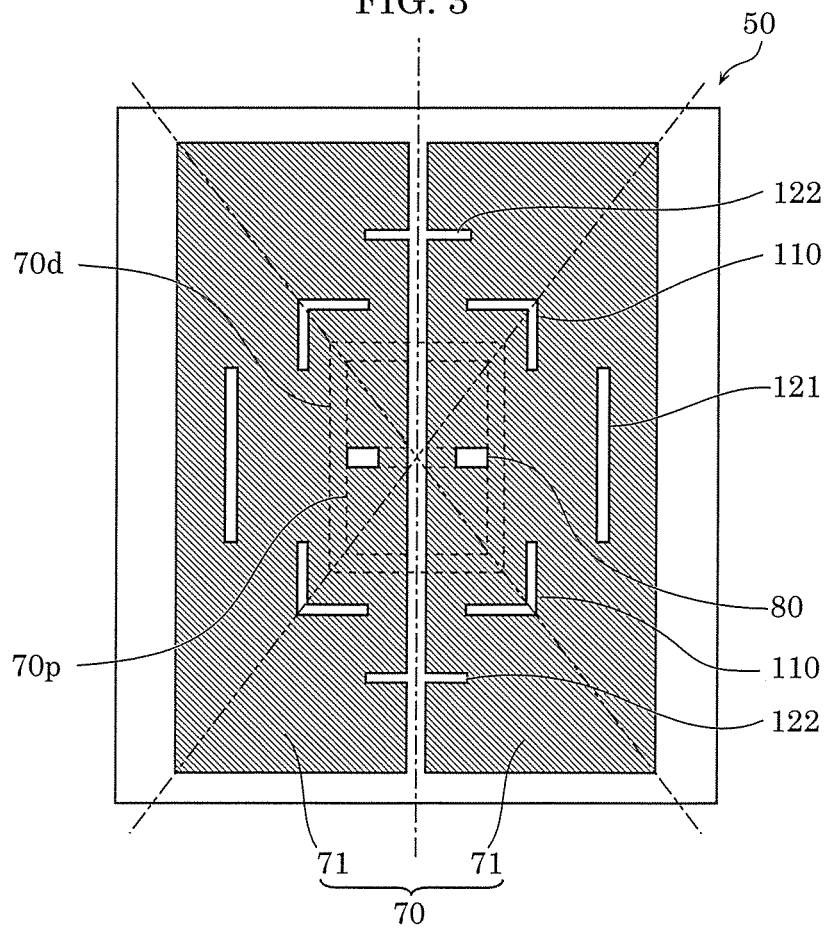
FIG. 3 is a top view of a main-mount of the light emitting device according to Embodiment 1.

FIG. 1A is a top view illustrating the configuration of light emitting device 100 according to Embodiment 1. It is to be noted that in FIG. 1A, the contour of surface metal pattern 70 including two wiring electrodes 71 is illustrated by a dashed line for reference. FIG. 1B is a sectional view illustrating the configuration of light emitting device 100 according to Embodiment 1. In FIG. 1B, IB-IB section of FIG. 1A is illustrated. FIG. 2A is a top view illustrating the configuration of the front surface of sub-mount 40 of light emitting device 100 according to Embodiment 1. FIG. 2B is a bottom view illustrating the configuration of the back surface of sub-mount 40 of light emitting device 100 according to Embodiment 1. FIG. 3 is a top view of main-mount 50 of light emitting device 100 according to Embodiment 1. In FIG. 3, in order to illustrate the configuration of front surface metal pattern 70, a top view of main-mount 50 with cover resin 51 removed is illustrated.

As illustrated in FIG. 1A and FIG. 1B, light emitting device 100 according to this embodiment includes package 30 including sub-mount 40 in which light emitting element 41 is mounted, and main-mount 50.

As illustrated in FIG. 1B, package 30 includes light emitting element 41, sub-mount 40 in which light emitting element 41 is disposed on a front surface, fluorescent substance plate 48 that converts the wavelength of emission light from light emitting element 41, and lateral side reflective resin 42 provided around light emitting element 41 and fluorescent substance plate 48. Sub-mount 40 includes insulating sub-mount substrate 44, on the surface of which light emitting element 41 is disposed, back surface electrodes 46p and 46n disposed on the back surface on the back side of the front surface of sub-mount substrate 44, two front surface electrodes 43 which are disposed on the front surface of sub-mount substrate 44 and to which light emitting element 41 is connected, and via wiring 45 which penetrates through sub-mount substrate 44 and is connected to each of two surface electrodes 43 and back surface electrodes 46p and 46n. In this embodiment, light emitting element 41 is flip-chip bonded to front surface electrode 43 of sub-mount substrate 44 via bumps. In this embodiment, fluorescent substance plate 48 is disposed on the upper surface (upper-side surface of FIG. 1B) of light emitting element 41. Also, blue light emitted from light emitting element 41, and yellow light which is wavelength-converted from the blue light by fluorescent substance plate 48 are mixed. Thus, white light is emitted from light emitting device 100. Lateral side reflective resin 42 reflects the light emitted from the lateral side of light emitting element 41 to light emitting element 41. That is, lateral side reflective resin 42 has a function of reflecting the light emitted from the lateral side of light emitting element 41 to light emitting element 41.

Back surface electrodes 46p and 46n of sub-mount 40 according to this embodiment have the shape as illustrated in FIG. 2B. That is, similarly to back surface electrodes 46p and 46n illustrated in bottom view (a) of FIG. 28, back surface electrodes 46p and 46n each have first connection portion 46b that connects two main-mount bond portions 46a and two main-mount bond portions 46a. First connection portion 46b is smaller in width than each of two main mount bond portions 46a. It is to be noted that the width refers to the dimension in a direction perpendicular to the longitudinal direction (the arrangement direction of two main-mount bond portions 46a) of back surface electrodes 46p and 46n in a plane in which back surface electrodes 46p and 46n are formed. Also, two main-mount bond portions 46a and first connection portion 46b are such that one side of each of two main-mount bond portions 46a and first connection portion 46b are disposed on a line. Thus, in this embodiment, back surface electrodes 46p and 46n have necked portion 46w in a longer side of a rectangle. Necked portion 46w is disposed on the outer periphery side of sub-mount 40.

As illustrated in FIG. 1B, main-mount 50 includes front surface metal pattern 70 including wiring electrode 71 bonded via solder 60 to back surface electrodes 46p and 46n of sub-mount 40, and sub-mount 40 is disposed in main-mount 50. Main-mount 50 includes main-mount substrate 53, and insulation layer 52 disposed on main-mount substrate 53. Surface metal pattern 70 is disposed on insulation layer 52. Also, main-mount 50 includes cover resin 51 that is disposed above insulation layer 52, and covers part of front surface metal pattern 70. The portion to be insulated from other conductive members in front surface metal pattern 70 is covered by cover resin 51. Specifically, in cover resin 51, an opening is provided on the region of front surface metal pattern 70 connected to main-mount bond portion 46a of sub-mount 40, and the region of wiring electrode 71 exposed through the opening is called electrode pad 70p. Electrode pad 70p is bonded to back surface electrodes 46p and 46n of sub-mount 40 via solder 60. Also, front surface metal pattern 70 has disposition region 70d in which sub-mount 40 is disposed, in plan view.

As described above, the solder bond structure included in light emitting device 100 according to this embodiment includes sub-mount 40 including back surface electrodes 46p and 46n, and main-mount 50 in which sub-mount 40 is disposed and which includes wiring electrode 71 bonded via solder 60 to back surface electrodes 46p and 46n. Back surface electrodes 46p and 46n are formed by first connection portion 46b that connects two main-mount bond portions 46a and two main-mount bond portions 46a, and first connection portion 46b is smaller in width than each of two main-mount bond portions 46a. This can reduce flow-in of solder 60 from one main-mount bond portion to the other main-mount bond portion, and thus occurrence of imbalance in the amounts of solder 60 between two main-mount bond portions 60a can be reduced. Therefore, it is possible to avoid inclination of sub-mount 40 bonded to main-mount 50 via solder 60 with respect to main-mount 50.

Hereinafter, the method of manufacturing light emitting device 100 and the detailed configuration of each component will be described.

[Sub-Mount Preparation Process]

For preparation of package 30, first, a predetermined conductive pattern was formed on the front surface and the back surface of sub-mount substrate 44, and a mounting substrate (sub-mount 40), in which the patterns are connected by via wiring 45, was prepared.

In this embodiment, fired AlN substrate having dimensions of 2.0 mm×1.6 mm×0.5 mm was used as sub-mount substrate 44, and a via hall was formed in sub-mount substrate 44, then conductive via wiring 45 was formed by filling the via with a conductive substance using such as a plating method.

On the front surface of sub-mount substrate 44, front surface electrode 43 composed of Au, which electrically connects planned position for bonding positive/negative electrodes of flip-chip light emitting element 41 to conductive via wiring 45, was formed.

On the back surface of sub-mount substrate 44, back surface electrodes 46p and 46n electrically connected to via wiring 45 were formed.

Via wiring 45 and back surface electrodes 46p and 46n may be formed by various publicly known methods, such as plating, screen printing, or ink-jet printing, for instance.

Next, a protection device was connected to sub-mount 40 by compressional heating using a metal bump by the flip-chip method (not illustrated). The protection device is a device for preventing an excessive voltage from being applied to light emitting element 41. In this embodiment, a zener diode (ZD) is connected in parallel to light emitting element 41 as the protection device. Although a zener diode is used as the protection device in this embodiment, the protection device is not limited to a zener diode. For instance, a diode, a variable resistor, a capacitor, or a resistor may be used as the protection device.

[LED Chip Mounting Process]

In this embodiment, a blue LED chip, in which a nitride compound semiconductor is formed on a GaN substrate, was used as light emitting element 41 to be mounted in sub-mount 40. Multiple metal bumps were placed on front surface electrode 43 of sub-mount 40, light emitting element 41 was placed with a growth substrate side up, and connection by compressional heating was made by the flip-chip method.

Here, light emitting element 41 includes a growth substrate and a semiconductor layer, and n-type electrode and p-type electrode are formed on the same side. The growth substrate has a function of holding the semiconductor layer. Also, the surface on the opposite side to the surface, in which a semiconductor layer of the growth substrate is stacked, serves as a light-emitting surface that emits light. Insulating sapphire, GaN, SiC, AlGaN, or AlN may be used as the material of the growth substrate.

The back surface (the top surface (the surface on the upper side in FIG. 1B) with sub-mount substrate 44 mounted) of the growth substrate is a rough surface having fine depressions and projections formed by etching processing, blast processing, or processing using a laser or a dicing blade. For this reason, the back surface of the growth substrate has a micro-texture structure, and the reflection of emission light is reduced on the back surface of the growth substrate. It is to be noted that when the growth substrate uses a base material, such as sapphire with a refractive index lower than the refractive index of GaN, the back surface may be a flat surface.

Although an example of using face-down flip-chip mounting has been presented as the method (mounting method) of connecting light emitting element 41 to sub-mount 40 in this embodiment, the method of connecting light emitting element 41 to sub-mount 40 is not limited to this. A face-up connection method for wire bonding the two electrodes of the front surface of light emitting element 41 to front surface electrode 43 of sub-mount 40 may be used.

[Main-Mount Preparation Process]

In this embodiment, insulation layer 52 was formed on main-mount substrate 53 composed of Al, and front surface metal pattern 70 illustrated in FIG. 3 was formed on insulation layer 52 with Cu. Here, front surface metal pattern 70 is formed by two wiring electrodes 71. Front surface metal pattern 70 may be formed by various publicly known methods, such as plating, screen printing, or ink-jet printing, for instance.

Cover resin 51 was disposed on front surface metal pattern 70 so as to surround electrode pad 70p region of front surface metal pattern 70 that faces back surface electrodes 46p and 46n of sub-mount 40. In other words, the region excluding the region of electrode pad 70p on insulation layer 52 was covered by cover resin 51, thereby avoiding flow-in of solder 60 to the outside of the region of electrode pad 70p and protecting front surface metal pattern 70. It is to be noted that in this embodiment, back surface electrodes 46p and 46n and electrode pad 70p were formed in substantially the same shape.

[Bonding Process by Solder]

Next, solder was formed on electrode pad 70p (wiring electrode 71 exposed through the opening of cover resin 51) of main-mount 50. In this embodiment, solder 60 was formed in each of four sub-mount bonding regions of electrode pad 70p. For instance, SnAgCu-based, SnAgBiIn-based, or Pb-based solder may be used as solder 60. Solder 60 was formed by the following method: cream solder was applied to electrode pad 70p using a metal mask having an opening corresponding to the region of solder 60 illustrated in top view (b) of FIG. 28, the metal mask was removed, and only the solder in a predetermined shape was left.

Subsequently, back surface electrodes 46p and 46n of sub-mount 40 were disposed so as to overlap with the region of solder 60 applied to electrode pad 70p of main-mount 50, and temporary bonding was performed by pressing. Subsequently, both main-mount 50 and sub-mount 40 were put in a reflow furnace and solder 60 was melted. Back surface electrodes 46p and 46n of sub-mount 40 and electrode pad 70p of main-mount 50 were electrically and mechanically connected together by melting solder 60. In other words, back surface electrodes 46p and 46n and main-mount bond portion 46a of sub-mount 40, and sub-mount bond portion 75a of wiring electrode 71 of main-mount 50 were bonded with solder 60.

When the amount of solder 60 was appropriate, as illustrated in sectional view (d1) and plan view (d2) of FIG. 28, solder 60 disposed in the two regions in electrode pad 70p did not merge. In other words, solder 60 stayed in sub-mount bond portion 75a of electrode pad 70p, and did not spread to second connection portion 75b. When the amount of solder 60 was slightly large, melted solder 60 spread from sub-mount bond portion 75a of electrode pad 70p to second connection portion 75b, merged together in electrode pad 70p, and resulted in the shape as illustrated in sectional view (e1) of FIG. 28, and plan view (e2) of FIG. 28. In either case, inclination of the sub-mount mounted in the light emitting element with respect to the main-mount was almost not observed.

Here, the thickness of solder 60 was 70 μm, and favorable solder bond characteristics were obtained when the thickness was at least 20 μm and at most 150 μm. When the thickness of solder 60 was less than 20 μm, poor contact was observed in some cases, and when the thickness was greater than 150 μm, overflow of solder 60 to the outside of the connection region, or inclination of sub-mount 40 was observed in some cases.

Also, in this embodiment, as illustrated in FIG. 3, front surface metal pattern 70 including two wiring electrodes 71 having first slits 110 and second slits 121 and 122 in addition to slits 80 for self-alignment was used. Thus, similarly to front surface metal pattern 37b of plan view (b) of FIG. 34, the effect of thermal strain on solder 60 bonded to electrode pad 70p is relieved. Furthermore, connection between electrode pad 70p and front surface metal pattern 70 outwardly of disposition region 70d is effective in reducing degradation of thermal resistance.

It is to be noted that in this embodiment, the width of each first slit 110, and each second slit 121 and 122 is approximately 0.3 mm. The distance between first slit 110 and second slit 121 and 122 is approximately 1.0 mm.

Here, the positional relationship between each slit and disposition region 70d will be described. The distance between first slit 110 and disposition region 70d is approximately 1.0 mm. The distances between second slits 121, 122 and disposition region 70d are both approximately 2.3 mm. Also, in the upper two first slits 110 out of four first slits 110 illustrated in FIG. 3, the length of an overlapping portion, which is the portion of disposition region 70d, positioned lower side from the upper end of disposition region 70d, is approximately 0.2 mm. Similarly, in the lower two first slits 110 out of four first slits 110 illustrated in FIG. 3, the length of an overlapping portion, which is the portion of disposition region 70d, positioned upper side from the lower end of disposition region 70d, is approximately 0.2 mm. Also, in the right two first slits 110 out of four first slits 110 illustrated in FIG. 3, the length of an overlapping portion, which is the portion of disposition region 70d, positioned left side from the right end of disposition region 70d, is approximately 0.2 mm. Similarly, in the left two first slits 110 out of four first slits 110 illustrated in FIG. 3, the length of an overlapping portion, which is the portion of disposition region 70d, positioned right side from the left end of disposition region 70d, is approximately 0.2 mm.

It is to be noted that the dimensions of the above-mentioned slits are an example. The width of first slit 110 and second slits 121 and 122 may be at least 0.1 mm and at most 0.5 mm, for instance. Also, the interval between first slit 110 and second slits 121, 122 may be at least 0.5 mm and at most 2 mm, for instance. The distance between first slit 110 and disposition region 70d may be, for instance, at least 0.5 mm and at most 1.5 mm, and the distance between second slits 121, 122, and disposition region 70d may be, for instance, at least 1.5 mm and at most 2.5 mm. The length of the overlapping portion is not limited to 0.2 mm, and for instance, may be at least 0.1 mm and at most 0.5 mm.

Although the dimensions of slit 80 for self-alignment illustrated in FIG. 3 is approximately 0.3 mm each, without being limited to this, slit 80 may be a rectangle with each side at least 0.2 mm and at most 1 mm. Although the distance between slit 80 and the inner end of wiring electrode 71 is approximately 0.3 mm, without being limited to this, the distance may be at least 0.1 mm and at most 0.5 mm.

Variations of Embodiment 1

Although front surface metal pattern 70 of main-mount 50 illustrated in FIG. 3 is used in this embodiment, a front surface metal pattern, in which front surface metal pattern 70 is different from the pattern of the slit for self-alignment, may be used.

Figure 4A:
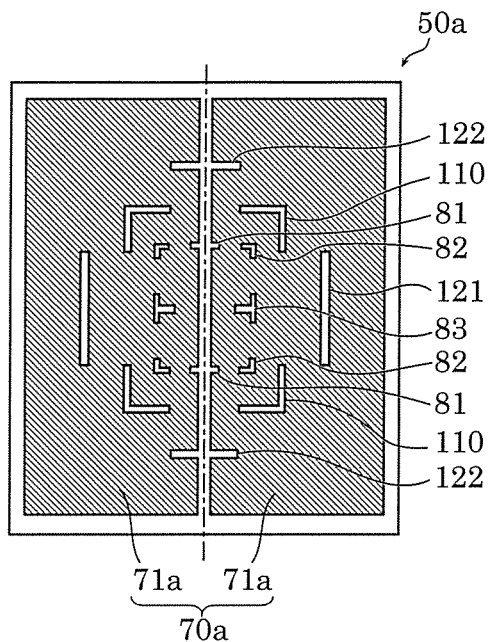
FIG. 4A is a top view illustrating a main-mount including a first another example of a front surface metal pattern according to Embodiment 1.
Figure 4B:
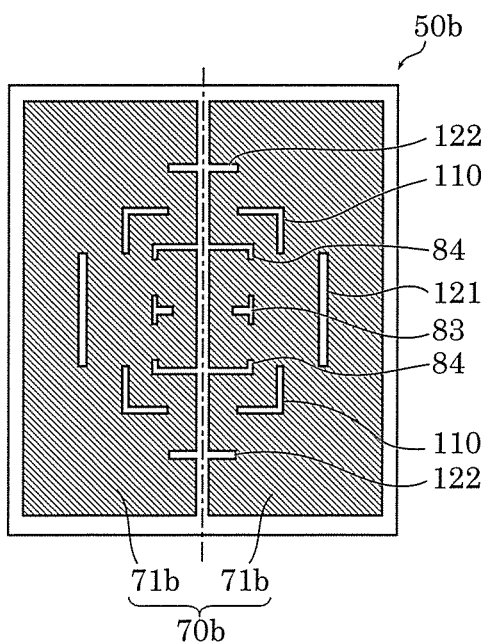
FIG. 4B is a top view illustrating a main-mount including a second another example of the front surface metal pattern according to Embodiment 1.
Figure 4C:
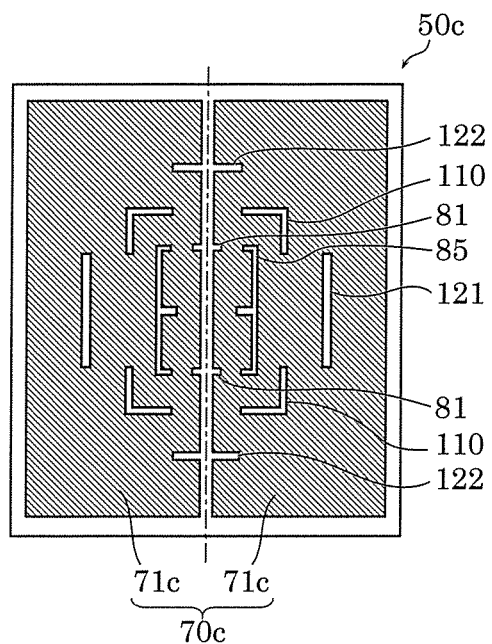
FIG. 4C is a top view illustrating a main-mount including a third another example of the front surface metal pattern according to Embodiment 1.

FIG. 4A to FIG. 4C are top views illustrating main-mounts 50a to 50c each including another example of a front surface metal pattern according to this embodiment. Main-mount 50a illustrated in FIG. 4A includes front surface metal pattern 70a having two wiring electrodes 71a. Main-mount 50b illustrated in FIG. 4B includes front surface metal pattern 70b having two wiring electrodes 71b. Main-mount 50c illustrated in FIG. 4C includes front surface metal pattern 70c having two wiring electrodes 71c.

Also, when front surface metal patterns 70a, 70b, and 70c illustrated in FIG. 4A, FIG. 4B, and FIG. 4C, respectively, are used, the same effect as when front surface metal pattern 70 is used was observed.

It is to be noted that the dimensions of each slit for self-alignment illustrated in FIG. 4A, FIG. 4B, and FIG. 4C may be determined as appropriate. For instance, although the width of slits 81, 82, and 83 for self-alignment illustrated in FIG. 4A is approximately 0.3 mm each, without being limited to this, the width may be at least 0.1 mm and at most 0.5 mm. Although the length (the length in the horizontal direction of FIG. 4A) in one wiring electrode 71a of slit 81 is approximately 0.1 mm, without being limited to this, the length may be at least 0.05 mm and at most 0.3 mm. Although the vertical and horizontal dimensions of slit 82 are both approximately 0.4 mm, without being limited to this, the dimensions may be at least 0.3 mm and at most 0.5 mm. Although the vertical and horizontal dimensions of slit 83 are approximately 0.7 mm and 0.6 mm, without being limited to this, the dimensions may be at least 0.5 mm and at most 0.8 mm, and at least 0.4 mm and at most 0.8 mm, respectively. Although the distance between slit 81 and slit 82 is approximately 0.4 mm, without being limited to this, the distance may be at least 0.2 mm and at most 0.6 mm. Although the distance between slit 82 and slit 83 is approximately 0.5 mm, without being limited to this, the distance may be or less 0.3 mm and at most 0.7 mm. Although the distance between slit 83 and the inner end of wiring electrode 71a is approximately 0.3 mm, without being limited to this, the distance may be or less 0.1 mm and at most 0.5 mm.

Also, slits 81, 82, and 83 are disposed at positions so as to substantially overlap with the end edge of the disposition region of sub-mount 40.

Embodiment 2

A light emitting device according to Embodiment 2 will be described. A light emitting device according to Embodiment 2 differs from light emitting device 100 according to Embodiment 1 mainly in that the back surface of the sub-mount includes a back surface heat dissipation pad in addition to the back surface electrode, and the main-mount includes a front surface heat dissipation pattern bonded to the back surface heat dissipation pad. Hereinafter, the light emitting device according to this embodiment will be described focused on points of difference from light emitting device 100 with reference to the drawings.

Figure 5A:
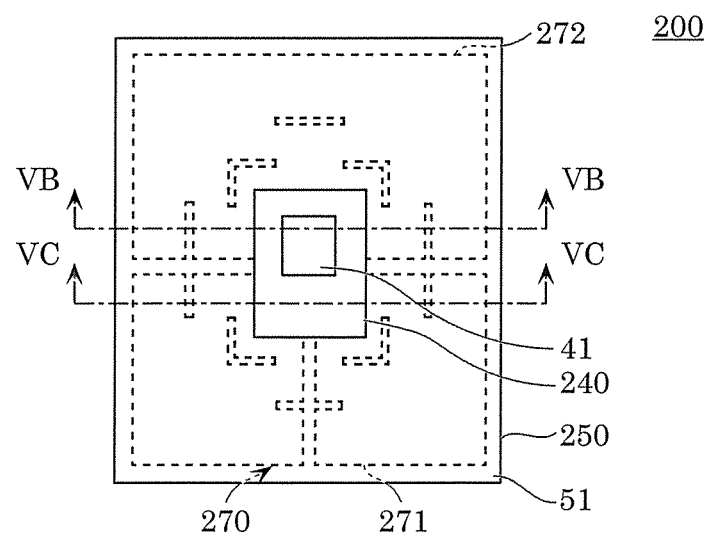
FIG. 5A is a top view illustrating the configuration of a light emitting device according to Embodiment 2.
Figure 5B:
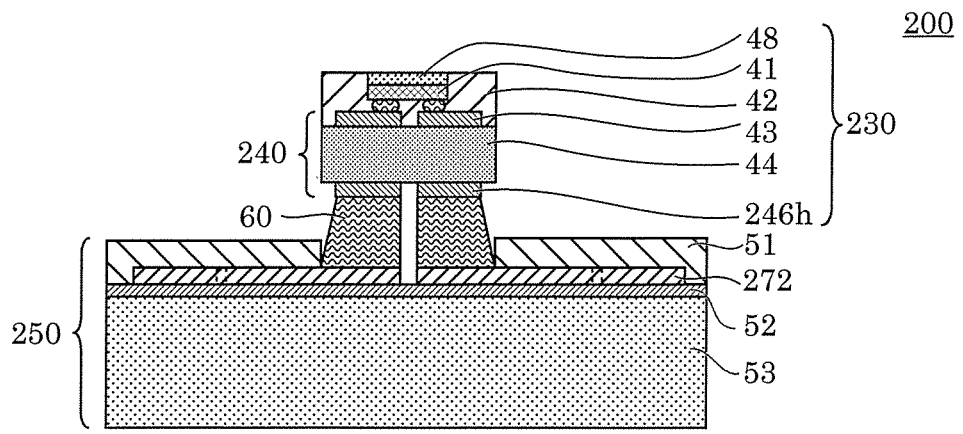
FIG. 5B is a sectional view illustrating the configuration of the light emitting device according to Embodiment 2.
Figure 5C:
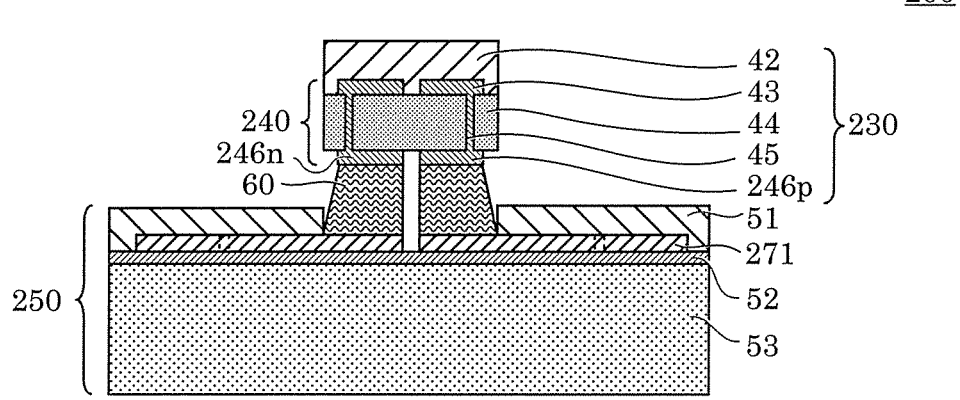
FIG. 5C is another sectional view illustrating the configuration of the light emitting device according to Embodiment 2.
Figure 6A:
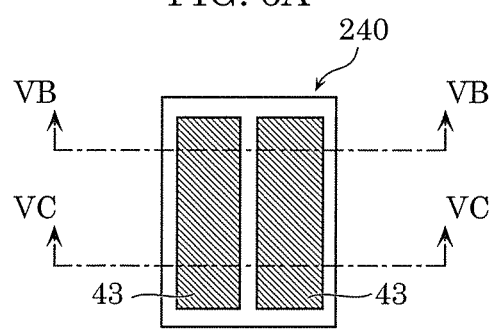
FIG. 6A is a top view illustrating the configuration of the front surface of a sub-mount of the light emitting device according to Embodiment 2.
Figure 6B:
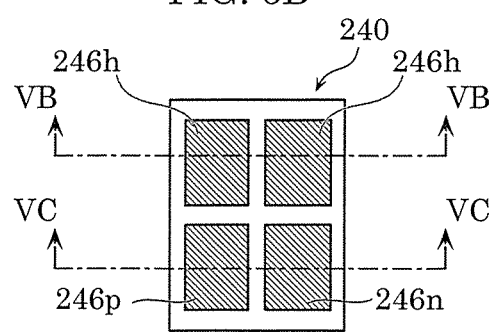
FIG. 6B is a bottom view illustrating the configuration of the back surface of the sub-mount of the light emitting device according to Embodiment 2.
Figure 7:
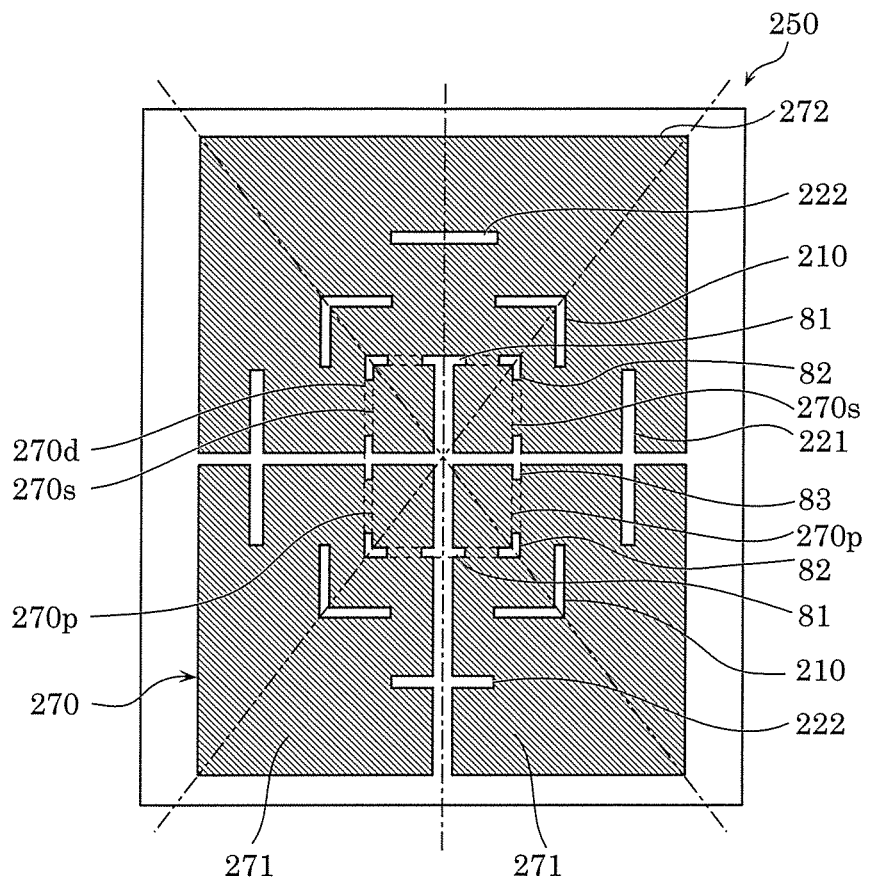
FIG. 7 is a top view of a main-mount of the light emitting device according to Embodiment 2.

FIG. 5A is a top view illustrating the configuration of light emitting device 200 according to this embodiment. It is to be noted that in FIG. 5A, the contour of surface metal pattern 270 including two wiring electrodes 271 and one front surface heat dissipation pattern 272 is illustrated by a dashed line for reference. FIG. 5B is a sectional view illustrating the configuration of light emitting device 200 according to this embodiment. In FIG. 5B, VB-VB section of FIG. 5A is illustrated. FIG. 5C is another sectional view illustrating the configuration of light emitting device 200 according to this embodiment. In FIG. 5C, VC-VC section of FIG. 5A is illustrated. FIG. 6A is a top view illustrating the configuration of the front surface of sub-mount 240 of light emitting device 200 according to this embodiment. FIG. 6B is a bottom view illustrating the configuration of the back surface of sub-mount 240 of light emitting device 200 according to this embodiment. FIG. 7 is a top view of main-mount 250 of light emitting device 200 according to this embodiment. In FIG. 7, in order to illustrate the configuration of front surface metal pattern 270, a top view of main-mount 250 with cover resin 51 removed is illustrated.

As illustrated in FIG. 5A, FIG. 5B, and FIG. 5C, light emitting device 200 according to this embodiment includes package 230 including sub-mount 240 in which light emitting element 41 is mounted, and main-mount 250.

As illustrated in FIG. 5C, package 230 includes light emitting element 41, sub-mount 240 in which light emitting element 41 is disposed on a front surface, fluorescent substance plate 48 that converts the wavelength of emission light from light emitting element 41, and lateral side reflective resin 42 provided around light emitting element 41 and fluorescent substance plate 48. Sub-mount 240 includes front surface electrode 43 disposed on the front surface of insulating sub-mount substrate 44, and back surface electrodes 246p and 246n electrically connected to surface electrode 43 through via wiring 45. In this embodiment, as illustrated in FIG. 5B and FIG. 6B, sub-mount 240 includes two back surface heat dissipation pads 246h disposed at positions opposed to back surface electrodes 246p and 246n disposed side by side. As illustrated in FIG. 5B, each back surface heat dissipation pad 246h is such that light emitting element 41 of sub-mount substrate 44 is disposed near the exact opposite side of the disposition position. Back surface heat dissipation pad 246h has no electrical connection to light emitting element 41, and has a function of dissipating the heat generated in light emitting element 41 to main-mount 250.

Back surface electrodes 246p and 246n of sub-mount 240 and two back surface heat dissipation pads 246h according to this embodiment have the shape as illustrated in FIG. 6B. That is, back surface electrodes 246p and 246n and two back surface heat dissipation pads 246h have the shape corresponding to electrode pad 270p illustrated in FIG. 7 and later-described front surface heat dissipation pad 270s.

Front surface metal pattern 270 illustrated in FIG. 7 is disposed above main-mount substrate 53 with insulation layer 52 interposed between front surface metal pattern 270 and main-mount substrate 53. Also, main-mount 250 includes cover resin 51 that is disposed above insulation layer 52, and covers part of front surface metal pattern 270. The portion to be insulated from other conductive members in front surface metal pattern 270 is covered by cover resin 51. Specifically, in cover resin 51, an opening is provided on the region of front surface metal pattern 270 connected to sub-mount 240, and electrode pad 270p and front surface heat dissipation pad 270s are exposed through the opening.

Electrode pads 270p are bonded to back surface electrodes 246p and 246n of sub-mount 240 via solder 60, and front surface heat dissipation pad 270s is bonded to back surface heat dissipation pads 246h of sub-mount 240 via solder. Also, front surface metal pattern 270 has disposition region 270d in which sub-mount 240 is disposed, in plan view.

Sub-mount 240 has via wiring 45 that penetrates through sub-mount substrate 44 and connects front surface electrodes 43 and back surface electrodes 246p and 246n. Light emitting element 41 is flip-chip bonded to front surface electrode 43 of sub-mount 240 via bumps. Fluorescent substance plate 48 is disposed on the upper surface of light emitting element 41. Also in this embodiment, similarly to Embodiment 1, blue light emitted from light emitting element 41, and yellow light which is wavelength-converted from the blue light by fluorescent substance plate 48 are mixed. Thus, white light is emitted from light emitting device 200. Lateral side reflective resin 42 is formed around light emitting element 41 and fluorescent substance plate 48. Lateral side reflective resin 42 reflects the light emitted from the lateral side of light emitting element 41 to light emitting element 41. That is, lateral side reflective resin 42 has a function of reflecting the light emitted from the lateral side of light emitting element 41 to light emitting element 41.

Hereinafter, the method of manufacturing light emitting device 200 and the detailed configuration of each component will be described.

[Sub-Mount Preparation]

For preparation of package 230, first, a predetermined conductive pattern was formed on the front surface and the back surface of sub-mount substrate 44, and a mounting substrate (sub-mount 240), in which the patterns are connected by via wiring 45, was prepared.

In this embodiment, firerd AlN substrate having dimensions of 2.0 mm×1.6 mm×0.5 mm was used as sub-mount substrate 44, and via holes were formed in sub-mount substrate 44, then conductive via wiring 45 was formed by filling the via with a conductive substance by such as a plating method.

In this embodiment, on the front surface of sub-mount substrate 44, front surface electrode 43 including a multi-layer film containing Au with a thickness of approximately 3 μm, which electrically connects planned positions for bonding positive/negative electrodes of flip-chip light emitting element 41 to conductive via wiring 45, was formed.

On the back surface of sub-mount substrate 44, back surface heat dissipation pads 246h, and back surface electrodes 246p and 246n electrically connected to via wiring 45 were formed.

Via wiring 45, back surface electrodes 246p and 246n, and back surface heat dissipation pads 246h may be formed by various publicly known methods, such as plating, screen printing, or ink-jet printing, for instance.

Next, a protection device was connected to sub-mount 240 by compressional heating using a metal bump by the flip-chip method (not illustrated). The protection device is a device for preventing an excessive voltage from being applied to light emitting element 41. Here, a ZD is connected in parallel to light emitting element 41 as the protection device. Although a ZD is used as the protection device in this embodiment, for instance, a diode, a variable resistor, a capacitor, or a resistor may be used as the protection device.

[LED Chip Mounting Process]

In this embodiment, a blue LED chip, in which a nitride compound semiconductor is formed on a GaN substrate, was used as light emitting element 41 to be mounted in sub-mount 240. Multiple metal bumps were placed on front surface electrode 43 of sub-mount 240, light emitting element 41 was placed with the growth substrate side up, and connection by compressional heating was made by the flip-chip method.

Although the same light emitting element used in Embodiment 1 is used as light emitting element 41, and an example of using face-down flip-chip mounting has been presented for connection to sub-mount substrate 44, the method of connecting light emitting element 41 to sub-mount 240 is not limited to this. A face-up connection method for wire bonding the two electrodes of the front surface of light emitting element 41 to front surface electrode 43 of sub-mount 240 may be used.

[Main-Mount Preparation Process]

In this embodiment, insulation layer 52 was formed on main-mount substrate 53 including an Al substrate having vertical and horizontal dimensions of 20 mm×20 mm, and a thickness of 1 mm, and front surface metal pattern 270 illustrated in FIG. 7 was formed on insulation layer 52 using Cu with a thickness of 35 μm. Although the film thickness of Cu is 35 μm here, the thickness may be in a range of 20 μm or greater and 100 μm or less. Here, front surface metal pattern 270 is formed by two adjacent wiring electrodes 271 and one front surface heat dissipation pattern 272 opposed to two wiring electrodes 271. Front surface metal pattern 270 may be formed by various publicly known methods, such as plating, screen printing, or ink-jet printing, for instance.

As illustrated in FIG. 7, similarly to front surface metal pattern 70 according to Embodiment 1, front surface metal pattern 270 has first slits 210 and second slits 221 and 222. Front surface metal pattern 270 according to this embodiment has the same configuration as in front surface metal pattern 17b illustrated in plan view (b) of FIG. 31.

Cover resin 51 was disposed on front surface metal pattern 270 so as to surround back surface electrodes 246p and 246n of sub-mount 240, and the region of electrode pad 270p and the region of front surface heat dissipation pad 270s that face back surface heat dissipation pads 246h on wiring electrode 271. In other words, the region on insulation layer 52, excluding the region of electrode pad 270p and the region of front surface heat dissipation pad 270s was covered by cover resin 51, thereby avoiding flow-in of solder 60 to the outside of the region of electrode pad 270p and front surface heat dissipation pad 270s and protecting front surface metal pattern 270. In this embodiment, back surface electrodes 246p and 246n and back surface heat dissipation pad 246h were respectively formed in substantially the same shape as two electrode pads 270p and front surface heat dissipation pad 270s.

Next, solder 60 was formed on electrode pad 270p of main-mount 250 (wiring electrode 271 exposed through the opening of cover resin 51), and on front surface heat dissipation pad 270s (front surface heat dissipation pattern 272 exposed through the opening of cover resin 51). Solder 60 was formed by the following method: cream solder is applied to electrode pad 270p using a metal mask having an opening corresponding to the region of solder 60 illustrated in top view (b) of FIG. 28, the metal mask was removed, and only a predetermined shape was left.

Subsequently, back surface electrodes 246p and 246n, and back surface heat dissipation pad 246h of sub-mount 240 was disposed so as to overlap with the region of solder 60 applied to electrode pad 270p of main-mount 250, and temporary bonding was performed by pressing. Subsequently, both main-mount 50 and sub-mount 40 were put in a reflow furnace and solder 60 was melted.

For completed light emitting device 200, a thermal cycling test of repeating the temperature change from −40° C. to 125° C. for 1000 cycles was conducted. The result of the test will be described with reference to the drawings.

Figure 8A:
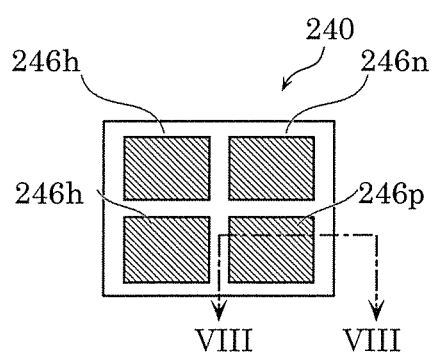
FIG. 8A is a view illustrating the back surface side of the sub-mount of the light emitting device according to Embodiment 2.
Figure 8B:
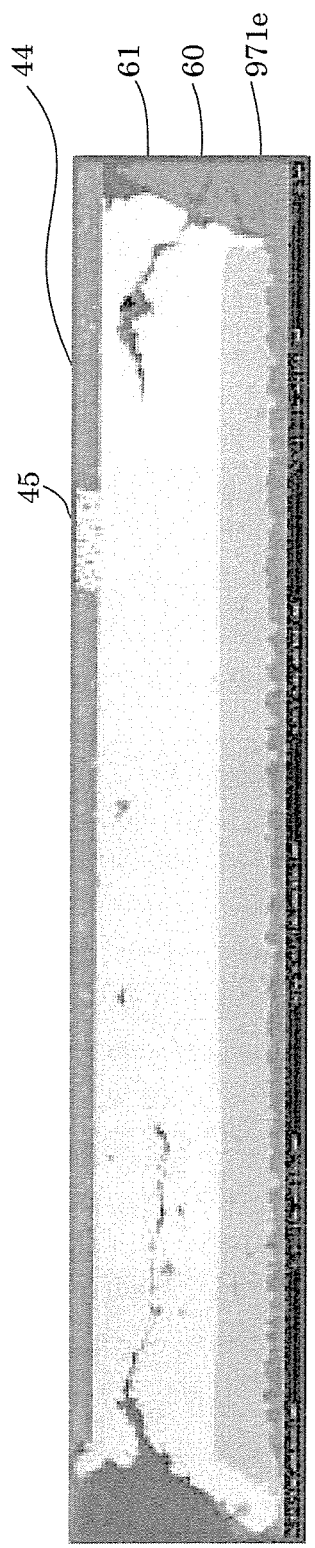
FIG. 8B illustrates a sectional SEM image of solder and its peripheral region, after a thermal cycling test of a light emitting device in related art.
Figure 8C:
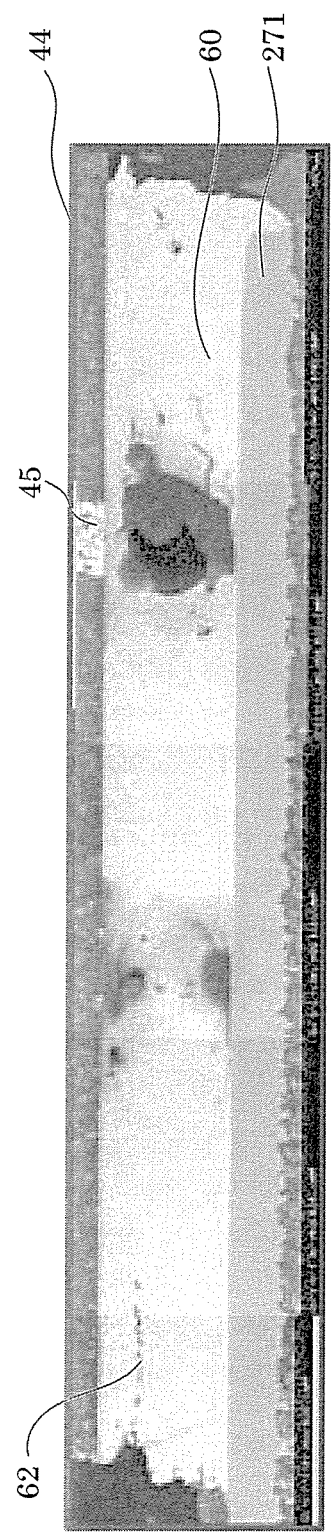
FIG. 8C illustrates a sectional SEM image of solder and its peripheral region, after a thermal cycling test of a light emitting device in Embodiment 2.

FIG. 8A is a view illustrating the back surface side of sub-mount 240 of light emitting device 200 according to this embodiment. FIG. 8B and FIG. 8C illustrate a sectional SEM image of solder 60 and its peripheral region, after a thermal cycling test of a light emitting device in related art and light emitting device 200, respectively in this embodiment. FIG. 8B and FIG. 8C illustrate VIII-VIII section of FIG. 8A. A light emitting device having the same configuration as in light emitting device 200 according to the embodiment was used as the light emitting device in related art except that first slits 210 and second slits 221 and 222 illustrated in FIG. 7 are not formed.

As illustrated in FIG. 8B, in a light emitting device in related art, crack 61 is formed along the length of approximately 50% of the entire region of solder 60 in a direction (horizontal direction of FIG. 8B) parallel to the upper surface of the wiring electrode in FIG. 8B, and resistance change (resistance increase) of approximately 200 mΩ has occurred in solder 60 portion. In contrast, in light emitting device 200 according to this embodiment, as illustrated in FIG. 8C, crack 62 with at most approximately 20% of the entire region of solder 60 was formed, and resistance change (resistance increase) in solder 60 portion was damped within approximately 20 mΩ.

It is to be noted that the discontinued portion in the dark sub-mount on the upper side in FIG. 8B and FIG. 8C is via wiring 45. The black portion seen on the right of solder 60 portion of FIG. 8C is noise captured in SEM image, and does not indicate quality degradation of solder 60, such as a crack.

Variations of Embodiment 2

Although front surface metal pattern 270 of main-mount 250 illustrated in FIG. 7 is used in this embodiment, a front surface metal pattern different from front surface metal pattern 270 in the pattern of slit for self-alignment may be used.

Figure 9A:
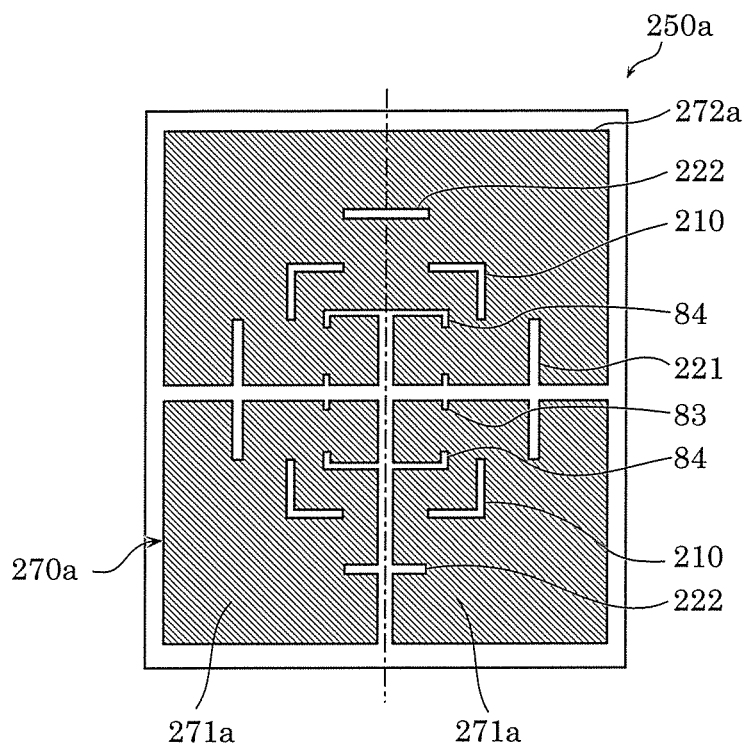
FIG. 9A is a top view illustrating a main-mount including another example of a front surface metal pattern according to Embodiment 2.
Figure 9B:
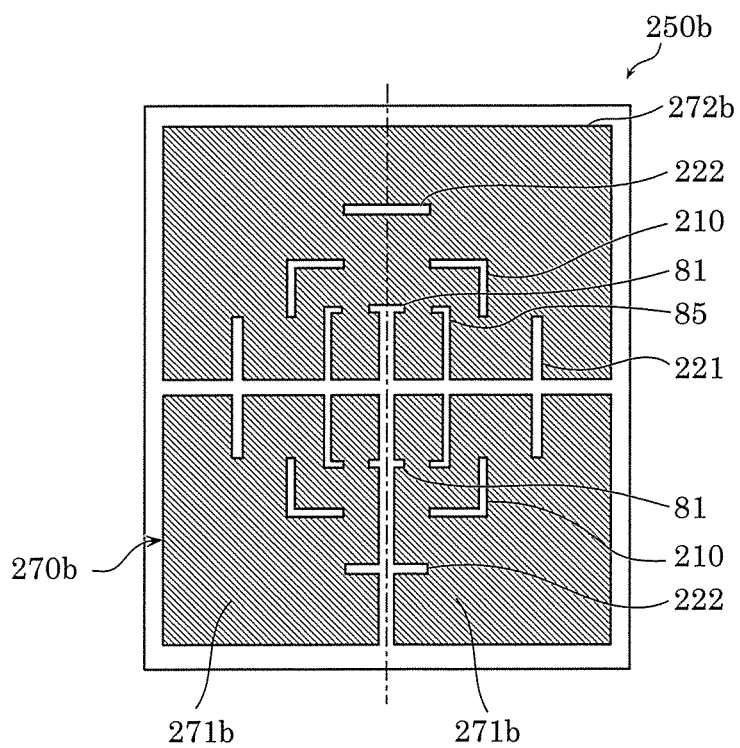
FIG. 9B is a top view illustrating a main-mount including another example of a front surface metal pattern according to Embodiment 2.

FIG. 9A and FIG. 9B are top views respectively illustrating main-mounts 250*a* and 250*b* including another example of a front surface metal pattern according to this embodiment. Main-mount 250*a* illustrated in FIG. 9A includes front surface metal pattern 270*a* having two wiring electrodes 271*a* and one front surface heat dissipation pattern 272*a*. Main-mount 250*b* illustrated in FIG. 9B includes front surface metal pattern 270*b* having two wiring electrodes 271*b* and one front surface heat dissipation pattern 272*b*.

When front surface metal patterns 270*a* and 270*b* illustrated in FIG. 9A and FIG. 9B, respectively, are used, the same effect as when front surface metal pattern 270 is used was observed.

Embodiment 3

A light emitting device according to Embodiment 3 will be described. A light emitting device according to this embodiment differs from light emitting device 200 according to Embodiment 2 mainly in that the shape and disposition of the back surface electrode and the back surface heat dissipation pad of the sub-mount, and the shape and disposition of the wiring electrode and the front surface heat dissipation pad in the front-surface metal pattern of the main-mount. Hereinafter, the light emitting device according to this embodiment will be described focused on points of difference from light emitting device 200 with reference to the drawings.

Figure 10A:
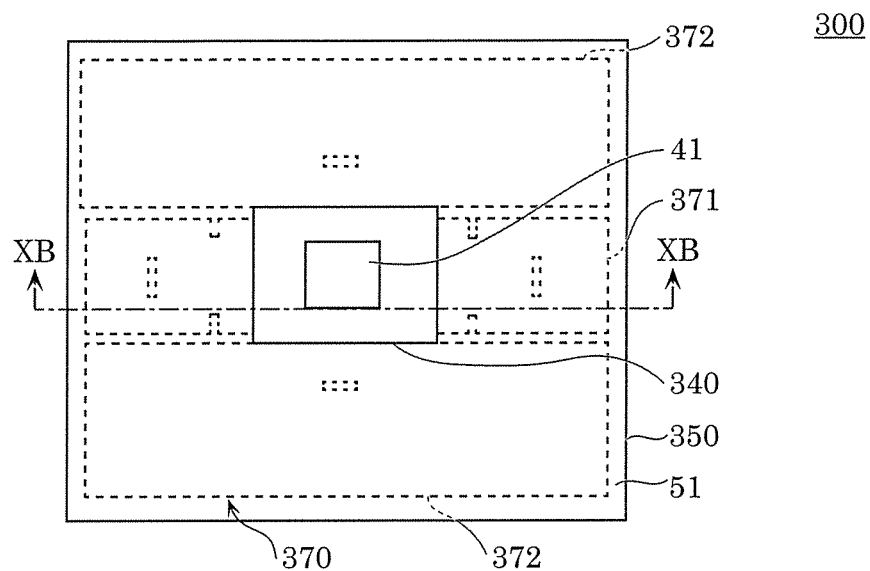
FIG. 10A is a top view illustrating the configuration of a light emitting device according to Embodiment 3.
Figure 10B:
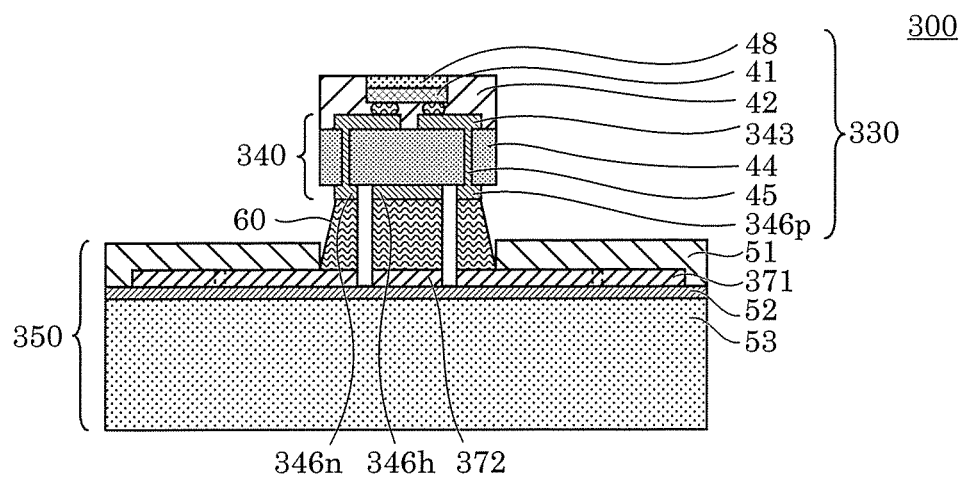
FIG. 10B is a sectional view illustrating the configuration of the light emitting device according to Embodiment 3.
Figure 11A:
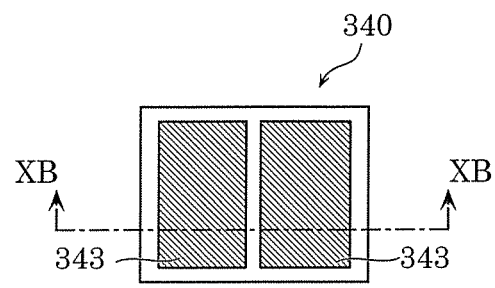
FIG. 11A is a top view illustrating the configuration of the front surface of a sub-mount in the light emitting device according to Embodiment 3.
Figure 11B:
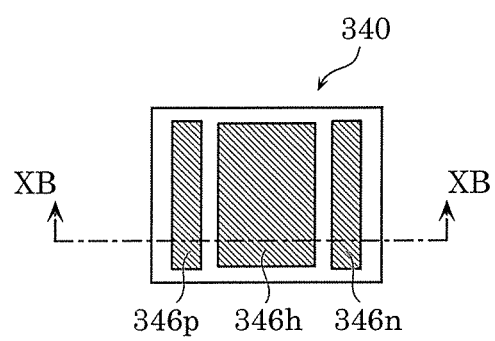
FIG. 11B is a bottom view illustrating the configuration of the back surface of the sub-mount in the light emitting device according to Embodiment 3.
Figure 12:
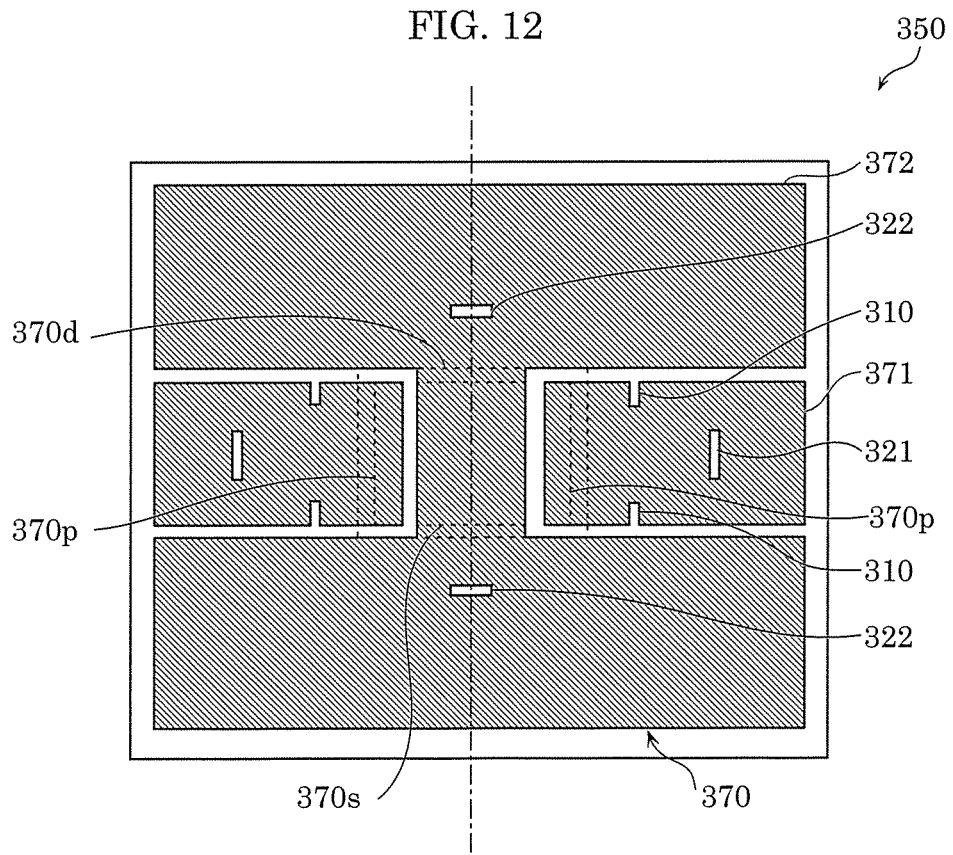
FIG. 12 is a top view of a main-mount of the light emitting device according to Embodiment 3.

FIG. 10A is a top view illustrating the configuration of light emitting device 300 according to this embodiment. It is to be noted that in FIG. 10A, the contour of surface metal pattern 370 including two wiring electrodes 371 and one front surface heat dissipation pattern 372 is illustrated by a dashed line for reference. FIG. 10B is a sectional view illustrating the configuration of light emitting device 300 according to this embodiment. In FIG. 10B, XB-XB section of FIG. 10A is illustrated. FIG. 11A is a top view illustrating the configuration of the front surface of sub-mount 340 in light emitting device 300 according to this embodiment. FIG. 11B is a bottom view illustrating the configuration of the back surface of sub-mount 340 in light emitting device 300 according to this embodiment. FIG. 12 is a top view of main-mount 350 of light emitting device 300 according to this embodiment. In FIG. 12, in order to illustrate the configuration of front surface metal pattern 370, a top view of main-mount 350 with cover resin 51 removed is illustrated.

In this embodiment, as illustrated in FIG. 10B, sub-mount 340 includes front surface electrode 343 disposed on the front surface of insulating sub-mount substrate 44, back surface electrodes 346*p* and 346*n* electrically connected to front surface electrode 343 through via wiring 45, and back surface heat dissipation pad 346*h*. As illustrated in FIG. 11B, back surface heat dissipation pad 346*h* is present in the middle of the back surface of sub-mount 340, and back surface electrodes 346*p* and 346*n* are present on both sides of back surface heat dissipation pad 346*h* so as to sandwich back surface heat dissipation pad 346*h*.

As illustrated in FIG. 10B, light emitting device 300 includes package 330 including sub-mount 340, and main-mount 350. Front surface metal pattern 370 (that is, wiring electrode 371 and front surface heat dissipation pattern) illustrated in FIG. 12 is disposed above main-mount substrate 53 with insulation layer 52 interposed between front surface metal pattern 370 and main-mount substrate 53. Also, main-mount 350 includes cover resin 51 that is disposed above insulation layer 52, and covers part of front surface metal pattern 370. The portion to be insulated from other conductive members in front surface metal pattern 370 is covered by cover resin 51. Specifically, in cover resin 51, an opening is provided on the region of front surface metal pattern 370 connected to sub-mount 340, and electrode pad 370*p* and front surface heat dissipation pad 370*s* are exposed through the opening.

Electrode pad 370*p* is bonded to back surface electrodes 346*p* and 346*n* of sub-mount 340 via solder 60, and front surface heat dissipation pad 370*s* is bonded to back surface heat dissipation pad 346*h* of sub-mount 340 via solder 60. The configuration of sub-mount 340 excluding back surface electrodes 346*p* and 346*n*, and back surface heat dissipation pad 346*h* is the same as the configuration of Embodiment 2.

[Main-Mount Preparation Process]

In this embodiment, main-mount 350 is formed similarly to main-mount 250 according to Embodiment 2 except for the shape of front surface metal pattern 370, and main-mount 250 is bonded to sub-mount 340 via solder 60.

As illustrated in FIG. 12, front surface metal pattern 370 has first slits 310 and second slits 321 and 322. Front surface metal pattern 370 according to this embodiment has the same configuration as in front surface metal pattern 27*b* illustrated in plan view (f) of FIG. 33.

In light emitting device 300 according to this embodiment, as a result of conducting the thermal cycling test in the same manner as in Embodiment 2, occurrence of a crack in solder 60 is reduced in Embodiment 3 as compared with the light emitting device in related art.

In this embodiment, the width of first slits 310 and second slits 321 and 322 are approximately 0.3 mm.

The positional relationship between each slit and disposition region 370*d* will be described. The distance between first slit 310 and disposition region 370*d* is approximately 1.0 mm. The distance between second slit 121 and disposition region 370d is approximately 2.3 mm. The distance between second slit 122 and disposition region 370d is approximately 1.0 mm.

It is to be noted that the dimensions of the above-mentioned slits are an example. The width of first slit 310 and second slits 321 and 322 may be, for instance, at least 0.1 mm and at most 0.5 mm. Also, the distance between first slit 310 and disposition region 370d may be, for instance, at least 0.5 mm and at most 1.5 mm, the distance between second slit 321 and disposition region 370d may be, for instance, at least 1.5 mm and at most 2.5 mm, and the distance between second slit 323 and disposition region 370d may be, for instance, at least 0.5 mm and at most 1.5 mm.

The gap between wiring electrode 371 and front surface heat dissipation pattern 372 illustrated in FIG. 12 serves as a slit for self-alignment. Although the width of the gap is approximately 0.3 mm in this embodiment, without being limited to this, the width may be, for instance, at least 0.1 mm and at most 0.5 mm. Although the width (dimension in the horizontal direction of FIG. 12) of electrode pad 370p is approximately 0.3 mm, without being limited to this, the width may be, for instance, at least 0.1 mm and at most 0.5 mm.

Variations of Embodiment 3

The configuration of the sub-mount and the main-mount according to this embodiment is not limited to the configuration illustrated in FIG. 10A to FIG. 12. For instance, sub-mount 340a as illustrated in FIG. 13A and FIG. 13B, and main-mount 350a as illustrated in FIG. 14 may be used.

Figure 13A:
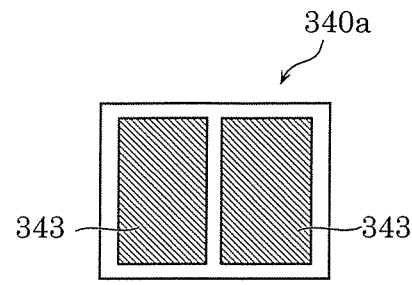
FIG. 13A is a top view illustrating the configuration of the surface of the sub-mount of the light emitting device according to Embodiment 3.

FIG. 13A is a top view illustrating the configuration of the surface of sub-mount 340a of the light emitting device according to this embodiment. FIG. 13B is a bottom view illustrating the configuration of the back surface of sub-mount 340a of the light emitting device according to this embodiment. FIG. 14 is a top view of main-mount 350a of the light emitting device according to this embodiment. In FIG. 14, in order to illustrate the configuration of front surface metal pattern 370a, a top view of main-mount 350 with cover resin 51 removed is illustrated.

Figure 13B:
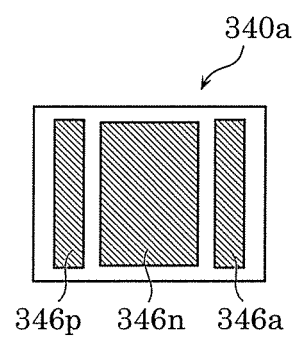
FIG. 13B is a bottom view illustrating the configuration of the back surface of the sub-mount of the light emitting device according to Embodiment 3.

In sub-mount 340a illustrated in FIG. 13A and FIG. 13B, back surface electrode 346n disposed in the middle also serves as a back surface heat dissipation pad. Also, as illustrated in FIG. 13B, sub-mount 340a includes back surface alignment pad 346a on the back surface. In the example illustrated in FIG. 13B, back surface electrode 346p and back surface alignment pad 346a are disposed on both sides of back surface electrode 346n. Back surface electrodes 346p and 346n are connected by front surface electrode 343 and via wiring.

Figure 14:
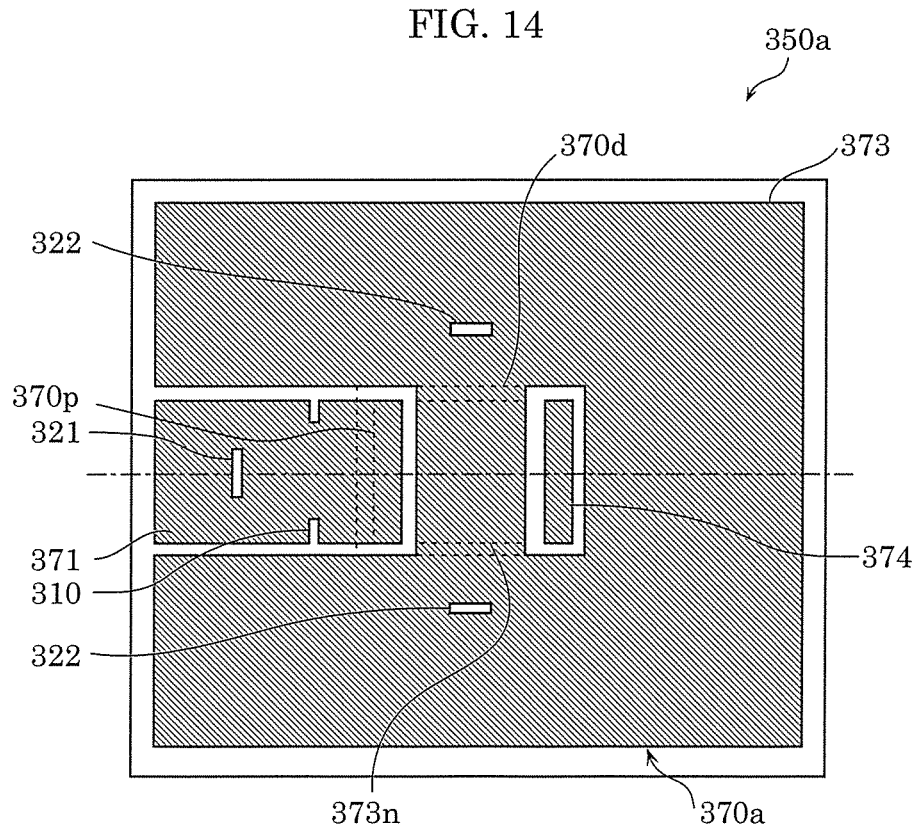
FIG. 14 is a top view of the main-mount of the light emitting device according to Embodiment 3.

Front surface metal pattern 370a illustrated in FIG. 14 includes wiring electrodes 371 and 373, and front surface alignment pad 374. Wiring electrode 373 serves as a wiring used for power supply to light emitting element 41, and also serves as a front surface heat dissipation pattern. Front surface alignment pad 374 is a pad for alignment disposed at a position corresponding to back surface alignment pad 346a of sub-mount 340a. With the configuration described above, electrode pads 370p and 373n respectively corresponding to back surface electrodes 346p and 346n are formed in front surface metal pattern 370a.

Also when back surface electrode 346n, which is a pattern using both back surface heat dissipation pads and back surface electrode illustrated in FIG. 13A and FIG. 13B, is used, similarly to light emitting device 300 illustrated in FIG. 10A to FIG. 12, the effect of reducing crack in solder 60 was observed by using front surface metal pattern 370a of main-mount 350a illustrated in FIG. 14.

Embodiment 4

A light emitting device according to Embodiment 4 will be described. The light emitting device according to this embodiment differs from light emitting device 100 according to Embodiment 1 mainly in the configuration of first slits and second slits of the front surface metal pattern. Hereinafter, the light emitting device according to this embodiment will be described focused on points of difference from light emitting device 100 with reference to the drawings.

Figure 15A:
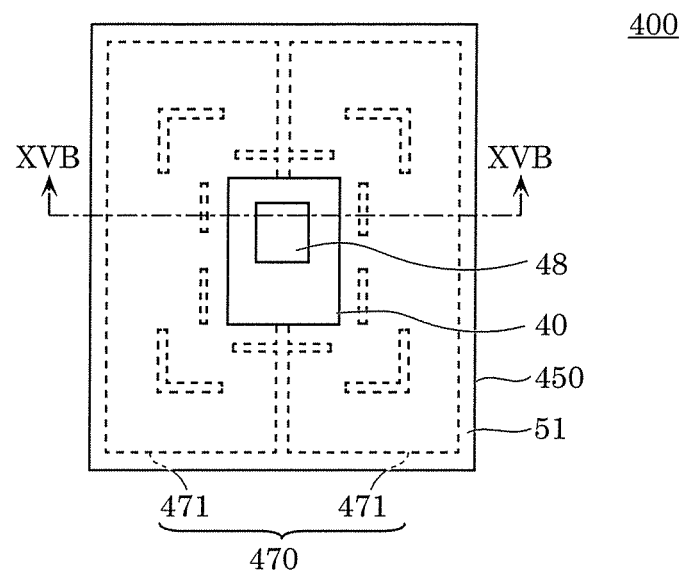
FIG. 15A is a top view illustrating the configuration of a light emitting device according to Embodiment 4.
Figure 15B:
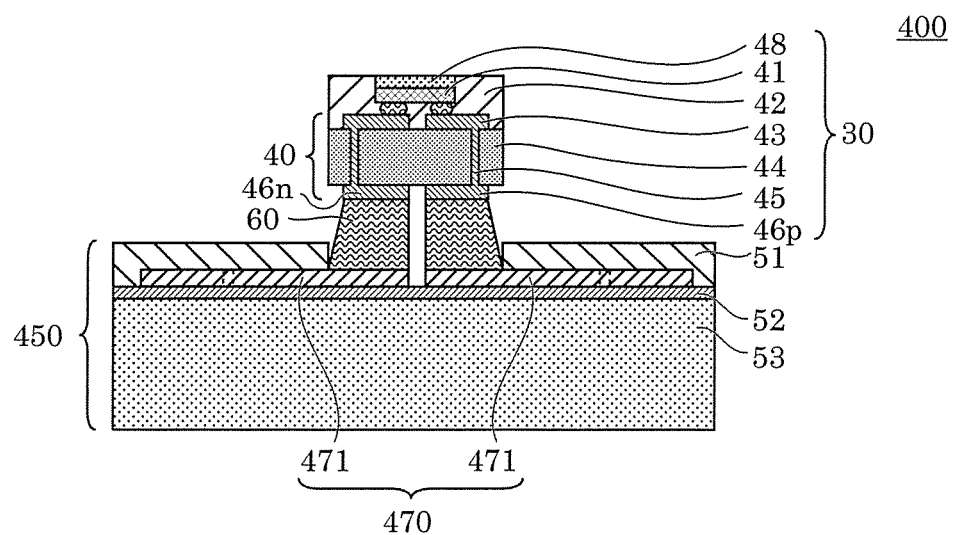
FIG. 15B is a sectional view illustrating the configuration of the light emitting device according to Embodiment 4.
Figure 16A:
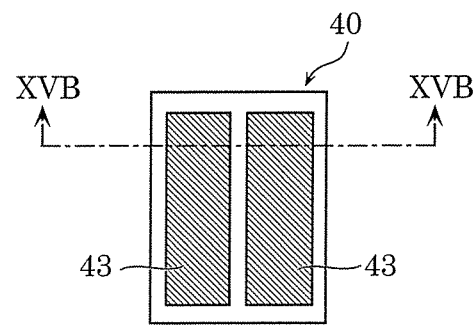
FIG. 16A is a top view illustrating the configuration of the front surface of a sub-mount in the light emitting device according to Embodiment 4.
Figure 16B:
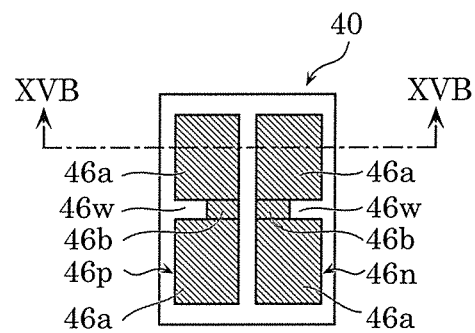
FIG. 16B is a bottom view illustrating the configuration of the back surface of the sub-mount in the light emitting device according to Embodiment 4.
Figure 17:
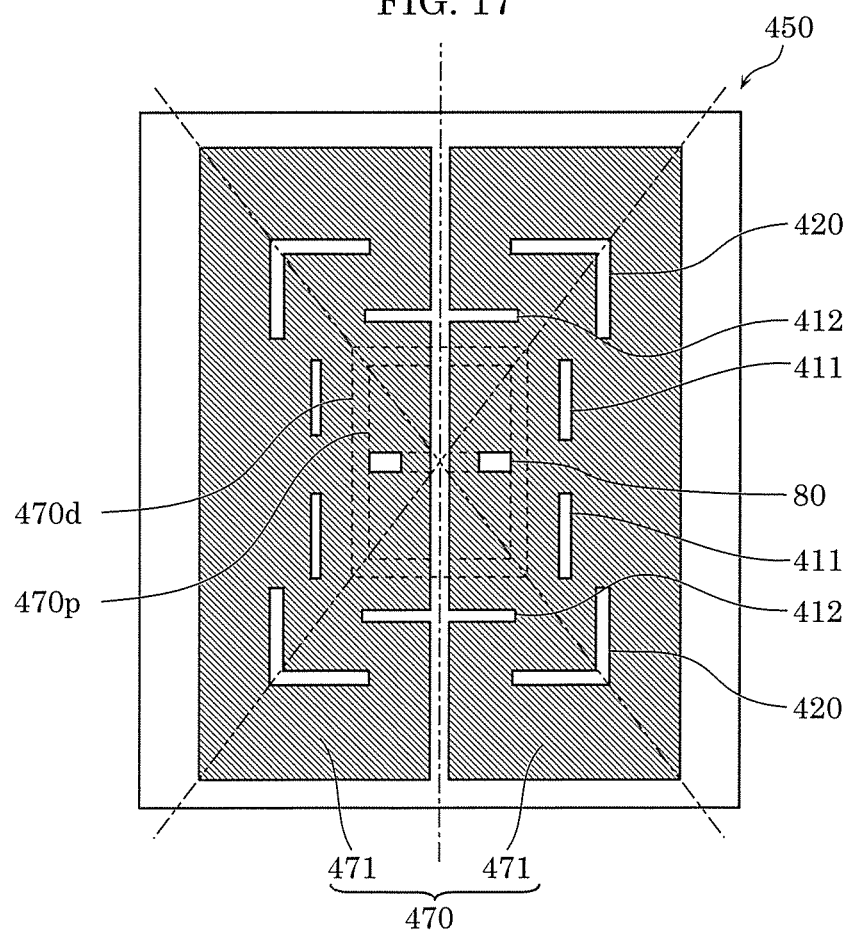
FIG. 17 is a top view of a main-mount of the light emitting device according to Embodiment 4.

FIG. 15A is a top view illustrating the configuration of light emitting device 400 according to this embodiment. It is to be noted that in FIG. 15A, the contour of surface metal pattern 470 including two wiring electrodes 471 is illustrated by a dashed line for reference. FIG. 15B is a sectional view illustrating the configuration of light emitting device 400 according to this embodiment. In FIG. 15B, XVB-XVB section of FIG. 15A is illustrated. FIG. 16A is a top view illustrating the configuration of the front surface of sub-mount 40 in light emitting device 400 according to this embodiment. FIG. 16B is a bottom view illustrating the configuration of the back surface of sub-mount 40 in light emitting device 400 according to this embodiment. FIG. 17 is a top view of main-mount 450 of light emitting device 400 according to this embodiment. In FIG. 17, in order to illustrate the configuration of front surface metal pattern 470, a top view of main-mount 450 with cover resin 51 removed is illustrated.

As illustrated in FIG. 16A and FIG. 16B, sub-mount 40 according to this embodiment has the same configuration as in sub-mount 40 according to Embodiment 1. Also, package 30 according to this embodiment also has the same configuration as in package 30 according to Embodiment 1.

As illustrated in FIG. 15B, front surface metal pattern 470 illustrated in FIG. 17 is disposed above main-mount substrate 53 with insulation layer 52 interposed between front surface metal pattern 470 and main-mount substrate 53. Also, main-mount 450 includes cover resin 51 that is disposed above insulation layer 52, and covers part of front surface metal pattern 470. The portion to be insulated from other conductive members in front surface metal pattern 470 is covered by cover resin 51. Specifically, in cover resin 51, an opening is provided on the region of front surface metal pattern 470 connected to sub-mount 40, and electrode pad 470p is exposed through the opening.

Electrode pad 470p is bonded to back surface electrodes 46p and 46n of sub-mount 40 via solder 60.

[Main-Mount Preparation Process]

Main-mount 450 is formed similarly to the main-mount according to Embodiment 1 except for the shape of front surface metal pattern 470, and main-mount 450 is bonded to sub-mount 40 via solder 60.

As illustrated in FIG. 17, front surface metal pattern 470 formed by two wiring electrodes 471 has first slits 411, 412, and second slits 420. Front surface metal pattern 470 according to this embodiment has the same configuration as in front surface metal pattern 37d illustrated in plan view (d) of FIG. 34. Furthermore, two first slits 411 illustrated in FIG. 17 are arranged in the longitudinal direction. Thus, a portion, at which disposition region 470d and the region outwardly of front surface metal pattern 470 are connected, can be formed between arranged two first slits 411, degradation of thermal resistance in the front surface metal pattern can be further reduced.

As a result of conducting the thermal cycling test in the same manner as in Embodiment 1, occurrence of a crack in solder 60 is reduced in light emitting device 400 according to Embodiment 4, as compared with the light emitting device in related art.

In this embodiment, the width of first slits 411, 412, and second slits 420 is approximately 0.3 mm. The distance between first slits 411, 412 and second slits 420 is approximately 1.0 mm.

Also, the positional relationship between each slit and disposition region 470*d* will be described. The distance between first slit 411 and disposition region 470*d* is approximately 1.0 mm. Also, the distance between first slit 412 and disposition region 470*d* is approximately 1.0 mm. Also, the distance between second slit 420 and disposition region 470*d* is approximately 2.3 mm.

It is to be noted that the dimensions of the above-mentioned slits are an example. The width of first slits 411, 412, and second slit 420 may be, for instance, at least 0.1 mm and at most 0.5 mm. Also, the distance between first slits 411, 412, and disposition region 470*d* may be, for instance, at least 0.5 mm at most 1.5 mm, and the distance between second slit 420 and disposition region 470*d* may be, for instance, at least 1.5 mm and at most 2.5 mm.

Variations of Embodiment 4

Although front surface metal pattern 470 of main-mount 450 illustrated in FIG. 17 is used in this embodiment, a front surface metal pattern different from front surface metal pattern 470 in the pattern of slit for self-alignment may be used.

Figure 18A:
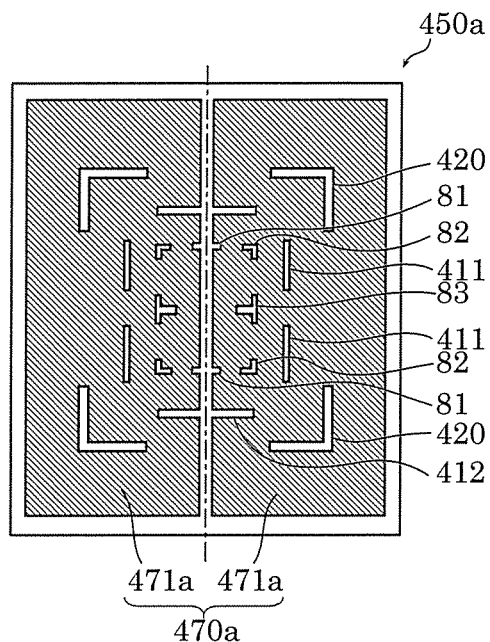
FIG. 18A is a top view illustrating a main-mount including another example of a front surface metal pattern according to Embodiment 4.
Figure 18B:
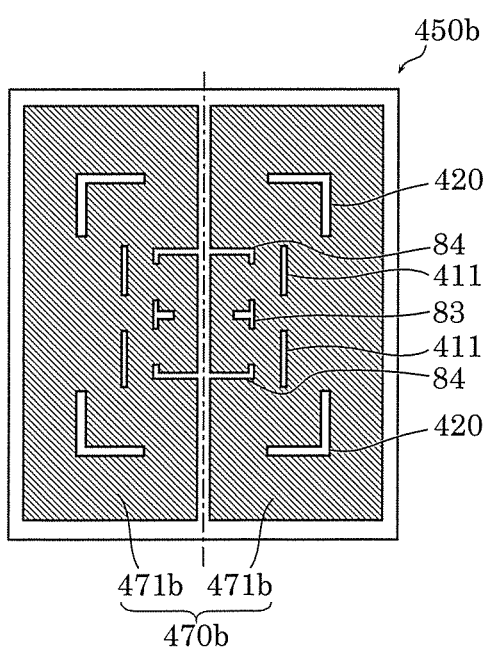
FIG. 18B is a top view illustrating a main-mount including another example of the front surface metal pattern according to Embodiment 4.
Figure 18C:
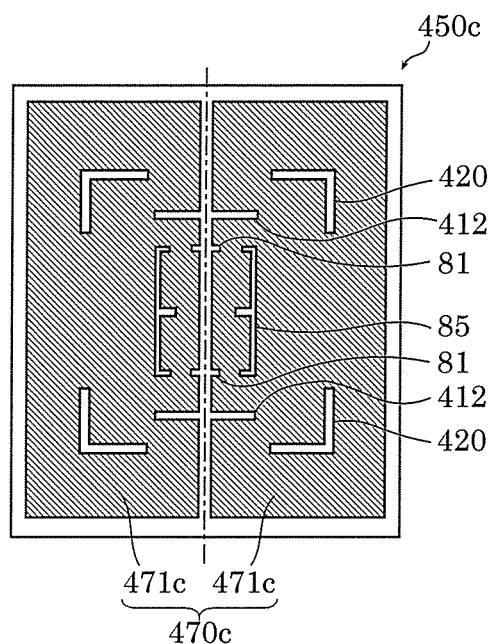
FIG. 18C is a top view illustrating a main-mount including another example of the front surface metal pattern according to Embodiment 4.

FIG. 18A, FIG. 18B, and FIG. 18C are top views respectively illustrating main-mounts 450*a*, 450*b*, and 450*c* each including another example of a front surface metal pattern according to this embodiment. Main-mount 450*a* illustrated in FIG. 18A includes front surface metal pattern 470*a* formed by two wiring electrodes 471*a* having slits 81 to 83 for self-alignment. Main-mount 450*b* illustrated in FIG. 18B includes front surface metal pattern 470*b* formed by two wiring electrodes 471*b* having slits 83 and 84 for self-alignment. Main-mount 450*c* illustrated in FIG. 18C includes front surface metal pattern 470*c* formed by two wiring electrodes 471*c* having slits 81 and 85 for self-alignment.

When front surface metal patterns 470*a*, 470*b*, and 470*c* illustrated in FIG. 18A, FIG. 18B, and FIG. 18C, respectively, are used, the same effect as when front surface metal pattern 470 is used was observed.

Embodiment 5

A light emitting device according to Embodiment 5 will be described. The light emitting device according to this embodiment differs from light emitting device 200 according to Embodiment 2 mainly in the configuration of first slits and second slits of the front surface metal pattern. Hereinafter, the light emitting device according to this embodiment will be described focused on points of difference from light emitting device 200 with reference to the drawings.

Figure 19A:
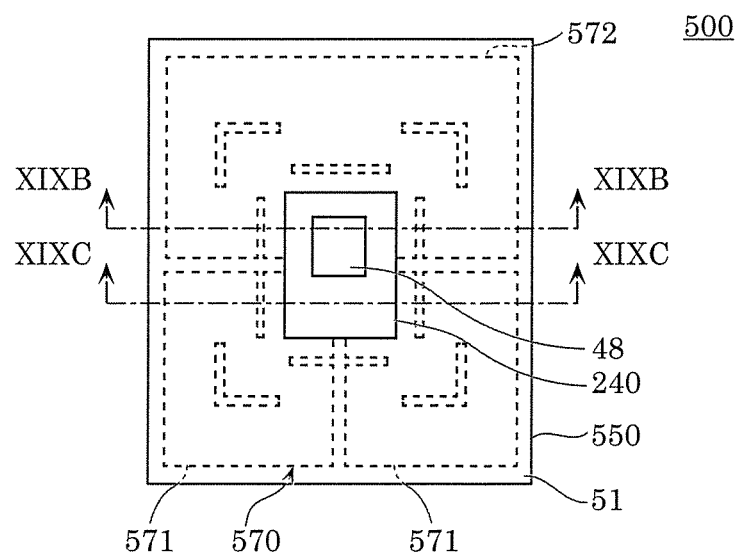
FIG. 19A is a top view illustrating the configuration of a light emitting device according to Embodiment 5.
Figure 19B:
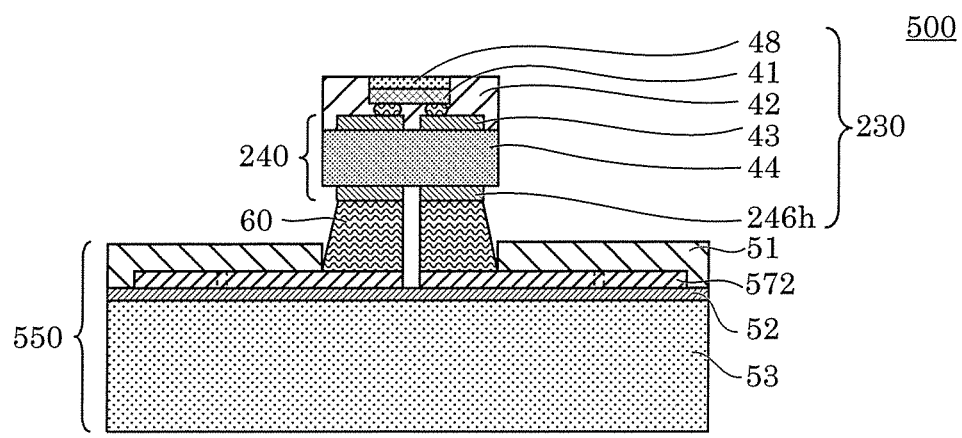
FIG. 19B is a sectional view illustrating the configuration of the light emitting device according to Embodiment 5.
Figure 19C:
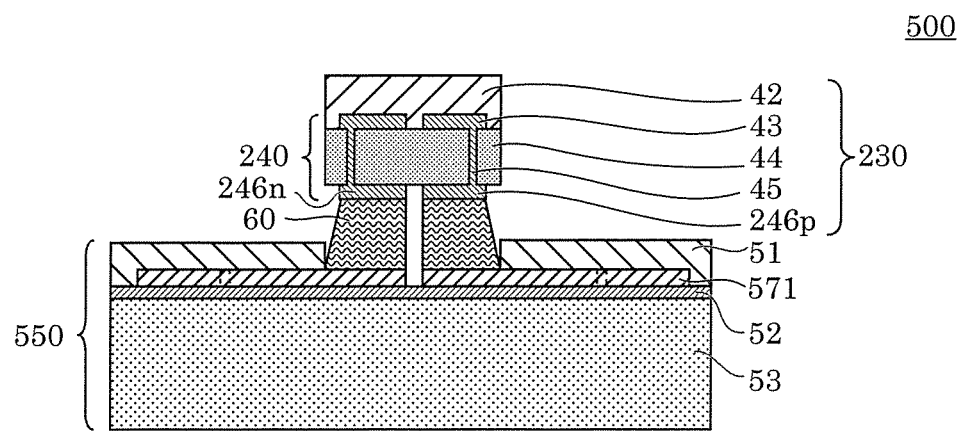
FIG. 19C is another sectional view illustrating the configuration of the light emitting device according to Embodiment 5.
Figure 20A:
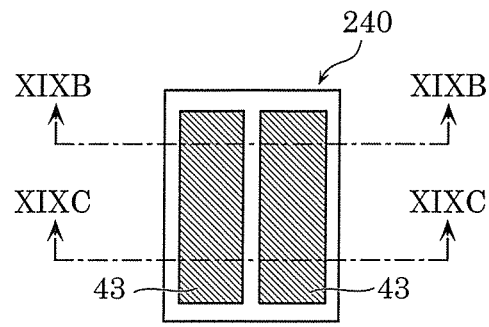
FIG. 20A is a top view illustrating the configuration of the front surface of a sub-mount in the light emitting device according to Embodiment 5.
Figure 20B:
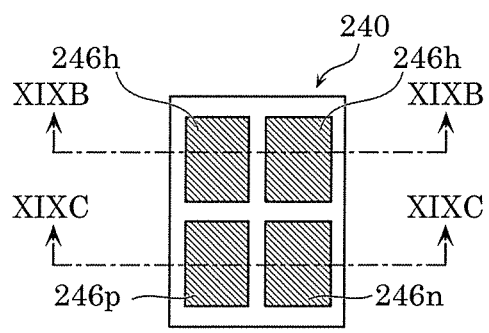
FIG. 20B is a bottom view illustrating the configuration of the back surface of the sub-mount in the light emitting device according to Embodiment 5.
Figure 21:
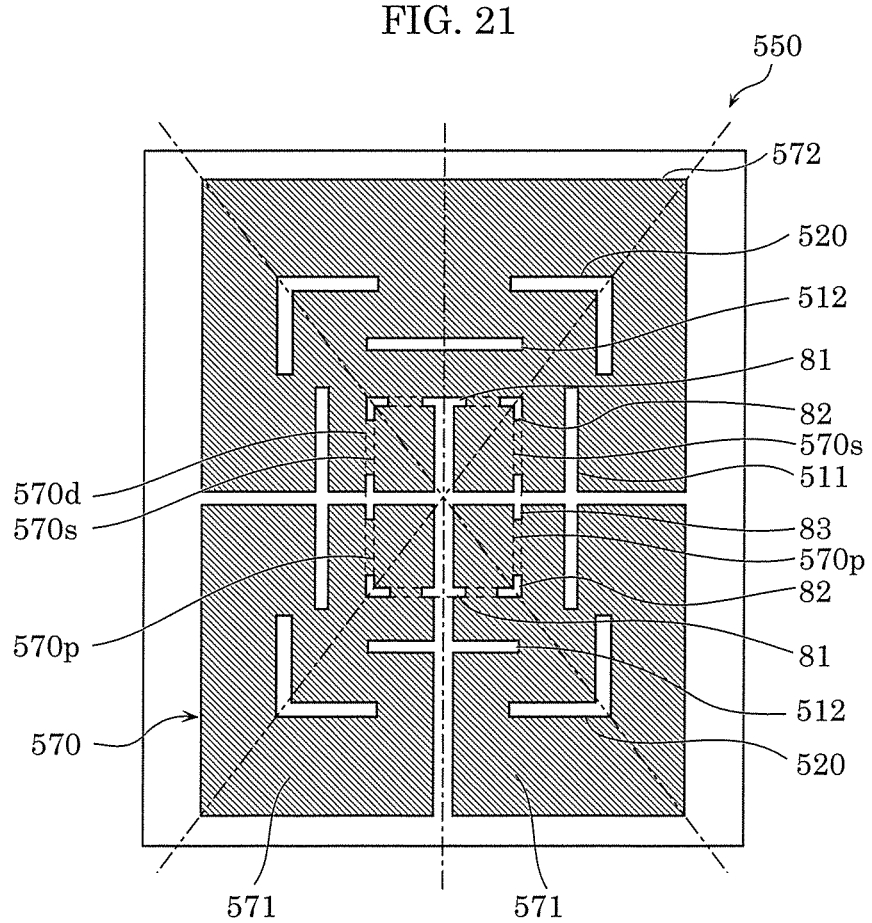
FIG. 21 is a top view of a main-mount of the light emitting device according to Embodiment 5.

FIG. 19A is a top view illustrating the configuration of light emitting device 500 according to this embodiment. It is to be noted that in FIG. 19A, the contour of surface metal pattern 570 including two wiring electrodes 571 and one front surface heat dissipation pattern 572 is illustrated by a dashed line for reference. FIG. 19B is a sectional view illustrating the configuration of light emitting device 500 according to this embodiment. In FIG. 19B, XIXB-XIXB section of FIG. 19A is illustrated. FIG. 19C is another sectional view illustrating the configuration of light emitting device 500 according to this embodiment. In FIG. 19C, XIXC-XIXC section of FIG. 19A is illustrated. FIG. 20A is a top view illustrating the configuration of the front surface of sub-mount 240 in light emitting device 500 according to this embodiment. FIG. 20B is a bottom view illustrating the configuration of the back surface of sub-mount 240 in light emitting device 500 according to this embodiment. FIG. 21 is a top view of main-mount 550 of light emitting device 500 according to this embodiment. In FIG. 21, in order to illustrate the configuration of front surface metal pattern 570, a top view of main-mount 550 with cover resin 51 removed is illustrated.

As illustrated in FIG. 20B, on the back surface of sub-mount 240, two back surface heat dissipation pads 246*h* are formed on the upper side of FIG. 20B, and two back surface electrodes 246*p* and 246*n* are formed on the lower side of FIG. 20B.

As illustrated in FIG. 19A and FIG. 19B, back surface heat dissipation pads 246*h* and front surface heat dissipation pattern 572 are not electrically connected to the electrodes of light emitting element 41.

Front surface metal pattern 570 illustrated in FIG. 21 is disposed above main-mount substrate 53 with insulation layer 52 interposed between front surface metal pattern 570 and main-mount substrate 53. Similarly to Embodiment 2, main-mount 550 includes cover resin 51. In cover resin 51, an opening is provided on the region of front surface metal pattern 570 connected to sub-mount 240, and electrode pad 570*p* and front surface heat dissipation pad 570*s* are exposed through the opening.

Electrode pad 570*p* is bonded to back surface electrodes 246*p* and 246*n* of sub-mount 240 via solder 60, and front surface heat dissipation pad 570*s* is bonded to back surface heat dissipation pad 246*h* of sub-mount 240 via solder 60. Also, front surface metal pattern 572 has disposition region 570*d* in which sub-mount 240 is disposed, in plan view. The configuration of sub-mount 240 according to this embodiment is the same as the configuration of sub-mount 240 according to Embodiment 2. Also, the configuration of package 230 according to this embodiment is also the same as the configuration of sub-mount 240 according to Embodiment 2.

[Main-Mount Preparation]

Main-mount 550 is formed similarly to Embodiment 2 except for the shape of front surface metal pattern 570, and main-mount 550 is bonded to sub-mount 240 via solder 60. As a result of conducting the thermal cycling test in the same manner as in Embodiment 2, occurrence of a crack in solder 60 is reduced in Embodiment 5, as compared with the light emitting device in related art.

As illustrated in FIG. 21, front surface metal pattern 570 has first slits 511 and 512, and second slits 520. Front surface metal pattern 570 according to this embodiment has the same configuration as in front surface metal pattern 17*d* illustrated in plan view (d) of FIG. 31.

Variations of Embodiment 5

Figure 22A:
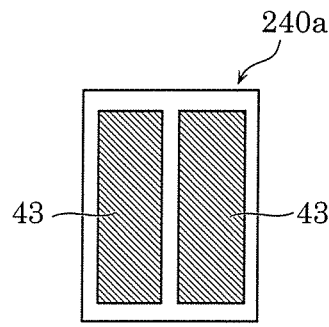
FIG. 22A is a top view of another example of sub-mount of the light emitting device according to Embodiment 5.
Figure 22B:
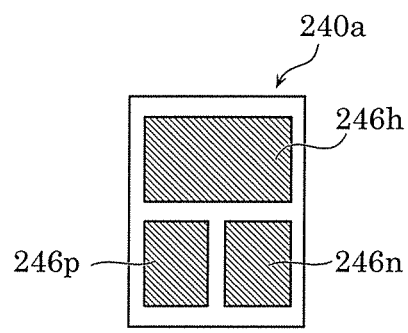
FIG. 22B is a bottom view of another example of the sub-mount of the light emitting device according to Embodiment 5.
Figure 23:
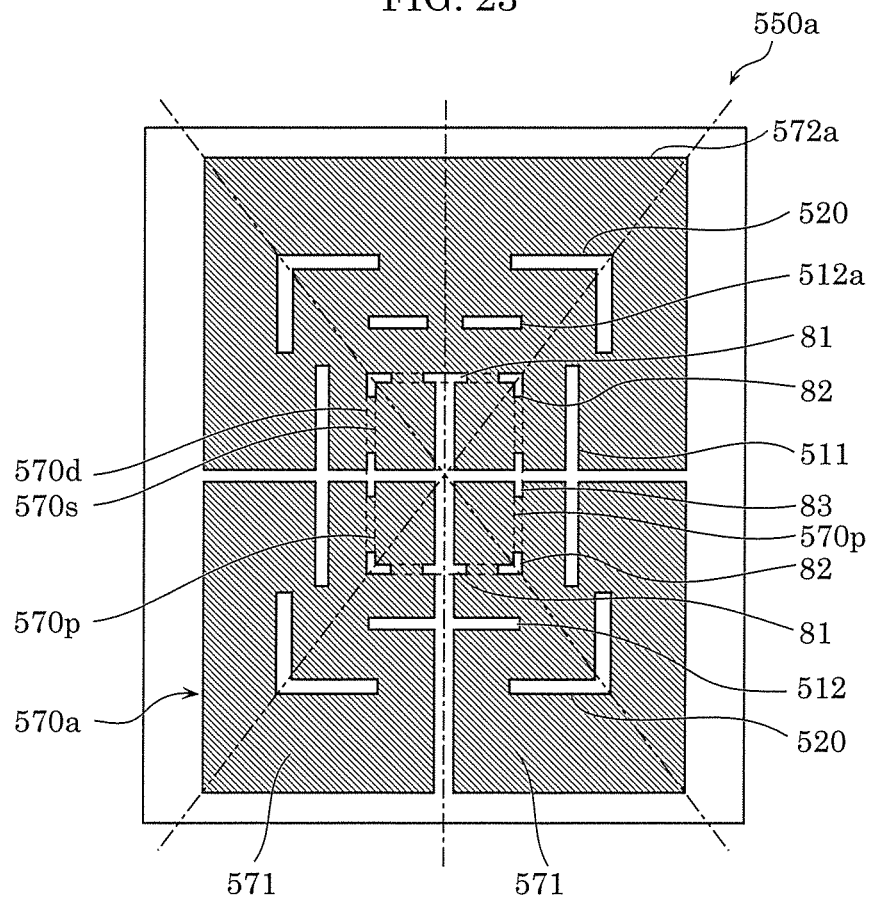
FIG. 23 is a top view of another example of the main-mount of the light emitting device according to Embodiment 5.

Also, the configuration of the sub-mount and the main-mount according to this embodiment is not limited to the configuration illustrated in FIG. 19A to FIG. 21. For instance, sub-mount 240a illustrated in FIG. 22A and FIG. 22B, and min-mount 550a as illustrated in FIG. 23 may be used. FIG. 22A and FIG. 22B are a top view and a bottom view of another example of the sub-mount of the light emitting device according to this embodiment. FIG. 23 is a top view of another example of the main-mount of the light emitting device according to this embodiment. In FIG. 23, in order to illustrate the configuration of front surface metal pattern 570a including two wiring electrodes 571 and one front surface heat dissipation pattern 572a, a top view of main-mount 550a with cover resin 51 removed is illustrated.

Sub-mount 240a illustrated in FIG. 22B includes one back surface heat dissipation pad 246h, opposed to two back surface electrodes 246p and 246n.

Front surface heat dissipation pattern 570a illustrated in FIG. 23 has two first slits 512a arranged in the longitudinal direction.

Also when the sub-mount illustrated in FIG. 22A and FIG. 22B, and front surface metal pattern 570a illustrated in FIG. 23 are used, the same effect of reducing crack in solder 60 was observed.

Embodiment 6

A light emitting device according to Embodiment 6 will be described. The light emitting device according to this embodiment differs from light emitting device 100 according to Embodiment 1 mainly in that multiple light emitting elements 41 are provided on the sub-mount. Hereinafter, the light emitting device according to this embodiment will be described focused on points of difference from light emitting device 100 with reference to the drawings.

Figure 24A:
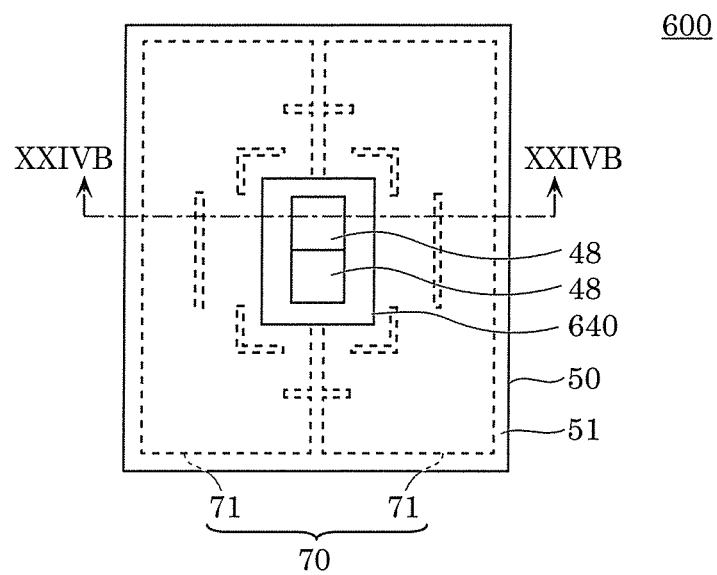
FIG. 24A is a top view illustrating the configuration of a light emitting device according to Embodiment 6.
Figure 24B:
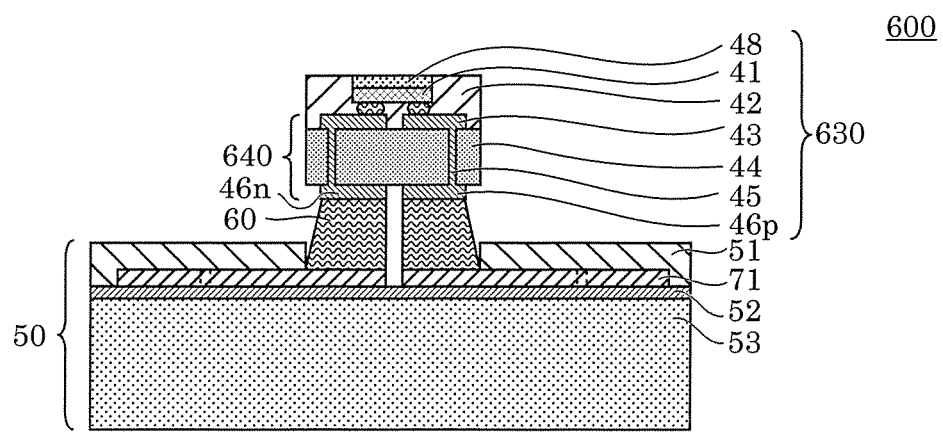
FIG. 24B is a sectional view illustrating the configuration of the light emitting device according to Embodiment 6.
Figure 25A:
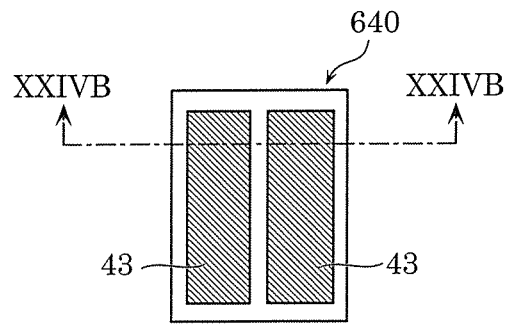
FIG. 25A is a top view illustrating the configuration of the front surface of a sub-mount in the light emitting device according to Embodiment 6.
Figure 25B:
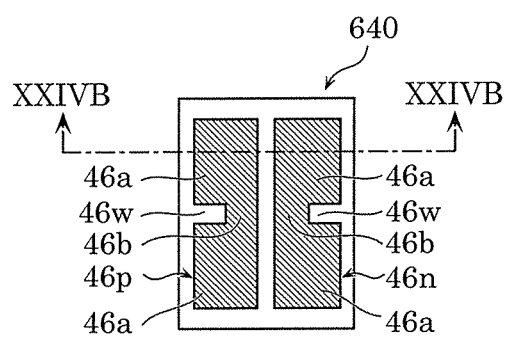
FIG. 25B is a bottom view illustrating the configuration of the back surface of the sub-mount in the light emitting device according to Embodiment 6.
Figure 26:
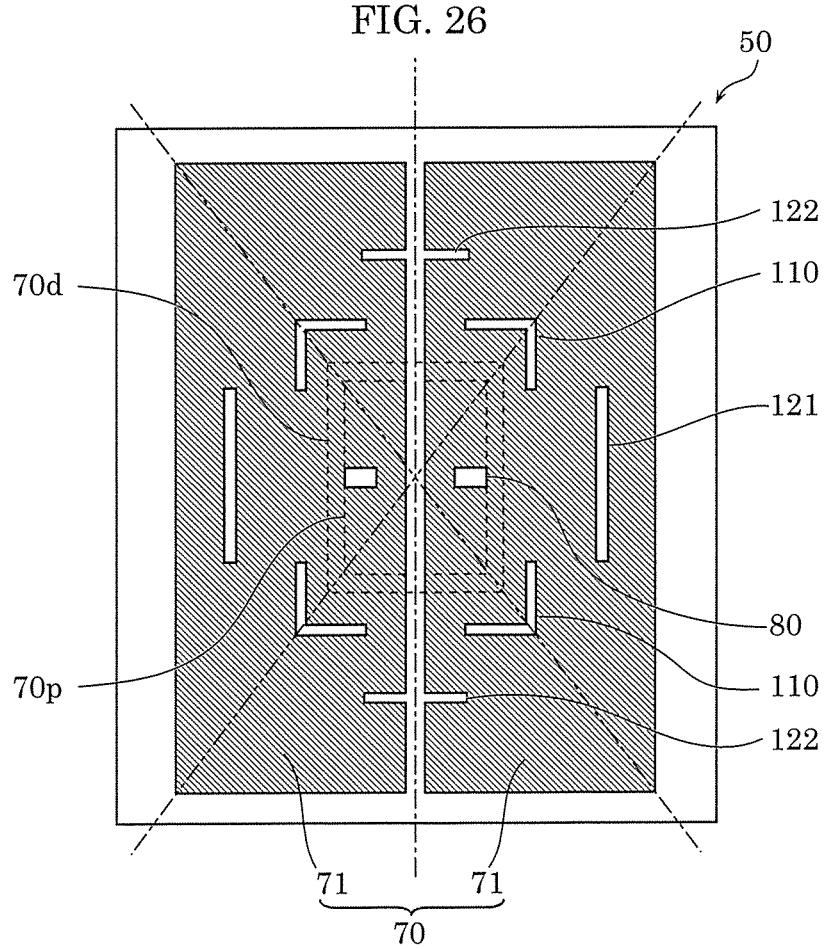
FIG. 26 is a top view of a main-mount of the light emitting device according to Embodiment 6.

FIG. 24A is a top view illustrating the configuration of light emitting device 600 according to this embodiment. It is to be noted that in FIG. 24A, the contour of surface metal pattern 570 formed by two wiring electrodes is illustrated by a dashed line for reference. FIG. 24B is a sectional view illustrating the configuration of light emitting device 600 according to this embodiment. In FIG. 24B, XXIVB-XX-IVB section of FIG. 24A is illustrated. FIG. 25A is a top view illustrating the configuration of the front surface of sub-mount 640 in light emitting device 600 according to this embodiment. FIG. 25B is a bottom view illustrating the configuration of the back surface of sub-mount 640 in light emitting device 600 according to this embodiment. FIG. 26 is a top view of main-mount 50 of light emitting device 60 according to this embodiment. In FIG. 26, in order to illustrate the configuration of front surface metal pattern 70, a top view of main-mount 50 with cover resin 51 removed is illustrated.

As illustrated in FIG. 24A, two fluorescent substance plates 48 are provided on sub-mount 640 according to this embodiment. As illustrated in FIG. 24B, light emitting element 41 is disposed on the side of two fluorescent substance plates 48, the side facing sub-mount substrate 44. In other words, package 630 according to this embodiment includes one sub-mount 640 and two light emitting elements 41 disposed on sub-mount 640. In light emitting device 600 according to this embodiment, sub-mount 40 including back surface electrodes 246p and 246n (in necked shape) having the same shape as in Embodiment 1 and Embodiment 4, and main-mount 50 including wiring electrode 71 which is the same as in Embodiment 1 are bonded via solder. Thus, in light emitting device 600, inclination of sub-mount 640 with respect to main-mount 50 is avoided, and the effect of reducing crack in solder 60 was observed.

Variations

Although the light emitting device and the solder bond structure according to the present disclosure have been described above based on the embodiments and the variations, the present disclosure is not limited to the above-described embodiments and variations.

Although description has been given by way of light emitting elements adopting face-down flip-chip mounting, the configuration of light emitting element is not limited to this. For instance, face-up connection may be used for connection of a light emitting element.

Figure 27A:
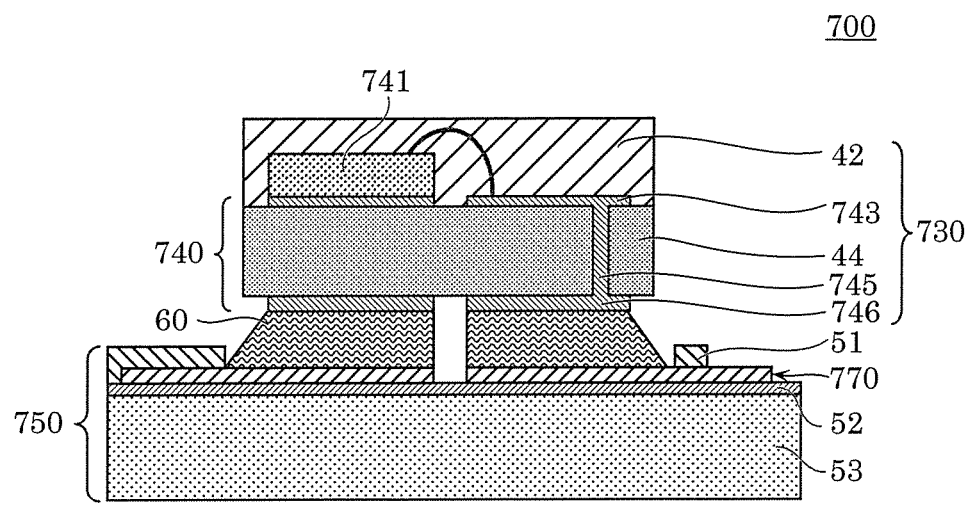
FIG. 27A is a sectional view illustrating the configuration of a light emitting device according to a variation.
Figure 27B:
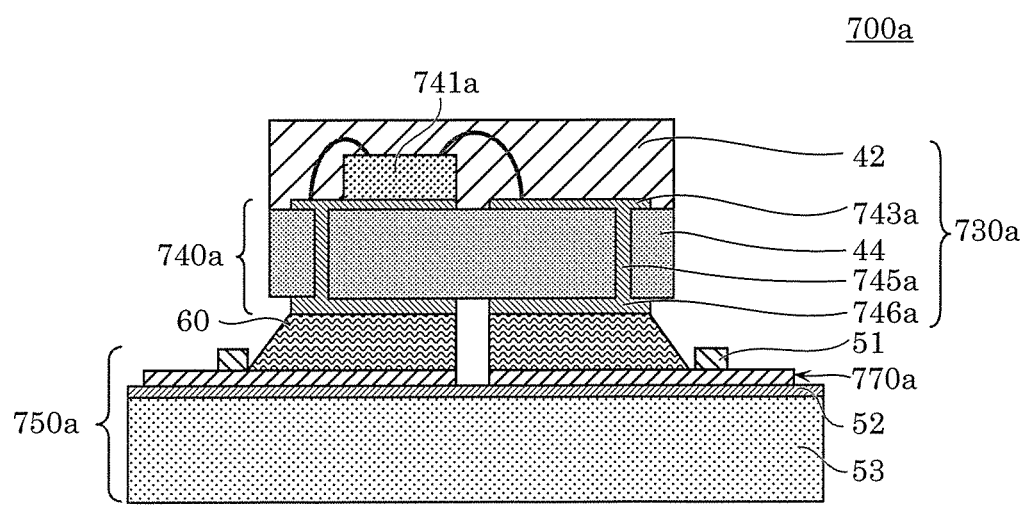
FIG. 27B is a sectional view illustrating the configuration of a light emitting device according to a variation.

FIG. 27A and FIG. 27B are sectional views illustrating the configuration of light emitting devices 700 and 700a according to a variation.

Light emitting device 700 illustrated in FIG. 27A includes package 730 having sub-mount 740 and light emitting element 741, and main-mount 750. As illustrated in FIG. 27A, one terminal of light emitting element 741 may be connected to front surface electrode 743 of sub-mount 740 by wire bonding. Also, main-mount 750 includes front surface metal pattern 770 which is the same as in the above-described embodiments. It is to be noted that sub-mount 740 includes front surface electrode 743 for connecting light emitting element 741 by wire bonding, and corresponding via wiring 745 and back surface electrode 746.

Light emitting device 700a illustrated in FIG. 27B includes package 730a having sub-mount 740a and light emitting element 741a, and main-mount 750a. As illustrated in FIG. 27B, two terminals of light emitting element 741a may be connected to front surface electrode 743a of sub-mount 740a by wire bonding. Also, main-mount 750a includes front surface metal pattern 770a which is the same as in the above-described embodiments. It is to be noted that sub-mount 740a includes front surface electrode 743a for connecting light emitting element 741a by wire bonding, and corresponding via wiring 745a and back surface electrode 746a.

Also in light emitting devices 700 and 700a illustrated in FIG. 27A and FIG. 27B, the same effect as in the light emitting device according to the above-described embodiments is obtained.

In addition, the present disclosure also includes an embodiment obtained by applying various modifications which will occur to those skilled in the art to the above-described embodiments and variations, and an embodiment achieved by any combination of the components and functions in the above-described embodiments and variations in a range not departing from the spirit of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a light emitting device that uses a high-output light emitting element, for instance.

What is claimed is:

1. A light emitting device comprising:
a light emitting element;
a sub-mount including a sub-mount substrate having a front surface on which the light emitting element is disposed, and a pair of back surface electrodes disposed in a back surface that is on a back side of the front surface of the sub-mount substrate; and
a main-mount in which the sub-mount extends over a pair of wiring electrodes via solder, the main-mount including a front surface metal pattern including the pair of wiring electrodes to be bonded to the pair of back surface electrodes via the solder,
wherein the pair of back surface electrodes and the pair of wiring electrodes are each bonded via the solder,
the front surface metal pattern has a first slit, in plan view, at a position away from a disposition region in which the sub-mount is disposed, and
in the plan view of the sub-mount, a region in which the light emitting element is disposed overlaps a region in which the solder and the front surface metal pattern are disposed.

2. The light emitting device according to claim 1, wherein the first slit has a region between a first side included in the disposition region and an extended line of the first side, and a second side included in an outer periphery of the front surface metal pattern, the second side being opposed to the first side, the region being disposed in parallel to the first side.

3. The light emitting device according to claim 1, wherein the first slit is disposed on a line connecting two opposed corners of the disposition region.

4. The light emitting device according to claim 1, wherein the first slit has a bent portion.

5. The light emitting device according to claim 1, wherein the front surface metal pattern has a plurality of slits each of which is the first slit, and
the plurality of slits are disposed at positions symmetrical about an axis which is a center line of the disposition region, in the front surface metal pattern.

6. The light emitting device according to claim 1, wherein the solder has a thickness of at least 20 μm and at most 150 μm.

7. The light emitting device according to claim 1, wherein the solder has a crack having a length that is at most 20% of a width of the solder in a cross-section.

8. The light emitting device according to claim 1, wherein the front surface metal pattern includes a front surface heat dissipation pad,
the sub-mount has a back surface heat dissipation pad adjacent to the back surface electrode, and
the front surface heat dissipation pad and the back surface heat dissipation pad are bonded via solder.

9. The light emitting device according to claim 8, wherein the front surface metal pattern includes two wiring electrodes each of which is the wiring electrode, and
the front surface heat dissipation pad is disposed between the two wiring electrodes.

10. The light emitting device according to claim 1, wherein the pair of back surface electrodes each have two main-mount bond portions and a first connection portion that is inserted between the two main-mount bond portions and mutually joins the two main-mount bond portions, and
the first connection portion is smaller in width than each of the two main-mount bond portions.

11. The light emitting device according to claim 10, wherein the two main-mount bond portions and the first connection portion are disposed such that one side of each of the two main-mount bond portions and the first connection portion is on a line.

12. The light emitting device according to claim 1, wherein the pair of wiring electrodes are covered by a resin, and the pair of wiring electrodes have an electrode pad that is exposed through an opening provided in the resin,
the electrode pad is formed by two sub-mount bond portions and a second connection portion that is inserted between the two sub-mount bond portions and mutually joins the two sub-mount bond portions, and
the second connection portion is smaller in width than each of the two sub-mount bond portions.

13. The light emitting device according to claim 12, wherein the two sub-mount bond portions and the second connection portion are disposed such that one side of each of the two sub-mount bond portions and the second connection portion is on a line.

14. The light emitting device according to claim 1, wherein the front surface metal pattern is connected to the first slit, and has a second slit in a region outward of the first slit.

15. The light emitting device according to claim 1, wherein the front surface metal pattern has a third slit in the disposition region.

16. The light emitting device according to claim 1, wherein the first slit has ends that are formed more inward than edges of the front surface metal pattern.

17. The light emitting device according to claim 1, wherein a distance between the disposition region and the first slit is at least 0.5 mm and at most 0.5 mm.

* * * * *